US010527651B2

(12) United States Patent
Wood et al.

(10) Patent No.: US 10,527,651 B2
(45) Date of Patent: Jan. 7, 2020

(54) CURRENT MEASUREMENT

(71) Applicant: Analog Devices Global, Hamilton (BM)

(72) Inventors: Stephen James Martin Wood, Leven (GB); Jonathan Ephraim David Hurwitz, Edinburgh (GB); Seyed Amir Ali Danesh, Edinburgh (GB)

(73) Assignee: Analog Devices Global, Hamilton (BM)

( * ) Notice: Subject to any disclaimer, the term of this patent is extended or adjusted under 35 U.S.C. 154(b) by 139 days.

(21) Appl. No.: 15/910,805

(22) Filed: Mar. 2, 2018

(65) Prior Publication Data

US 2018/0252748 A1 Sep. 6, 2018

Related U.S. Application Data

(63) Continuation of application No. 15/099,308, filed on Apr. 14, 2016, now Pat. No. 9,939,464, which is a
(Continued)

(30) Foreign Application Priority Data

Sep. 12, 2011 (GB) .................................... 11156486
May 4, 2012 (GB) ................................... 1207905.9

(51) Int. Cl.
*G01R 15/14* (2006.01)
*G01R 15/04* (2006.01)
(Continued)

(52) U.S. Cl.
CPC ........... *G01R 15/146* (2013.01); *G01R 1/203* (2013.01); *G01R 11/25* (2013.01); *G01R 15/04* (2013.01);
(Continued)

(58) Field of Classification Search
CPC ........ G01R 27/00; G01R 27/02; G01R 27/04; G01R 27/14; G01R 27/16; G01R 27/26;
(Continued)

(56) References Cited

U.S. PATENT DOCUMENTS

| 4,210,875 A | 7/1980 | Beasom |
| 4,293,782 A | 10/1981 | Tanaka et al. |

(Continued)

FOREIGN PATENT DOCUMENTS

| CN | 101231310 A | 7/2008 |
| CN | 102713647 A | 10/2012 |

(Continued)

OTHER PUBLICATIONS

"U.S. Appl. No. 13/672,236, Non Final Office Action dated Dec. 4, 2014", 11 pgs.
(Continued)

*Primary Examiner* — Hoai-An D. Nguyen
(74) *Attorney, Agent, or Firm* — Schwegman Lundberg & Woessner, P.A.

(57) ABSTRACT

The present invention relates to current measurement apparatus 100. The current measurement apparatus 100 comprises a measurement arrangement 110, 114 which is configured to be disposed in relation to a load 108 which draws a current signal, the measurement arrangement being operative when so disposed to measure the load drawn current signal. The current measurement apparatus 100 also comprises a signal source 112 which is operative to apply a reference input signal to the measurement arrangement 110, 114 whereby an output signal from the measurement arrangement comprises a load output signal corresponding to the load drawn current signal and a reference output signal corresponding to the reference input signal. The current measurement apparatus 100 further comprises processing
(Continued)

apparatus 116 which is operative to receive the output signal and to make a determination in dependence on the reference output signal and the load output signal, the determination being in respect of at least one of the load drawn current signal and electrical power consumed by the load.

25 Claims, 19 Drawing Sheets

Related U.S. Application Data continuation of application No. 14/203,502, filed on Mar. 10, 2014, now Pat. No. 9,322,850, which is a continuation-in-part of application No. 13/672,236, filed on Nov. 8, 2012, now Pat. No. 9,151,818, and a continuation-in-part of application No. PCT/GB2012/052251, filed on Sep. 12, 2012, and a continuation-in-part of application No. 14/344,052, filed as application No. PCT/GB2012/052251 on Sep. 12, 2012, now abandoned.

(60) Provisional application No. 61/557,369, filed on Nov. 8, 2011.

(51) Int. Cl.
| | |
|---|---|
| *G01R 21/133* | (2006.01) |
| *G01R 21/14* | (2006.01) |
| *G01R 23/02* | (2006.01) |
| *G01R 27/02* | (2006.01) |
| *G01R 19/00* | (2006.01) |
| *G01R 35/04* | (2006.01) |
| *G01R 11/25* | (2006.01) |
| *G01R 1/20* | (2006.01) |
| G01R 21/00 | (2006.01) |
| G01R 19/02 | (2006.01) |
| G01R 27/16 | (2006.01) |
| G01R 27/26 | (2006.01) |
| G01R 27/28 | (2006.01) |

(52) U.S. Cl.
CPC ......... *G01R 15/14* (2013.01); *G01R 19/0084* (2013.01); *G01R 19/0092* (2013.01); *G01R 21/133* (2013.01); *G01R 21/14* (2013.01); *G01R 23/02* (2013.01); *G01R 27/02* (2013.01); *G01R 35/04* (2013.01); *G01R 19/02* (2013.01); *G01R 21/00* (2013.01); *G01R 27/16* (2013.01); *G01R 27/26* (2013.01); *G01R 27/28* (2013.01)

(58) Field of Classification Search
CPC ...... G01R 27/28; G01R 23/02; G01R 22/066; G01R 22/068; G01R 21/00; G01R 21/133; G01R 21/14; G01R 19/00; G01R 19/02; G01R 19/0084; G01R 19/0092; G01R 15/00; G01R 15/04; G01R 15/14; G01R 15/146; G01R 11/00; G01R 11/02; G01R 11/24; G01R 11/25; G01R 1/00; G01R 1/20; G01R 1/203; G01R 35/00; G01R 35/04
USPC ....... 324/600, 612, 615, 649, 691, 713, 522, 324/76.11, 98, 126; 702/1, 57, 64, 108, 702/109
See application file for complete search history.

(56) References Cited

U.S. PATENT DOCUMENTS

| 4,434,400 | A | * | 2/1984 | Halder | ................. G01R 21/127 |
|---|---|---|---|---|---|
| | | | | | 324/110 |
| 5,115,200 | A | | 5/1992 | Lahitte, V et al. | |
| 5,224,011 | A | | 6/1993 | Yalla | |
| 5,386,188 | A | | 1/1995 | Minneman et al. | |
| 5,485,394 | A | | 1/1996 | Murata et al. | |
| 5,512,837 | A | | 4/1996 | Ohnishi | |
| 5,539,602 | A | | 7/1996 | Schmitz et al. | |
| 5,804,979 | A | | 9/1998 | Lund et al. | |
| 5,998,979 | A | | 12/1999 | Nilsson | |
| 6,011,385 | A | | 1/2000 | Brandt et al. | |
| 6,175,479 | B1 | | 1/2001 | Boyd et al. | |
| 6,445,315 | B1 | | 9/2002 | Den Breejen | |
| 6,522,123 | B2 | | 2/2003 | Ribes | |
| 6,654,219 | B1 | | 11/2003 | Romano et al. | |
| 7,042,690 | B2 | | 5/2006 | Male | |
| 7,109,720 | B2 | | 9/2006 | Baurand et al. | |
| 7,265,607 | B1 | | 9/2007 | Rajapandian et al. | |
| 7,298,135 | B2 | | 11/2007 | Briese et al. | |
| 7,764,473 | B2 | | 7/2010 | Shaak et al. | |
| 8,450,995 | B2 | | 5/2013 | Wagner | |
| 8,508,896 | B2 | | 8/2013 | Paoletti et al. | |
| 8,586,256 | B2 | | 11/2013 | Yanase et al. | |
| 9,151,818 | B2 | | 10/2015 | Danesh et al. | |
| 9,322,850 | B2 | | 4/2016 | Wood et al. | |
| 9,411,003 | B2 | | 8/2016 | Danesh et al. | |
| 9,886,970 | B1 | * | 2/2018 | Lammers | ............. G11B 5/4853 |
| 9,933,463 | B2 | | 4/2018 | Danesh et al. | |
| 9,939,464 | B2 | | 4/2018 | Wood et al. | |
| 2002/0153901 | A1 | | 10/2002 | Davis et al. | |
| 2003/0117754 | A1 | | 6/2003 | Zuercher et al. | |
| 2004/0061506 | A1 | | 4/2004 | Rupp | |
| 2005/0237047 | A1 | | 10/2005 | Voisine | |
| 2006/0167642 | A1 | | 7/2006 | Ferrer et al. | |
| 2006/0274460 | A1 | | 12/2006 | Zuercher et al. | |
| 2007/0058304 | A1 | | 3/2007 | Parker et al. | |
| 2008/0062591 | A1 | | 3/2008 | Wong et al. | |
| 2009/0121729 | A1 | | 5/2009 | Farkas | |
| 2009/0161270 | A1 | | 6/2009 | Beatty, Jr. et al. | |
| 2009/0267582 | A1 | | 10/2009 | Prodic et al. | |
| 2010/0225304 | A1 | | 9/2010 | Wynne | |
| 2011/0037429 | A1 | | 2/2011 | Deboer et al. | |
| 2011/0273183 | A1 | | 11/2011 | Shea | |
| 2012/0229939 | A1 | | 9/2012 | Mikani et al. | |
| 2013/0113507 | A1 | | 5/2013 | Danesh et al. | |
| 2013/0128396 | A1 | | 5/2013 | Danesh et al. | |
| 2014/0176119 | A1 | | 6/2014 | Hull et al. | |
| 2014/0253102 | A1 | | 9/2014 | Wood et al. | |
| 2014/0354266 | A1 | | 12/2014 | Hurwitz et al. | |
| 2015/0362532 | A1 | | 12/2015 | Chartouni | |
| 2016/0291060 | A1 | | 10/2016 | Wood et al. | |
| 2016/0341769 | A1 | | 11/2016 | Danesh et al. | |
| 2017/0363664 | A1 | * | 12/2017 | Hurwitz | ................. G01R 19/25 |
| 2018/0252750 | A1 | | 9/2018 | Danesh et al. | |
| 2019/0079117 | A1 | * | 3/2019 | Hurwitz | ................. G01R 1/203 |

FOREIGN PATENT DOCUMENTS

| DE | 10310503 A1 | 9/2004 |
|---|---|---|
| DE | 102010052346 A1 | 5/2012 |
| EP | 1278073 A1 | 1/2003 |
| GB | 2006443 A | 5/1979 |
| GB | 2224853 A | 5/1990 |
| GB | 2424286 B | 7/2009 |
| WO | WO-9967653 A1 | 12/1999 |
| WO | WO-2006002446 A1 | 1/2006 |
| WO | WO-2014072733 A2 | 5/2014 |

OTHER PUBLICATIONS

"U.S. Appl. No. 13/672,236, Notice of Allowance dated May 13, 2015", 10 pgs.

"U.S. Appl. No. 13/672,236, Response filed Apr. 2, 2015 to Non Final Office Action dated Dec. 4, 2014", 21 pgs.

(56) References Cited

OTHER PUBLICATIONS

"U.S. Appl. No. 13/684,213, Corrected Notice of Allowance dated Jul. 8, 2016", 2 pgs.
"U.S. Appl. No. 13/684,213, Final Office Action dated Jan. 4, 2016", 9 pgs.
"U.S. Appl. No. 13/684,213, Non Final Office Action dated Jul. 30, 2015", 15 pgs.
"U.S. Appl. No. 13/684,213, Notice of Allowance dated Mar. 24, 2016", 10 pgs.
"U.S. Appl. No. 13/684,213, Response filed Mar. 4, 2016 to Final Office Action dated Jan. 4, 2016", 16 pgs.
"U.S. Appl. No. 13/684,213, Response filed Nov. 30, 2015 to Non Final Office Action dated Jul. 30, 2015", 18 pgs.
"U.S. Appl. No. 14/203,502, Notice of Allowance dated Oct. 5, 2015", 9 pgs.
"U.S. Appl. No. 14/203,502, Notice of Allowance dated Dec. 23, 2015", 8 pgs.
"U.S. Appl. No. 14/203,502, Preliminary Amendment filed Aug. 14, 2014", 9 pgs.
"U.S. Appl. No. 15/099,308, Notice of Allowance dated Nov. 28, 2017", 17 pgs.
"U.S. Appl. No. 15/229,815, Final Office Action dated May 17, 2017", 13 pgs.
"U.S. Appl. No. 15/229,815, Non Final Office Action dated Nov. 3, 2016", 5 pgs.
"U.S. Appl. No. 15/229,815, Notice of Allowance dated Nov. 22, 2017", 12 pgs.
"U.S. Appl. No. 15/229,815, Preliminary Amendment filed Aug. 5, 2018", 3 pgs.
"U.S. Appl. No. 15/229,815, Response filed Jan. 31, 2017 to Non Final Office Action dated Nov. 3, 2016", 11 pgs.
"U.S. Appl. No. 15/229,815, Response filed Sep. 15, 2017 to Final Office Action dated May 17, 2017", 16 pgs.
"Chinese Application Serial No. 201380058364.9, Office Action dated Jan. 17, 2018", 5 pgs.
"Chinese Application Serial No. 201380058364.9, Office Action dated Jun. 29, 2017", 7 pgs.
"Chinese Application Serial No. 201380058364.9, Office Action dated Oct. 17, 2016", (with English Translation), 17 pgs.
"Chinese Application Serial No. 201380058364.9, Response filed Mar. 1, 2017 to Office Action dated Oct. 17, 2016", (w/ English Translation of Amended Claims), 48 pgs.
"International Application Serial No. PCT/GB2013/052947, International Search Report dated Mar. 13, 2014", 3 pgs.
"International Application Serial No. PCT/GB2013/052947, Written Opinion dated Mar. 13, 2014", 5 pgs.
Ziegler, Silvio, et al., "Current Sensing Techniques: A Review", IEEE Sensors Journal, vol. 9, No. 4, (Apr. 2009), 354-376.
"U.S. Appl. No. 15/910,896, Preliminary Amendment dated May 25, 2018", 7 pgs.
U.S. Appl. No. 14/344,052, filed Sep. 12, 2012, Current Measurement.
U.S. Appl. No. 13/672,236 U.S. Pat. No. 9,151,818, filed Nov. 8, 2012, Voltage Measurement.
U.S. Appl. No. 14/203,502 U.S. Pat. No. 9,322,850, filed Mar. 10, 2014, Current Measurement.
U.S. Appl. No. 15/099,308, filed Apr. 14, 2016, Current Measurement.
U.S. Appl. No. 13/684,213 U.S. Pat. No. 9,411,003, filed Nov. 22, 2012, Current Measurement.
U.S. Appl. No. 15/229,815, filed Aug. 5, 2016, Current Measurement.

\* cited by examiner

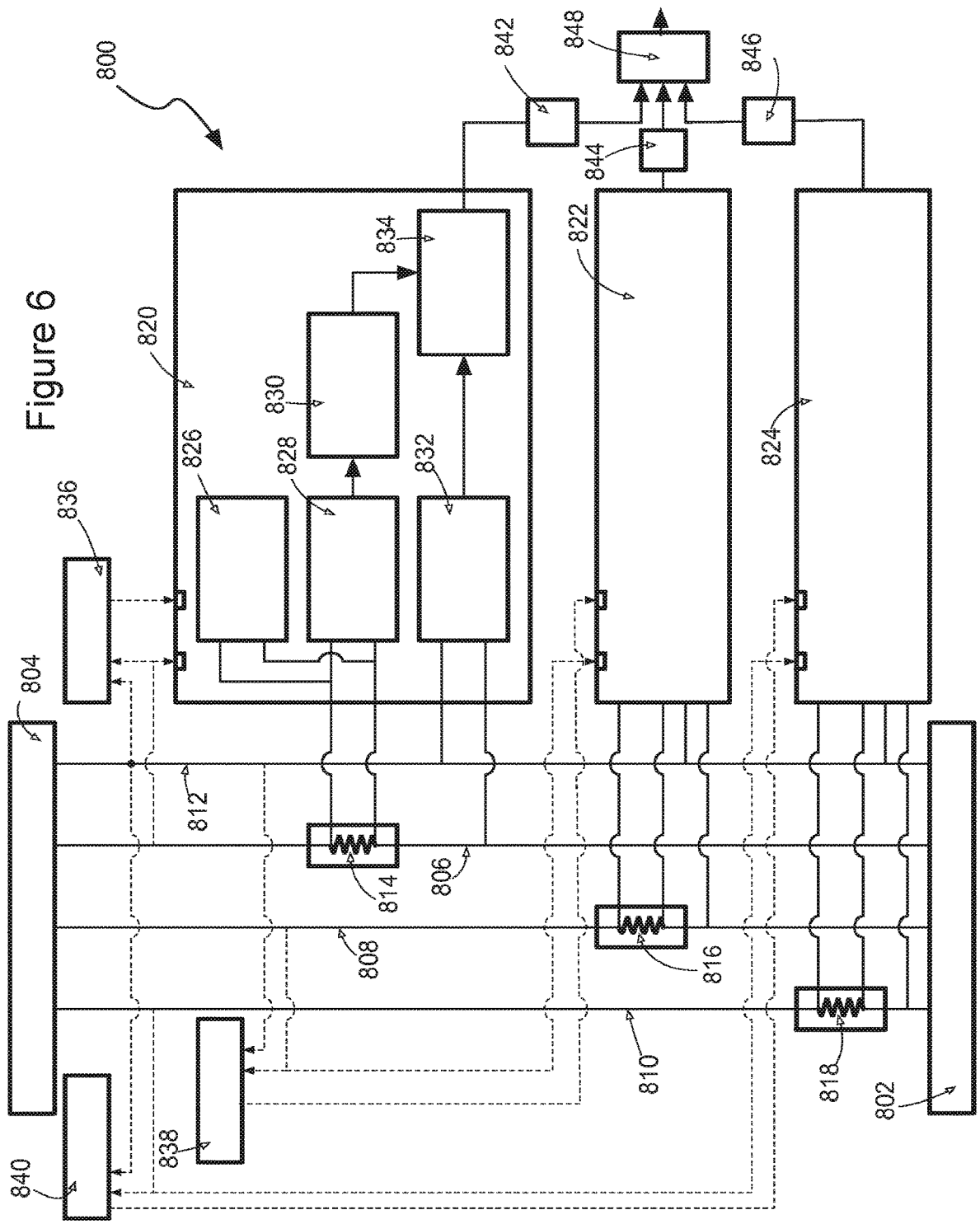

CURRENT MEASUREMENT

This application is a Continuation of U.S. application Ser. No. 15/099,308, filed on Apr. 14, 2016, which is a Continuation of U.S. application Ser. No. 14/203,502, filed on Mar. 10, 2014, which is a Continuation-In-Part of U.S. application Ser. No. 13/672,236, filed on Nov. 8, 2012, which claims the priority of U.S. Provisional Application No. 61/557,369, filed on Nov. 8, 2011. This application is a Continuation-In-Part of International Application No. PCT/GB2012/052251, filed on Sep. 12, 2012, which claims the priority of Great Britain Application No. 1115648.6, filed on Sep. 12, 2011, U.S. Provisional Application No. 61/557,369, filed on Nov. 8, 2011, and Great Britain Application No. 1207905.9, filed on May 4, 2012. This application is a Continuation-In-Part of U.S. application Ser. No. 14/344,052, which is a 371 national phase entry of International Application No. PCT/GB2012/052251, filed on Sep. 12, 2012, which claims the priority of Great Britain Application No. 1115648.6, filed on Sep. 12, 2011, U.S. Provisional Application No. 61/557,369, filed on Nov. 8, 2011, and Great Britain Application No. 1207905.9, filed on May 4, 2012. These documents are fully incorporated by reference as if fully set forth herein. All publications referenced herein are fully incorporated by reference, as if fully set forth herein.

FIELD OF THE INVENTION

The present invention relates to current measurement apparatus and methods of measuring current, in particular but not exclusively for measuring high levels of current present in electricity consumption circuits, electricity generation circuits and the like. The present invention further relates to apparatus, such as electricity generation, transmission, distribution or consumption apparatus, which comprises such current measurement apparatus or is operative to measure current according to such methods. In particular but not exclusively line voltage is measured in conjunction with current to provide for determination of at least one of electrical power and power quality.

BACKGROUND ART

A current shunt provides for indirect measurement of current values by the measurement of the voltage developed across the shunt by the current passing through the shunt. Typical applications for current shunts include electricity usage control, over-current protection and metering of electricity consumption and generation. In use a shunt of known resistance is provided in series with a load and the voltage developed across the shunt by the load drawn current is measured. The current passing through the shunt is then determined on the basis of Ohm's Law in view of the measured voltage and the known resistance of the shunt.

Certain applications, such as metering of electricity consumption and generation, require measurement to high accuracy over extended periods of time. For example in North America the ANSI 012.20 standard specifies an accuracy of ±0.5% for Class 0.5 consumption meters and ±0.2% for Class 0.2 consumption meters. Standards applicable in Europe and elsewhere, such as IEC 62053, specify similar accuracy requirements. It can therefore be appreciated that the resistance of the shunt must be known to high precision to enable a meter to meet regulated accuracy requirements. Although the shunt resistance is normally low to minimise power dissipation and undesirable circuit effects, the shunt is nevertheless liable to heating with temperature drift giving rise to a change in resistance which may cause a loss of measurement accuracy in a shunt of ordinary temperature coefficient of resistance. Shunt resistors formed from manganin alloy are therefore widely used in view of their very low temperature coefficient of resistance. It may also be apparent that accurate current measurement depends on measurement of the voltage developed across the shunt being accurate and stable with temperature and lifetime. This is because a change in the transfer gain or lack of precision in references used in the voltage measurement circuit will cause an error. It is normal for these reasons to perform a one-off factory calibration when the shunt and the readout electronics are combined so that a factor related to the actual combined transfer function for current to measurement value, which is determined largely by the shunt resistor and voltage measurement, can be stored and used in subsequent measurements to achieve the desired precision.

An alternative known approach to measuring high values of current involves the use of a current transformer wound on a core, which is disposed around a conductor carrying current to be measured. The current transformer has the advantages over the shunt resistor of being less invasive and providing for isolation from the current carrying conductor. However the current transformer is capable of measuring AC current only. The current transformer generates a current in the secondary coil, which is a ratio of the current in the primary conductor, and the secondary coil current is then turned into a voltage by a load, known as a burden resistor. Accurate measurement of the voltage across the burden resistor combined with accurate knowledge of the transfer function of the primary current to voltage across the burden resistor (i.e. combining the effect of number of turns, the magnetic and the burden resistor) are needed to accurately and precisely measure the current. As with the current shunt, one-off factory calibration is often performed to compensate for inaccuracies in some or all of the elements that contribute to the overall transfer function of primary current to measurement value.

In contrast another approach uses a Hall current probe which is capable of measuring both AC and DC. In an open loop configuration the Hall current probe is, however, liable to non-linearity and temperature drift. In a closed loop configuration the Hall current probe provides an improvement with regards to non-linearity and temperature drift although the weight and size of the configuration increases significantly where higher currents are measured. It is further known to use the Rogowski coil current probe to measure high levels of current. Most known approaches to current measurement, such as by way of the shunt resistor, the is current transformer, the Rogowski coil and the Hall current probe, are described and discussed in *Current Sensing Techniques: A Review*, Silvio Ziegler Robert C. Woodward and Herbert Ho-Ching Iu, IEEE Sensors Journal, Vol. 9, No. 4, April 2009. The different known approaches have their respective advantages and disadvantages.

Load current measurement is often made in conjunction with line voltage measurement, which involves measuring the voltage between the conductors over which the current is delivered, in order to determine the electrical power. As the line voltage is often many times larger than the largest signal that can be safely or conveniently measured, the most common means of measuring the line voltage is through a resistive potential divider between the conductors, which lowers the voltage to be measured by the factor of the divider ratio. The divider ratio and the accuracy of the subsequent voltage measurement chain needs to be known and be sufficiently stable to meet the accuracy requirements of the power measurement application; accuracy requirements for power measurement are specified in the aforementioned standards. Accurate line voltage measurement normally depends on the use of components with good temperature coefficients and known values and on factory calibration, amongst other techniques.

High accuracy power calculation also requires accurate and stable relative phase and frequency response of the load current and the line voltage measurements in order to accurately determine such metrics and differences between active and reactive power, power factor and harmonic content amongst others.

The present inventor has become appreciative of the various shortcomings of known approaches to current measurement and power measurement, such as the approaches described in outline in the preceding paragraphs. R is therefore an object for the present invention to provide improved current measurement apparatus which is configured to provide for accurate measurement of current, for example in a circuit carrying mains current. It is another object for the present invention to provide an improved method of measuring current which provides for accurate measurement of current, for example in a circuit carrying mains current. It is a further object for the present invention to provide improved voltage measurement apparatus which is configured to provide for accurate measurement of line voltage, such as in a circuit carrying mains current, whereby accurate power measurement may be achieved. It is a yet further object for the present invention to provide an improved method of measuring voltage which provides for accurate measurement of line voltage, such as in a circuit carrying mains current, whereby accurate power measurement may be achieved.

STATEMENT OF INVENTION

The present invention has been devised in the light of the inventors' appreciation of the shortcomings of known approaches to current measurement. Therefore and according to a first aspect of the present invention there is provided current measurement apparatus comprising:

a measurement arrangement configured to be disposed in relation to a load which draws a current signal, the measurement arrangement being operative when so disposed to measure the load drawn current signal;

a signal source operative to apply a reference input signal to the measurement arrangement whereby an output signal from the measurement arrangement comprises a load output signal corresponding to the load drawn current signal and a reference output signal corresponding to the reference input signal; and processing apparatus which is operative to receive the output signal and to make a determination in dependence on the reference output signal and the load output signal, the determination being in respect of at least one of the load drawn current signal and electrical power consumed by the load.

In use the measurement arrangement is disposed in relation to the load, such as by disposing the measurement arrangement in relation to an electrical conductor through which the current signal is drawn by the load. The measurement arrangement may be disposed close to or in series with the electrical conductor. The load, for example, may be an electrical appliance in a domestic setting with the electrical appliance being operative to draw the current signal though an electrical conductor, such as a conductor forming part of a primary circuit in an electricity consumption meter. The current measurement apparatus may therefore comprise an electrical conductor through which the current signal is drawn by the load and may also comprise the load.

Accurate measurement of load drawn current, e.g. for the purpose of measurement of power consumption, may be achieved in dependence on the load output signal alone when the transfer function of the measurement arrangement is accurately known and stable over time. However the transfer function of the measurement arrangement is liable to be unknown at point of assembly due to manufacturing tolerances. Also the transfer function is liable to change over time and thereby give rise to inaccuracy in determination of the load drawn current signal. The present invention may obviate the need to determine the transfer function at point of assembly, e.g. by way of a calibration approach, or may obviate the need to configure the measurement arrangement to minimise drift in the transfer function. The present invention does so by applying a reference input signal by way of the signal source to the measurement arrangement as the current signal is drawn by the load through the measurement arrangement. The signal source may be configured to apply the reference input signal in the form of charge, voltage or current itself. The measurement arrangement is operative to provide an output signal comprising a load output signal corresponding to the load drawn current signal and a reference output signal corresponding to the reference input signal. The processing apparatus is operative to receive the output signal and to make a determination in respect of at least one of the load drawn current signal and electrical power consumed by the load. The determination is made in dependence on the reference output signal and the load output signal. According to one example the processing apparatus may determine the load drawn current in dependence on the load output signal, the reference output signal and the reference input signal. According to this example the processing apparatus may be operative to determine at least a part of the transfer function for the measurement arrangement in dependence on the reference output signal and the reference input signal and then to determine the load drawn current in dependence on the load output signal and the transfer function. The processing apparatus is therefore operative to make a determination in dependence on the reference input signal as well as the reference output signal and the load output signal. By way of further example the processing apparatus may determine a change in the load drawn current from an earlier determined load drawn current in dependence on a change in the load output signal from an earlier determined load output signal and on a change in the reference output signal from an earlier determined reference output signal. By way of another example a change in electrical power consumption from an earlier determined electrical power consumption may be determined in dependence on a change in the load output signal, on a change in the reference output signal and on a measured line voltage or a measured change in line voltage. Alternatively the power consumption itself may be determined in dependence on the load output signal, the reference output signal, the reference input signal and the measured line voltage.

Making a determination in respect of the load drawn current signal in dependence on the reference output signal and the load output signal may address whatever change in the transfer function of the measurement arrangement there may be by relying on the reference signal being known or being determinable to a required accuracy and on accuracy of determination of the reference output signal. Accuracy of determination in respect of the load drawn current signal may therefore not be compromised by a change in the transfer function of a measurement arrangement comprising, for example, a current sensor and circuitry operative to acquire signals from the current sensor. The processing apparatus may be operative to determine a relationship between the reference input signal and the reference output signal. In addition the processing apparatus may be operative to adjust determination of the load drawn current on the basis of the load output signal in dependence on the relationship between the reference input signal and the reference output signal to thereby correct for inaccuracy, e.g. in the current sensor and its acquisition circuitry. Determining the relationship between the reference input signal and the reference output signal may comprise determining at least one characteristic of the transfer function of the measurement arrangement, such as resistance in a simple example where the measurement arrangement comprises a current sensor in the form of a shunt resistor with no appreciable frequency dependency. The processing apparatus may be operative to determine a change in at least one characteristic of the transfer function over time. In addition the processing apparatus may be operative to adjust determination of the load drawn current on the basis of the load output signal in dependence on the change in the at least one characteristic. For example the processing apparatus may be operative to acquire first and second reference output signals at different times and to adjust the determination of the load drawn current on the basis of the load output signal in dependence on a difference between the first and second reference output signals. The processing apparatus may be operative to adjust the determination of the load drawn current on the basis of a transfer function, such as a more recently determined transfer function. Alternatively or in addition the processing apparatus may be operative to compare a change in transfer function, such as a change determined by the difference between the first and second reference output signals, with a threshold value. More specifically the processing apparatus may be operative to adjust the determination of the load drawn current if the change is greater than the threshold value.

The measurement arrangement may comprise a current sensor which is operative to sense the load drawn current signal and the reference input signal. The measurement arrangement may comprise a transimpedance circuit whereby sensed current may be converted to a corresponding voltage. In one form the transimpedance circuit may be comprised in the current sensor. The current sensor may be operative of itself as a transimpedance circuit. For example the current sensor may be a shunt resistor which is operative of itself to sense current and provide a corresponding measureable voltage. The current sensor may be configured to be disposed in series with the load. More specifically the current sensor may be configured to be disposed such that the load draws current through the current sensor. In another form the transimpedance circuit and the current sensor may be different components. For example the current sensor may be a current transformer and the transimpedance circuit may be a burden resistor. The current sensor may be configured to be disposed in relation to the load whereby the load drawn current signal electromagnetically induces an induced current signal in the current sensor. The current measurement apparatus may be configured such that the signal source is operative to at least one of: pass the reference input signal through a path followed by the load drawn current such that the reference input signal is sensed by the current sensor; and electromagnetically induce an induced reference signal in the current sensor. Either approach to applying the reference input signal may be used with a current sensor which is operative such that the load drawn current signal is either drawn through the current sensor or induces an induced current signal in the current sensor. Where a shunt resistor is used the overall transfer function from the load drawn current to the output signal from the measurement arrangement may include characteristics, amongst others, of the shunt resistor itself, of signal conditioning circuitry and of signal acquisition circuitry with one or more of these characteristics being common to the reference input signal and the load drawn current signal. Where a current transformer is used the overall transfer function from the load drawn current to the output signal from the measurement arrangement may include characteristics, amongst others, of the electromagnetic coupling including alignment, of the current transformer, of the burden impedance and of the signal acquisition circuitry with one or more of these characteristics being common to the reference input signal and the load drawn current signal.

The measurement arrangement may be configured to acquire a signal from the current sensor, such as a voltage signal developed across a shunt resistor by the load drawn current signal and the reference input signal. Circuitry to acquire the signal may be configured to perform at least one of gain, filtering, sampling, analogue to digital conversion and reconstruction. The processing apparatus may be operative: to determine, upon application of the reference input signal, a factor corresponding to a change in the transfer function of the measurement arrangement; and to make the determination in respect of the load drawn current signal in dependence on the factor. The factor may relate to a change over time in the reference output signal. For example the reference output signal may be acquired after calibration and stored. Subsequently the reference output signal may be acquired again when the transfer function of the measurement arrangement has changed. The factor may characterise the difference between the stored reference output signal and the presently determined reference output signal. The load drawn current signal as determined on the basis of the load output signal may then be changed in dependence on the factor to address the change in transfer function.

The transfer function of the measurement arrangement may be liable to drift, e.g. on account of temperature change or as a consequence of electromigration. The signal source may therefore be operative and the processing apparatus may be operative to make a determination with regards to the transfer function or change in transfer function on an intermittent basis, whereby the transfer function or change is determined less frequently than in respect of the load drawn current signal. More specifically the signal source and the processing apparatus may be operative to determine the transfer function or change in transfer function at regular or irregular intervals. Where the intervals are regular the length of an interval may be determined on the basis of when re-calibration is likely to be required having regards to, for example, the anticipated effect of electromigration over time. Alternatively or in addition at least one of the transfer function or change in transfer function may be determined on an irregular basis in dependence on a determined condition of the current measurement apparatus, e.g. where there is an undue change in temperature which might be liable to cause an inaccuracy inducing impedance drift. Apparatus according to the invention may therefore obviate the need for external calibration beyond calibration upon installation or at the post-manufacture stage or allow for less frequent external calibration. When no reference input signal is being applied to the measurement apparatus the load drawn current is determined on the basis of the load output signal and the transfer function as most recently determined or the factor representing the most recent change in the transfer function.

The reference input signal may have a known characteristic, e.g. a predetermined characteristic which is stored, such as a frequency profile, which enables the processing apparatus to extract the reference output signal from the output signal from the measurement arrangement. For example the known characteristic may comprise one or more frequency or phase components which of the load drawn current and reference input signals are substantially unique to the reference input signal and therefore susceptible to filtering or frequency analysis. Application of the reference input signal to the measurement arrangement may give rise to a signal having a recognisable characteristic in the measurement arrangement, with the recognisable characteristic corresponding to the known characteristic of the reference input signal. The processing apparatus may be operative to perform the extraction in dependence upon the recognisable characteristic of the signal.

The load drawn current and reference input signals may differ from each other, e.g. in respect of their respective frequency profiles, to thereby enable the processing apparatus to separate the load output signal and the reference output signal from each other. For example the load drawn current signal may be a mains signal consisting essentially of a 50 Hz or 60 Hz frequency component and the reference input signal may be an alternating or pulsed signal having one or more frequency, phase or modulation components outside the band of the mains signal. Alternatively and where the load draws current from a direct current source the load drawn current signal may be substantially a direct current signal and the reference input signal may be an alternating or pulsed or modulated signal. According to a further example the load drawn current signal may be an alternating signal and the reference input signal may consist essentially of direct current. According to a yet further example the load drawn current signal may be a mains signal and the reference input signal may comprise at least one frequency, phase or modulated component substantially absent from the load drawn current signal. The signal source may therefore be operative to apply a reference input signal having a known characteristic, which is substantially absent from the load drawn current signal, to the measurement arrangement. The processing apparatus may be operative to learn which known characteristic in the load drawn current is substantially absent from the load drawn current signal and to configure the reference input signal accordingly. For example the processing apparatus may be operative ordinarily such that the reference input signal comprises a 100 Hz signal and may be operative in dependence on 100 Hz noise being present in the load drawn current signal to change the reference input signal such that it comprises an 83 Hz signal. Similarly the current measurement apparatus may be operative such that the reference input signal is locked in phase or frequency relative to the fundamental frequency of the load drawn current so as to be in a clean part of either the frequency or time domain. For example the reference input signal may be locked such that it is offset with respect to a multiple of the measured mains frequency or such that it holds a position spaced apart from the zero crossing point of the load drawn signal or the line frequency. Similarly the current measurement apparatus may be operative such that the reference input signal is modulated at the fundamental frequency or a sub-harmonic of the load drawn current, for example to be either present or not present during at least part of the complete fundamental cycle of the load drawn current signal. Additionally at least one of the signal source, signal acquisition and processing apparatus may be configured to align to a related frequency or phase of the load drawn signal. The processing apparatus may be further configured to separate the load output and reference output signals from each other in dependence on the known characteristic.

As mentioned above accurate current measurement according to the present invention relies on the reference input signal. The signal source may therefore comprise a signal source reference circuit and the current measurement apparatus may be configured such that the reference input signal is set by the signal source reference circuit. Furthermore and according to a first approach the current measurement apparatus may further comprise a reference signal reference circuit. The reference signal reference circuit may be of the same form as a current sensor comprised in the measurement arrangement, e.g. a passive component where the current sensor is a passive component, such as a resistor when the current sensor is a shunt resistor. A characteristic, such as impedance, of the reference signal reference circuit may be known to a required accuracy. The current measurement apparatus may be operative to store the known characteristic of the reference signal reference circuit. Furthermore the reference signal reference circuit may be configured to maintain accuracy according to requirements, such as over a specified period of time and/or within a range of operating temperatures. The current measurement apparatus may be configured such that the measurement arrangement is operative to acquire a reference voltage signal developed across the reference signal reference circuit solely in dependence on application of the reference input signal to the reference signal reference circuit by the signal source. The current measurement apparatus may therefore be configured to determine the load drawn current signal in dependence on: the known characteristic, e.g. impedance, of the reference signal reference circuit; the reference voltage signal; the reference output signal; and the load output signal. Alternatively the current measurement apparatus may be operative to determine, i.e. ascertain, the reference input signal in dependence on the acquired reference voltage signal and the known characteristic of the reference signal reference circuit and to thereafter determine the load drawn current signal in dependence on the reference output signal, the load output signal and the ascertained reference input signal.

The current measurement apparatus may be configured such that the measurement arrangement is operative to acquire the reference voltage signal on a periodic basis, whereby the reference voltage signal is determined less frequently than the load drawn current signal. For example one reference voltage signal may be acquired for every one hundred or one thousand acquisitions by the measurement arrangement. The current measurement apparatus may comprise a switch arrangement which is operative to switch the acquisition circuitry comprised in the measurement arrangement and the signal source between a current sensor comprised in the measurement arrangement and the reference signal reference circuit. A time between acquisitions of subsequent reference voltage signals may depend on an extent to which the reference input signal changes over time, i.e. a stability of the reference input signal. For example if the reference input signal is less stable more frequent acquisition of the reference voltage signal may be required. Although the signal source reference circuit may have a stability requirement, an absolute value such as a current value of the reference input signal may have no bearing on measurement accuracy. This is because measurement accuracy may rely on the accurately known reference signal reference circuit. However the reference signal reference circuit normally carries a lower level of current than the current sensor, e.g. mA versus Amps, and is therefore less liable to degradation and loss of accuracy than the current sensor. The reference signal reference circuit may also be formed from material having superior time and temperature drift performance in view of the reference signal reference circuit normally carrying a lower level of current than the current sensor. Furthermore a reference signal reference circuit, such as a resistor, capable of maintaining accuracy may be provided more readily and hence at lower cost than a current sensor capable of maintaining the same level of accuracy. The present approach of relying on the reference signal reference circuit may address absolute and relative errors caused by the measurement arrangement and the signal source. For example and where the measurement arrangement comprises signal conditioning circuitry, analogue to digital conversion circuitry and signal processing circuitry the present approach may address errors contributed by all of this circuitry.

Acquisition of the reference voltage signal may result in under-measurement of the load drawn current signal. Where the frequency of reference voltage signal acquisition is sufficiently low an extent of under-measurement of the load drawn current signal may be within acceptable bounds. For example if the reference voltage signal is acquired no more than once every one thousand cycles the measurement error may be less than a desired figure of −0.1%. Where the measurement error is higher than acceptable the current measurement apparatus may be configured to address this problem. More specifically the current measurement apparatus may be configured to determine a signal across the current sensor which was missed when acquiring a reference voltage signal from the reference signal reference circuit. The missed signal may be determined by the processing apparatus, e.g. by interpolation, in dependence on previous and subsequent signals acquired by the measurement arrangement.

The reference signal reference circuit may be formed from at least one discrete component. Alternatively the reference signal reference circuit may be comprised in an integrated circuit. Where the reference signal reference circuit is comprised in an integrated circuit the current measurement apparatus may be configured to change a reference provided by the reference signal reference circuit, e.g. by way of a reference adjustment arrangement, such as a trimmer as described elsewhere herein. The current measurement apparatus may further comprise at least one temperature sensor. The temperature sensor may be operative to sense a temperature at or in the vicinity of the reference signal reference circuit. Furthermore behaviour of the reference signal reference circuit with changing temperature may be determined by a calibration procedure. The determined behaviour may be stored in the current measurement apparatus. The current measurement apparatus may be configured to compensate for changing temperature in dependence on sensed temperature and the determined behaviour by means described elsewhere herein, e.g. by application of a transform which may be in the form of a lookup table. Temperature change may cause the reference current to drift. Therefore a temperature sensor may be operative to sense a temperature of the current measurement apparatus and the current measurement apparatus may be configured to change a determined load drawn current signal in dependence on a change in sensed temperature. Alternatively or in addition the current measurement apparatus may be configured to change the reference input signal itself, a determined transfer function or a determined change in the transfer function. Configuration may be by way of application of a transform, such as may be stored as a lookup table, as is described elsewhere herein.

According to a second approach the current measurement apparatus may be configured such that the reference input signal is predetermined, e.g. by setting the reference input signal at a desired current value, or ascertained, e.g. by measuring the reference input signal and determining the load drawn current signal accordingly. The reference input signal may be determined solely by the signal source reference circuit. The signal source reference circuit may comprise at least one of a passive reference circuit, such as a precision resistor, and an active reference circuit, such as a reference circuit comprising a band gap reference. The signal source reference circuit may be external to a main part of the current measurement apparatus. For example the main part of the current measurement apparatus may be constituted as a printed circuit board arrangement, multi-chip module, integrated circuit or the like with the signal source reference circuit being an external component, such as a temperature stabilised precision resistor. The active reference circuit may be comprised in an integrated circuit further comprising at least another part of the current measurement apparatus. Drift, such as might be caused by electromigration or temperature variation, is normally less where current levels are lower. The signal source reference circuit may be therefore less liable to drift than the current sensor because the latter normally carries a higher level of current.

The signal source reference circuit may be liable to degrade over time with the reference input signal suffering a consequential loss of accuracy. Therefore the current measurement apparatus may comprise a second signal source reference circuit, e.g. a second passive reference circuit such as a resistor, and the current measurement apparatus may be configured to determine a difference between a reference provided in dependence on the first signal source reference circuit and a reference provided in dependence on the second signal source reference circuit. The difference may be determined on a periodic basis, e.g. once a day or once a week, whereby the difference is determined less frequently than the load drawn current signal. The current measurement apparatus may be configured to switch between the first and second signal source reference circuits. Furthermore the current measurement apparatus may be operative to change the determined load drawn current signal in dependence on the determined difference. The determined load drawn current signal may be changed by changing the reference input signal, a factor corresponding to a change in transfer function of the measurement arrangement, a transfer function determined for the measurement arrangement or the determined load drawn current signal itself. The change may be effected by one or more of the approaches described herein, such as by application of a transform stored as a lookup table. The second signal source reference circuit may be less liable to degradation than the first signal source reference circuit because the former is operative less frequently than the first signal source reference circuit, e.g. the second signal source reference circuit may carry current only once every two weeks. Therefore the reference provided by the second signal source reference circuit may be less liable to change from a known value than the reference provided by the first signal source reference circuit. Determination of a difference between the first and second signal source references having regards to their earlier known values may provide for configuration of the current measurement apparatus to compensate for degradation of the first signal source reference circuit. This approach may be suited to forms of the invention in which the first and second signal source reference circuits are accurately matched at the outset, e.g. where the first and second references are provided in dependence on first and second resistors formed on a printed circuit board or on first and second capacitors formed in an integrated circuit.

The current measurement apparatus may comprise at least one temperature sensor. The temperature sensor may be disposed so as to sense a temperature of a signal source reference circuit or a temperature in the vicinity of a signal source reference circuit. More specifically the signal source may be operative to change at least one of the reference input signal and the determined load drawn current signal in dependence on an output from the temperature sensor to thereby compensate for temperature drift. Behaviour of the current measurement apparatus as a whole or in part, e.g. in respect of a signal source reference circuit, in response to temperature change may be determined during an initial calibration procedure and the current measurement apparatus may be configured accordingly. Compensation for temperature drift may be effected by way of application of a transform, which characterises temperature behaviour, to the determined load drawn current signal. The transform may have the form of an algorithm, which is executed at runtime, or a lookup table.

The signal source reference circuit may be operative to provide a reference, e.g. a reference voltage or reference resistance, whereby the reference input signal depends on the reference. The reference may be predetermined, i.e. the reference may be set at a desired value, whereby the signal source applies a predetermined reference input signal to the measurement arrangement. Alternatively the reference may not be predetermined or may be predetermined within bounds of insufficient accuracy with the reference input signal being ascertained, e.g. by measurement during an external calibration procedure, and the processing apparatus being configured accordingly. Irrespective of whether or not the reference is predetermined the signal source reference circuit may be configured to maintain accuracy of the reference to within limits sufficient to provide a required degree of accuracy of current measurement. For example where an accuracy of current measurement of ±0.2% is required the signal source reference circuit may be configured such that the reference maintains accuracy to within ±0.02% over a temperature range, such as −20 to 85 degrees Celsius, and for a minimum period of time. Where the reference is predetermined the signal source reference circuit may be configured for alteration of the reference. The reference may not be of a desired value following manufacture or the reference may drift from a desired value over a period of time. The reference may therefore be set at a desired value to a required degree of accuracy, e.g. by a calibration procedure which is carried out at the outset or at a later stage. The signal source reference circuit may comprise a reference adjustment arrangement, such as a trimmer, which is operative to change the reference. The reference adjustment arrangement may be an active or passive circuit. The current measurement apparatus may comprise data storage, which is operative to store adjustment data, and the reference adjustment arrangement may be operative in dependence on the stored adjustment data. The adjustment data may be determined in dependence on the calibration procedure. The data storage may be non-volatile memory, such as one time programmable memory.

Alternatively or in addition and where the reference input signal is ascertained, e.g. by measurement of a reference value of the signal source reference circuit or of the reference input signal itself, the processing apparatus may be configured to take account of the ascertained, e.g. accurately known, reference input signal. There may be no need to set the reference provided by the signal source reference circuit at a desired value provided the reference input signal is known accurately. Alternatively the reference may have suffered drift from a desired value. The current measurement apparatus may therefore comprise data storage, which is operative to store adjustment data corresponding to the determined reference value or reference input signal, and the processing apparatus may be operative to determine the load drawn current signal in dependence on the adjustment data.

Calibration may, for example, involve measuring the reference input signal by reference measuring apparatus, which is already calibrated and stabilised to a required standard. As described above the signal source reference circuit or the processing apparatus may then be configured in accordance with the measured reference input signal to either alter the reference value of the reference circuit or to change how the load drawn current signal is determined. Such a calibration procedure may be configured to address other sources of inaccuracy in the current measurement apparatus, such as in temperature measuring apparatus, clock circuitry, signal conditioning circuitry and analogue-to-digital conversion circuitry.

The reference input signal may comprise plural frequency components. The signal source may therefore be configured such that the reference input signal comprises at least one of: a frequency that changes over time, e.g. changes progressively between a first value and a second value; different frequencies at any one time; and frequency components which are out of phase with each other. Having out of phase frequency components may be advantageous: with regards to the ease with which the reference output signal is extracted from the output from the measurement arrangement; and where addressing a frequency dependency of the measurement arrangement. Having at least one of a frequency that changes over time and different frequencies at any one time may provide for change from one operative frequency to another to, for example, avoid noise or a frequency trap and may also be advantageous with regards to addressing a frequency dependency of the measurement arrangement, such as self inductance. A frequency dependency, such as self inductance, may give rise to a difference between the transfer function seen by the reference input signal and the transfer function seen by the load drawn current signal. The current measurement apparatus may therefore be operative to determine a frequency dependent transfer function of the measurement arrangement over a range of frequencies in dependence on the reference input signal comprising at least one of: a frequency that changes over time; and different frequencies at any one time. This step may be carried out upon initial calibration or on a periodic basis when it may be deemed appropriate to further determine a frequency dependent transfer function, which may be stored by the current measurement apparatus. The current measurement apparatus may be further operative to modify, in dependence on the determined frequency dependent transfer function, the load drawn current signal determined in the absence of application of the reference input signal. The current measurement apparatus may thereby be operative to take account of a frequency dependency of the measurement arrangement. The processing apparatus may be operative such that the frequency dependency of the measurement arrangement may comprise at least one characteristic of amplitude, phase and group delay response with frequency.

The signal source may be configured to change an amplitude of the reference input signal. Changing an amplitude of the reference input signal may be advantageous where the load drawn current signal changes between large and small values, e.g. to achieve a compromise between accuracy and power consumption. In certain applications, such as in domestic supply of electricity, the load drawn current signal may vary between 0 and 50 Amps. Changing an amplitude of the reference input signal may also be advantageous to trade-off power consumption and time involved in acquiring data for determining different transfer functions. For example acquisition apparatus may operate at a higher rate during factory calibration to provide for faster determination of transfer function to the required accuracy. By way of another example the acquisition apparatus may operate at a lower rate when monitoring for change in transfer function for diagnostic purposes to thereby save on power consumption. Where the reference input signal comprises different frequency components at any one time, amplitudes of the different frequency components may differ from each other. The signal source may be configured to generate such a reference input signal.

The current measurement apparatus may be configured to change a direction in which the reference input signal is passed through the measurement arrangement. More specifically the current measurement apparatus may comprise a switch arrangement which is operative to select an end of the measurement arrangement to which the reference input signal is applied. The current measurement apparatus may be configured such that the signal source forms a signal source circuit path with a current sensor comprised in the measurement arrangement and acquisition circuitry comprised in the measurement arrangement forms an acquisition circuit path with the current sensor, the signal source circuit path and the acquisition circuit path being separate. Separation of the two paths from each other may reduce the likelihood of parasitic components present in the acquisition circuit path having an adverse effect on the operation of the reference input signal. For example separation of the two paths may avoid a voltage drop being developed by the reference input signal across parasitic resistance in the acquisition circuit path which would otherwise compromise measurement accuracy.

Alternatively or in addition the processing apparatus may be operative when determining the load drawn current signal to adjust for the reference input signal. For example in certain arrangements the processing apparatus may be operative to subtract the reference input signal from determined load drawn current. Where the reference input signal is less than a desired proportion of the load drawn current signal, e.g. such that the load drawn current can be measured accurately to within ±0.1%, there may be no need to adjust for the reference input signal.

The processing apparatus may be configured to extract from the output signal from the measurement arrangement at least one of: the reference output signal; and the load output signal. The processing apparatus may be configured to perform a frequency transform on the output signal, such as a Fast Fourier Transform (FFT) algorithm, which is operative to separate the reference output signal and the load output signal from each other on the basis of their different frequencies. At least one of the reference input signal and the load output signal may comprise a complex signal. The processing apparatus may therefore be operative to perform a frequency analysis to determine a fundamental frequency and at least one harmonic frequency. Accurate determination of the transfer function or change in transfer function of the measurement arrangement may depend on determination of the fundamental frequency and at least one harmonic frequency. An extent to which harmonics may need to be taken into account may depend on a profile of a signal's power spectrum in the frequency domain.

The current measurement apparatus may comprise a filter array, which is operative to extract at least one of the reference output signal and the load output signal. The transfer function or change in transfer function of the measurement arrangement may then be determined on the basis of the extracted reference output signal. Configuration of the filter array may depend on at least one of: a frequency profile of at least one of the reference input and load drawn current signals; and an accuracy to which the filter array is to be operative. The filter array may be comprised in an analogue circuit such that, for example, filtering takes place before analogue to digital conversion or in digital circuitry such that, for example, filtering takes place after analogue to digital conversion.

At least one of the measurement arrangement and the processing apparatus may cause distortion. For example the measurement arrangement may present a distortion causing complex impedance to the reference input and load drawn current signals. Accurate determination of the load drawn current signal may require characterisation of a distortion causing part of the current measurement apparatus. According to one approach calibration apparatus may be used to characterise the distortion causing part. For example the reference output signal may be characterised at different amplitudes of the load drawn signal in order to determine the change in amplitude of the reference signal at different load signal amplitudes and to determine a correction curve. The current measurement apparatus may then be configured to transform in dependence on the characterisation at least one of: the reference input signal; the transfer function for the measurement arrangement as determined by the processing apparatus; and the load drawn current signal as determined by the processing apparatus. According to another approach a known reference input signal may be applied to the measurement arrangement and a corresponding signal developed by the measurement arrangement determined by the current measurement apparatus. The processing apparatus may be operative to analyse the determined signal, e.g. by way of a frequency transformation approach, in relation to the known reference input signal to provide for characterisation of at least one of the measurement arrangement and the processing apparatus. The current measurement apparatus may then be configured to operate accordingly, e.g. by transformation of a subsequently applied reference input signal or determined transfer function. Configuration may be by way of an algorithm or a lookup table.

Under certain circumstances there may be a large difference in the magnitudes of the load output signal and the reference output signal such that the current measurement apparatus may not be operable, e.g. on account of a limited dynamic range such as of acquisition circuitry, to readily extract the reference output signal. According to a further embodiment the current measurement apparatus may therefore further comprise second processing apparatus, which is configured to substantially solely acquire the reference output signal and then to determine the transfer function or change in transfer function of the measurement arrangement in dependence on the reference input signal and the acquired reference output signal. The transfer function may be determined by the first (i.e. previously described) processing apparatus such that the second processing apparatus comprises acquisition circuitry. Furthermore the second processing apparatus may be operative to convey the determined transfer function or change in transfer function to the first processing apparatus, e.g. for determination of the load drawn current signal, where the first processing apparatus has not determined the transfer function or change in transfer function. The transfer function or change in transfer function may be determined on a periodic basis, whereby the transfer function or change is determined less frequently than the load drawn current signal. Determination of the transfer function or change in transfer function on a regular or irregular basis is described elsewhere herein.

The second processing apparatus may be configured to receive the output signal from the measurement arrangement and may comprise a filter circuit and an acquisition circuit, the filter circuit being operative to at least partially obstruct the load output signal and the acquisition circuit being operative on an output from the filter circuit. In use the filter circuit may at least partially obstruct if not substantially remove the load output signal whereby the acquisition circuit may be operative with a smaller dynamic range than may be required had the acquisition circuit been operating on both the reference output signal and the load output signal. The filter circuit may comprise a low pass filter. A cut-off frequency of the low pass filter may be less than substantially 50 Hz, substantially 10 Hz or substantially 1 Hz. The reference output signal may therefore comprise a component or consist essentially of at least one component having a frequency of less than 50 Hz, 10 Hz or 1 Hz whereas the load output signal may have a frequency component of 50 Hz or more. The signal source may be configured such that a frequency of the reference signal is lower than a frequency of the current signal. Alternatively the signal source may be configured such that a frequency of the reference output signal is higher than a frequency of the load output signal, e.g. higher than a fundamental frequency and at least one harmonic frequency. The filter circuit may comprise a high pass or band pass filter. The filter circuit may be configured to pass a frequency component of more than 62.5 Hz, 125 Hz, 250 Hz, 500 Hz, 1 kHz, 2 kHz, 4 kHz or 8 kHz. The reference output signal may therefore comprise a component or consist essentially of at least one component having a frequency of more than 62.5 Hz, 125 Hz, 250 Hz, 500 Hz, 1 kHz, 2 kHz, 4 kHz or 8 kHz whereas the load output signal may have a dominant frequency component of 50 or 60 Hz.

According to another embodiment the current measurement apparatus may further comprise an extraction circuit and a subtraction circuit. The current measurement apparatus may be configured such that the extraction circuit is operative to receive an output signal from the measurement arrangement and to extract the reference output signal from the received output signal. The subtraction circuit may be operative to subtract the extracted reference output signal from an output from the processing apparatus to thereby leave the load output signal. The extraction circuit may comprise a demodulator circuit, e.g. in the form of a mixer or switched capacitor circuit, the signal source may be operative to apply a reference input signal to the measurement arrangement at a predetermined frequency and the demodulator circuit may be operative at the predetermined frequency.

The current measurement apparatus may further comprise a noise filter which is operative to reduce noise forming part of the output signal from the measurement arrangement. The noise filter may be configured to reduce impulse signals and other noise of predetermined frequency which otherwise might be liable to give rise to inaccuracy in current measurement or cause other fault conditions in the current measurement apparatus. The current measurement apparatus may be configured such that a noise filter is operative to at least one of: filter signals received by the processing apparatus; and filter signals from the signal source.

The current measurement apparatus may further comprise at least one conductor electrically coupled to the load and through which the current signal is drawn. The measurement arrangement may be disposed proximate the at least one conductor whereby the current signal in the conductor electromagnetically induces an induced current signal in the measurement arrangement. Alternatively or in addition the signal source may comprise a signal source conductor which is operative to carry the reference input signal. The measurement arrangement may be disposed proximate the signal source conductor whereby the reference input signal in the signal source conductor induces an induced reference signal in the measurement arrangement. The measurement arrangement may comprise a coil disposed around the at least one conductor. The coil may also be disposed around the signal source conductor. The coil may be comprised in one of a current transformer and a Rogowski coil. In a form the coil may be disposed around plural live conductors. The coil may be formed around a ferrite core. In another form the coil may be disposed around at least one live conductor and a neutral conductor. The processing apparatus may be configured to determine a characteristic transfer function of the current transformer or Rogowski coil as determined on the basis of the reference input signal and the induced reference signal. The transfer function may include the effects of parasitics of the coil, the core, the burden resistor and the processing chain and these effects may therefore be determined and compensated. The transfer function may comprise at least one characteristic of frequency response, such as at least one of phase or group delay and relative amplitude response. A characteristic change may, for example, be indicative of saturation of a core of the current transformer or Rogowski coil and may be used to determine if tampering is occurring through application of an external magnetic field or may be used to determine other fault or operable condition events. Where the measurement arrangement comprises a current transformer the number of windings in the secondary of the current transformer with respect to the conductor going through the current transformer may be less than 10:1, 100:1, 250:1, 500:1, 1000:1, 2000:1, 4000:1, 8000:1, 16000:1 or 32000:1. The burden resistor of the current transformer maybe less than 1 k ohm, 500 ohm, 250 ohm, 125 ohm, 64 ohm, 32 ohm, 16 ohm, 8 ohm, 4 ohm, 2 ohm or 1 ohm.

The current measurement apparatus may comprise a measurement assembly comprising the measurement arrangement, the at least one conductor and the signal source conductor. The measurement assembly may be configured to maintain the spatial separation of at least part of the measurement arrangement, such as a coil of a current sensor, the at least one conductor and the signal source conductor amongst each other to within a predetermined limit. Maintaining spatial separation to within a predetermined limit may provide for more accurate measurement of the current signal, e.g. by reducing misalignment of magnetic fields. The spatial separation may be maintained by the measurement arrangement, the at least one conductor and the signal source conductor being bonded in the measurement assembly or by the measurement assembly being configured to hold the measurement arrangement at least in part, the at least one conductor and the signal source conductor.

The measurement arrangement may comprise at least one of a shunt resistor, a current transformer, a Rogowski coil, a Hall effect sensor and other electromagnetic current sensor. The Hall effect sensor may be in the form of a ring sensor or a split ring sensor. The Hall effect sensor may be disposed relative a conductor carrying the load drawn current signal. In addition the Hall effect sensor may be disposed relative a conductor carrying the reference input signal. The load drawn current signal and the reference input signal may be carried by separate conductors.

The current sensor may constituted by an electrical arrangement configured to be operative as other than a current sensor and which is adapted to be operative as a current sensor. Alternatively or in addition the current sensor may be constituted by a conductor forming part of and providing electrical connectivity in and perhaps to a component, such as a component comprised in the current measurement apparatus. More specifically the current sensor may comprise at least one of: a length of electrical wire; a length of electrically conductive track formed in or on a printed circuit board; a structure formed in an integrated circuit; a conductor comprised in an integrated circuit package, such as a lead frame; a structure formed as part of a connector; and a structure formed as part of a conductive element of a series component such as a relay. Wires, leads and lengths of conductive track are normally not used in prior art approaches to accurate current measurement because of the effects of is electromigration and temperature drift. A connector or a large physical component such as a capacitor or a relay within a meter may have a lead which is used as a shunt subject to its inaccuracy and lack of precision being capable of compensation. Use of a conductor comprised in a lead frame of an integrated circuit package or in a structure formed as part of the integrated circuit has the advantages of saving on time and cost and couples the current sensor in the form, for example, of a shunt resistor more tightly to the electronics. As described herein the present invention addresses such problems and therefore provides for use of such lower quality components. Where the current sensor comprises a shunt resistor arrangement, the shunt resistor arrangement may have a resistance of less than substantially 100 mΩ. More specifically the shunt resistor arrangement may have a resistance of less than substantially 40 mΩ 20 mΩ, 10 mΩ, 5 mΩ, 1 mΩ, 500μΩ, 250μΩ, 100μΩ, 50μΩ, 25μΩ, or 5μΩ. Alternatively or in addition the shunt resistor arrangement may have a resistance of more than substantially 5μΩ, 25μΩ, 50μΩ, 100μΩ, 250μΩ, 500μΩ, 1 mΩ, 5 mΩ, 10 mΩ, 20 mΩ or 40 mΩ.

Alternatively or in addition and where the load draws current from a single phase mains electricity supply, a split phase supply (i.e. where there are two live conductors and one neutral conductor), a three-phase electricity supply or a supply with more than three phases, a measurement arrangement may be disposed in relation to each of at least one of: a neutral wire; and at least one live wire. More specifically the current measurement apparatus may comprise a first measurement arrangement disposed in relation to the live wire, a second measurement arrangement disposed in relation to the neutral wire, at least one signal source and at least one processing apparatus. The current measurement apparatus may comprise: first and second measurement arrangements or first, second and third measurement arrangements disposed in relation to a respective live wire of split or three-phase apparatus; at least one signal source; and at least one processing apparatus. More specifically a first signal source and a first processing apparatus may be electrically coupled to the first measurement arrangement and a second signal source and a second processing apparatus may be electrically coupled to the second measurement arrangement. In three-phase apparatus a third signal source and a third processing apparatus may be electrically coupled to the third measurement arrangement. Each signal source and processing apparatus pair may be operative to determine the current signal passing through its electrically connected measurement arrangement. In configurations having multiple phases where the return path has a common neutral, the current measurement apparatus may be operative to estimate the content of each of the multiple phases on the neutral. The current measurement apparatus may be further operative to separate the content of each phase and to determine which phase is contributing to a current error. The current measurement apparatus may be further operative such that this process is iterative. In addition the current measurement apparatus may be operative to perform further analysis of the load signal on each phase to thereby reduce crosstalk in computation between each phase.

Alternatively or in addition the load drawn current signal may be at least 0.1 Amp peak or RMS. More specifically the load drawn current signal may be at least 1 Amp peak or RMS, 5 Amps peak or RMS, 10 Amps peak or RMS, 20 Amps peak or RMS, 40 Amps peak or RMS, 80 Amps peak or RMS, 100 Amps peak or RMS, 200 Amps peak or RMS or 320 Amps peak or RMS.

Alternatively or in addition and where the load drawn current signal is an alternating current, the fundamental frequency of the alternating current may be less than 500 Hz, such as a frequency of substantially 60 Hz or substantially 50 Hz for domestic mains or a frequency of substantially 400 Hz for mains in ships or aircraft. Alternatively or in addition a frequency of the reference input signal may be less than 250 kHz, 100 kHz, 50 kHz, 20 kHz, 10 kHz, 5 kHz, 2.5 kHz or 1.25 kHz, 625 Hz, 320 Hz, 160 Hz, 80 Hz or less than the fundamental of the load drawn current.

The current measurement apparatus may further comprise at least one power conversion apparatus, which is operative to draw electrical power from an electricity supply and to provide electrical power to the current measurement apparatus. For example the power conversion apparatus may be electrically connected to a live and a neutral wire of a mains electricity supply. The power conversion apparatus may be connected on a supply side of the measurement arrangement to avoid measuring current drawn by the power conversion apparatus and the consumer paying for such power conversion apparatus drawn current. The power conversion apparatus may comprise one or more of an ac-dc converter, a rectifier, a voltage regulator and a dc to dc converter depending on whether power is drawn from an alternating or direct current source and on the amplitude and the variation in the amplitude of the electrical supply to the power conversion apparatus. Plural power conversation apparatus may be provided for respective plural processing apparatus and signal sources to provide for isolation amongst the plural processing apparatus and signal sources.

Tampering with electricity consumption meters to avoid payment for electricity consumption is acknowledged as a problem. Electricity suppliers are interested in being able to detect tampering amongst other things, for example, to ensure billing continues with a penalty, to know when action needs to be taken to remove a tamper, or to deny service by forcing the interruption of the supply. A crude commonly used approach involves connecting a wire across the live in and live out of the meter to form a bypass of the meter so that the load drawn current substantially no longer passes through the meter and is no longer measured and billed. In order for such tampering to work the wire normally presents a smaller resistance to the load drawn current signal than the shunt resistor in the meter. Providing a low resistance bypass path causes a corresponding reduction in the level of current measured by the consumption meter to the advantage of the consumer. For example where the resistance of the bypass path is a tenth of the resistance of the shunt resistor the measured current is about 9% of the true current.

The present inventors have appreciated that the invention as hitherto described may be configured to address the problem of tampering. According to a further embodiment the processing apparatus may further comprise data storage and may be operative to at least one of: compare a presently determined transfer function in respect of the measurement arrangement, such as an impedance, with at least one previously determined transfer function stored in the data storage; and compare a presently determined factor corresponding to a change in transfer function in respect of the measurement arrangement with at least one previously determined factor stored in the data store. An undue difference between or amongst plural transfer functions or factors may be indicative of tampering. The processing apparatus may therefore be operative to determine a difference between the presently determined transfer function or factor and at least one previously determined transfer function or factor. The processing apparatus may then be operative to provide diagnostic data, e.g. with regards to whether or not there has been tampering, in dependence on the comparison. The diagnostic data may be processed and displayed locally, for example, by way of an LED or LCD display or may be communicated elsewhere. There may be a resulting action such as denial of service as a result of the diagnostic data. Furthermore the processing apparatus may be operative to compare the difference between the two transfer functions or factors with a threshold value and to determine a tampering condition in dependence on the comparison. The threshold value may be set at the outset, e.g. at the post-manufacture stage. Alternatively the threshold value may take into account information about the environment of the sensor such as a level load drawn current or the ambient temperature and change the value to be tolerant to changes. Alternatively or additionally the threshold value may depend on an earlier determined difference between two transfer functions or factors. More specifically a predetermined offset may be added to the earlier determined difference. The predetermined offset may provide sufficient margin to allow for detection of a large and hence tamper indicative change in the transfer function or factor. Adding an offset to an earlier determined difference may allow for a slow increase in the difference between transfer function measurements or factor determinations over time, which may arise for reasons other than tampering. Where transfer functions or factors are determined on a regular basis the temporal relationship of different determined transfer functions or factors may be known or determinable. Where a transfer function or a factor is determined on an irregular basis it may be desirable to record a time of determination of a transfer function or factor. The current measurement apparatus may therefore comprise time recording apparatus, such as a real time clock, and may be operative to record a time of determination of a transfer function or factor in dependence on operation of the time recording apparatus. The processing apparatus may therefore be operable to determine a rate of change of transfer function or factor over time. The processing apparatus may be operable to store data in the data store relating to transfer functions or factors determined at a plurality of instances. The stored data may comprise at least one of: impedance value; factor value; difference between impedance values; change in voltage signal; and rate of change of impedance over time. The current measurement apparatus may therefore be operative to store a transfer function or factor profile over time. The current measurement apparatus may therefore be operative to compare information before and after a disconnect event, and/or to use other usage information to corroborate a likely tampering event. For example the current measurement apparatus may be operative to determine if the average power consumption has also changed when other characteristics such as frequency or phase content of the load drawn current have remained the same. Additionally the current measurement apparatus may be operative to store a value of the transfer function at the moment when disconnect occurs and to compare the stored value with a value of the transfer function when the apparatus restarts.

The present inventors have appreciated that storage of transfer function or factor information may be applied more widely than to tamper detection. Electrical components are liable to degrade over time with the rate of degradation normally increasing with the current carried. An electrical component, such as a resistive shunt, which carries a high level of current, is liable to suffer what may be an appreciable rate of degradation over time. In the fullness of time the electrical component may fail. Failure of the electrical component may be accompanied by a relatively sharp change in transfer function, e.g. impedance, or factor corresponding to a change in transfer function. For example, before and after a high current surge event, the current sensor may change its characteristics. Storage of transfer function or factor data by the processing apparatus as described above with regards to tamper detection may provide for failure detection. More specifically the processing apparatus may be operative to determine in dependence on stored transfer function or factor data whether or not the measurement arrangement has failed. Failure may be preceded by a characteristic change in the transfer function of the measurement arrangement or a change in a factor corresponding to a change in transfer function. For example a rate of change of transfer function over time that exceeds a predetermined threshold may be indicative of impending failure. Alternatively a characteristic transfer function or factor profile over time may indicate impending failure. For example corrosion on the terminals of the current sensor might appear as a drift in one direction with time and/or average power dissipated and may be independent of other effects such as ambient temperature. The processing apparatus may therefore be operative to detect impending failure in dependence on an analysis of at least one of a change in a transfer function, a transfer function profile, a change in a factor corresponding to a change in transfer function and a factor profile.

Diagnostic information, such as information relating to tamper, fault or failure detection may be stored locally, displayed locally, acted upon locally or passed locally to a host or gateway in the current measurement apparatus for analysis and subsequent action. Analysis and subsequent action may, for example, include communication to a Wide Area Network (WAN) or a Local Area Network (LAN) of a failure event, the gathering of operational statistics or denial of service amongst other things. The present inventors have appreciated the determination and use of diagnostic information to be of wider applicability than hitherto described. As described above, transfer function characteristics may be used to adjust a metered quantity such as the load drawn current with diagnostic information being determined in addition. In wider application, the diagnostic information is determined and although a quantity is metered there is no adjustment of the metered quantity. According to a further aspect of the present invention there is therefore provided current measurement apparatus comprising: a measurement arrangement configured to be disposed in relation to a load which draws a current signal, the measurement arrangement being operative when so disposed to measure the load drawn current signal; a signal source operative to apply a reference input signal to the measurement arrangement whereby an output signal from the measurement arrangement comprises a load output signal corresponding to the load drawn current signal and a reference output signal corresponding to the reference input signal; and processing apparatus which is operative to receive the output signal and in dependence thereon provide diagnostic information. Embodiments of the further aspect of the present invention may comprise one or more further features of any other aspect of the present invention.

As explained above when the invention is used with a single shunt on a live conductor tampering involving a single bypass can be detected by impedance change detection. There are, however, other approaches to tampering with electricity consumption meters that include swapping the live and neutral wires from an electricity supply so that current measurement is present in the now neutral wire and connecting the now neutral wire to earth so that no return current passes through the meter. It is known to provide current measurement in each of the live and neutral wires to address such a tampering attempt. This technique can also detect single bypass tampering because the current in the live path will be substantially different to the current measured in the neutral path. Nevertheless the technique cannot detect a double bypass tampering attempt where both live and neutral current measurements are bypassed. This is because the amount bypassed on both conductors could be largely the same. This technique is normally implemented with a shunt resistor on one conductor and a current transformer around the other conductor. In view of the sensors having different characteristics and transfer functions the limit for detecting tampering has to be set relatively high; typically a tamper is detected if >8% delta is detected. The present inventors have realised if the present invention is applied as the current measurement apparatus on both conductors with a shunt resistor as the current sensor on both live and neutral conductors, it can not only detect the single bypass tamper and the swapped and earthed tamper but also the double tamper. This is because this approach involves making impedance measurements in both live and neutral conductors, whereby the bypass wire causes a noticeable change in the effective shunt impedance. By knowing the impedance change from the nominal impedance, an estimate can be made of the current being bypassed versus the current being measured by the meter, so an estimate for billing can still be provided. The current measurement apparatus may therefore comprise: first and second measurement arrangements in a respective one of the live and neutral wires from an electricity supply; first and second signal sources operative to apply a reference input signal to a respective one of the first and second measurement arrangements; and first and second processing apparatus operative to determine the load drawn current signal passing through a respective one of the first and second measurement arrangements or a transfer function in respect of the first and second measurement arrangements. First and second current sensors comprised in respective first and second measurement arrangements may be of a same form. For example the first and second current sensors may be shunt resistors. Alternatively the first and second current sensors may be of different form, e.g. one may be a shunt resistor and the other may be a current transformer. The current measurement apparatus may further comprise comparison apparatus operative to perform a comparison between at least one of determined transfer functions and load drawn current signals.

Tampering involving bypassing at least one of the live and neutral wires may be reflected in a change in measured impedance in respect of each of the live and neutral wires. The current measurement apparatus may therefore be configured to determine a transfer function over time for at least one of the first and second measurement arrangements. The current measurement apparatus may be further configured to at least one of: determine a change in at least one of the transfer functions over time; and determine a change over time in relative transfer functions for the first and second measurement arrangements. The current measurement apparatus may be operative to determine whether or not tampering has taken place in dependence on a determined change. A change in transfer function over time or in respect of one transfer function in relation to another may be compared with a predetermined threshold, which may be stored in the processing apparatus, to thereby reduce the likelihood of false detection of tampering. The current measurement apparatus may therefore comprise comparison apparatus operative to perform such a comparison. Tampering involving both the live and neutral wires may be less likely to cause a tamper indicating difference between the transfer functions. Nevertheless this tampering approach may cause a sudden change in transfer function, such as a sudden decrease in impedance, in respect of each of the first and second measurement arrangements. Therefore the current measurement apparatus may be configured to determine a change of transfer function over time for the measurement arrangements present in the live and neutral wires. As described elsewhere a factor corresponding to a transfer function of or change in transfer function of the measurement arrangement may be determined instead of or in addition to the transfer function of the measurement arrangement. Also the current measurement apparatus may be operative on the factor instead of or in addition to the transfer function during the course of tamper detection.

As described above failure of a measurement arrangement may give rise to a measurable change, such as a relatively sharp increase or decrease in measured impedance where the measurement arrangement comprises a shunt resistor. An impending failure of a measurement arrangement may result in an uncharacteristic change in its transfer function, such as an increase in rate of change in measured impedance. The current measurement apparatus may therefore be configured as described above to store previously acquired data, such as transfer function data or data reflecting a rate of change in a transfer function. The current measurement apparatus may also be configured as described above for comparison of presently determined data with previously acquired data.

In configurations of the current measurement apparatus comprising plural measurement arrangements which do not inherently provide for isolation the current measurement apparatus may further comprise at least one galvanic isolator in a circuit path between measurement arrangements. Use of at least one galvanic isolator may maintain isolation between electrical conductors, e.g. between the live and neutral conductor in a single phase arrangement and between and amongst live conductors and the neutral conductor in a three phase or split-phase arrangement.

Determination of power consumption may require measurement of a line voltage signal as well as a load current signal with power consumption being determined in dependence on measured load current and line voltage signals. The current measurement apparatus may therefore further comprise line voltage measuring apparatus, such as a resistive divider arrangement, configured to measure a voltage between the live and neutral conductors. The current measurement apparatus may further comprise a multiplier arrangement operative to multiply measured voltage and current values to thereby determine instantaneous power. The current measurement apparatus may further comprise a real time clock and the current measurement apparatus may be operative in dependence on an output from the real time clock and the instantaneous power to determine the energy used. The present invention may be operative to generate relative phase characteristics of the load current measurement transfer function with respect to the line voltage measurement to provide for alignment of load current and line voltage measurement values to correctly estimate instantaneous power and to calculate power quality metrics such as active and reactive power and power factor.

A power generator, such as a renewable energy generator, may be present on the load side of the measurement arrangement. The power generator may be operative to contribute to the power consumed by the load and thereby reduce the power drawn from the mains supply. Alternatively and in a local power generation scenario if no power is being consumed by the load or if the power generator is generating more power than is required by the load the power generator may be operative to convey power to the mains supply. The current measurement apparatus may be configured to provide for bidirectional current measurement. More specifically the current measurement apparatus may be configured: to acquire a voltage signal developed across the measurement arrangement, e.g. by way of a capacitive sample-and-hold arrangement comprised in the current measurement apparatus; and to determine a direction of power flow in relation to the load and a level of power conveyed. For example an instantaneous voltage acquired from across the measurement arrangement may be proportional to the sum of the load drawn current, the reference current and the negative of the generated current with a negative sum indicating power being conveyed to the supply.

According to the present invention a measurement arrangement, such as a shunt resistor, is used to measure current drawn by the load with the measurement being used, for example, to determine the power consumed by the load. As discussed above the transfer function of the measurement arrangement, e.g. impedance of the shunt resistor, is liable to have an unacceptable tolerance at time of manufacture or may drift and thereby give rise to inaccuracy in current measurement. A reference input signal is therefore applied, e.g. periodically, to the measurement arrangement to determine the transfer function of the measurement arrangement or a change in the transfer function with the determined transfer function or change being used to maintain accuracy of current measurement. Determining the transfer function or the change in transfer function involves measuring a signal developed in the measurement arrangement by the reference input signal and the load drawn current. The reference output signal (i.e. the part of the measured signal corresponding to the reference input signal) is then separated from the load output signal (i.e. the part of the measured signal corresponding to the load drawn current) by the means described above and the transfer function or change in transfer function is determined from the separated reference output signal. The signal to noise ratio of the reference output signal to any signal other than the reference output signal having the same characteristics, such as random noise or part of the load output signal having similar characteristics to the reference input signal, e.g. in the frequency band of the reference output signal, may however be insufficient to allow for separation of the reference output signal and determination of the transfer function or change in transfer function within a sufficiently short time to enable changes in the transfer function to be followed accurately and for accuracy of current measurement to be maintained.

An approach to addressing the problem involves increasing the power of the reference input signal to thereby improve the ratio of the reference output signal to the load output signal. However this approach may result in power consumption being increased to an unacceptable level. An alternative approach to addressing the problem springs from an appreciation that the load output signal may either be already determined or may be determinable. The alternative approach may involve subtracting the load output signal from the measured signal to thereby leave the reference output signal and whatever noise there may be, such as noise generated by the processing electronics. The current measurement apparatus may therefore be configured to determine the load output signal and to subtract the load output signal from a signal measured by the measurement arrangement to thereby provide a reference output signal. Furthermore the current measurement apparatus may be configured to determine a transfer function or a change in the transfer function of the measurement arrangement in dependence on the reference output signal. The current measurement apparatus may be configured to determine the load drawn current in dependence on the determined transfer function or to adjust the determination of load drawn current in dependence on the change of the transfer function or on a change in the reference input signal itself. The earlier described approaches to separation of the reference output signal, such as the FFT approach, may be employed in addition to the present subtraction approach to at least one of address noise and provide for improved determination, e.g. with regards to accuracy, of the transfer function or the change in the transfer function.

According to an embodiment the current measurement apparatus may comprise a first measurement arrangement and a second measurement arrangement, the current measurement apparatus being configured such that the first measurement arrangement measures the reference input signal and the load drawn current and such that the second measurement arrangement measures the load drawn current absent the reference input signal. The current measurement apparatus may be configured such that the reference input signal is applied to the first measurement arrangement alone of the first and second measurement arrangements. The current measurement apparatus may be configured to acquire a signal by way of each of the first and second measurement arrangements, e.g. by sampling, analogue to digital conversion and reconstruction as described elsewhere. The current measurement apparatus may be configured such that at least one of the sampling, analogue to digital conversion and reconstruction is carried out by different circuits in respect of each of the first and second measurement arrangements, such as by sampling, analogue to digital conversion and reconstruction circuitry comprised in each of the first and second measurement arrangements.

The first and second measurement arrangements may be the substantially the same or different arrangements. More specifically the first and second measurement arrangements may be operable according to the same electrical principle or by different electrical principles. For example the first and second measurement arrangements may both comprise shunt resistors. By way of further example the first measurement arrangement may comprise a shunt resistor and the second measurement arrangement may comprise a current transformer, such as a current transformer disposed, e.g. in relation to the neutral conductor, for tamper detection; it being noted that a signal on the live conductor normally returns by way of the neutral conductor. Thus at least a part of one of the first and second measurement arrangements, e.g. a current sensor, may be disposed in relation to the live conductor and at least a part e.g. a current sensor, of the other of the first and second measurement arrangements may be disposed in relation to the neutral conductor. Alternatively at least a part of the first and second measurement arrangements may be disposed in relation to one of the live and neutral conductors. For example the first and second measurement arrangements may comprise first and second shunt resistors which are disposed in series in relation to each other in the live conductor. The former embodiment (i.e. in which only one of the first and second measurement arrangements is present in the live conductor) offers advantages over the latter embodiment (i.e. in which both the first and second measurement arrangements are present in one conductor). More specifically the former embodiment involves measuring the load drawn current signal absent the reference input signal by way of an already present measurement arrangement whereas the latter embodiment involves inclusion of an additional component in the same conductor as the first measurement arrangement. Furthermore the former embodiment may measure the load drawn current signal absent the reference input signal without an appreciable increase in power consumption or cost. Where at least one of the first and second measurement arrangements provides for no isolation from the conductors the current measurement apparatus may comprise an isolator configured to provide for isolation between the first and second measurement arrangements.

Where at least a part of the first and second measurement arrangements are disposed in relation to one of the live and neutral conductors the first and second measurement arrangements may comprise discrete components, such as two discrete shunt resistors. Alternatively the first and second measurement arrangements may be combined at least in part whilst yet operating as different components. More specifically the current measurement apparatus may comprise a core component configured such that the first and second measurement arrangements are comprised at least in part in the core component. The core component may comprise a distributed operative part and at least three electrical connections with the electrical connections being connected to the distributed operative part, e.g. at respective different locations on the distributed operative part. In addition electrical connections to the first measurement arrangement and to the second measurement arrangement may each be constituted by different ones of the at least three electrical connections. The first measurement arrangement and the second measurement arrangement may therefore be constituted at least in part by a part of an electrical arrangement, such as a wire or track of an integrated circuit or part of the package lead frame for an integrated circuit. According to one example and where the core component is a resistive element, a first electrical connection may be connected to a first end of the resistive element, a second electrical connection may be connected to a second opposite end of the resistive element and a third electrical connection may be connected between the first and second connections, e.g. at the midpoint of the resistive element. In this example the electrical connections to the first measurement arrangement may be constituted by the first and third electrical connections and the electrical connections for the second measurement arrangement may be constituted by the second and third electrical connections. According to another example and where the core component is a resistive element, a first electrical connection may be connected to a first end of the resistive element, a second electrical connection may be connected to a second opposite end of the resistive element, a third electrical connection may be connected at a first location between the first and second connections, e.g. one third of the way between the first and second connections, and a fourth electrical connection may be connected at a second location between the first and second connections, e.g. two thirds of the way between the first and second connections. In this example the electrical connections to the second measurement arrangement may be constituted by the first and second electrical connections and the electrical connections for the first measurement arrangement may be constituted by the third and fourth electrical connections. By way of further example the core component may be configured for further connections so as to provide for a multiple point Kelvin arrangement.

According to another embodiment the current measurement apparatus may comprise first and second signal sources, the first signal source being operative to apply a first reference input signal to the first measurement arrangement and the second signal source being operative to apply a second reference input signal to the second measurement arrangement. The current measurement apparatus may be operative to apply the first and second reference input signals to their respective measurement arrangements at substantially the same time. The first and second measurement arrangements may be disposed for measurement in relation to the same conductor, such as the live conductor. The current measurement apparatus may further comprise first acquisition circuitry which is operative to acquire a first signal from a first current sensor and second acquisition circuitry which is operative to acquire a second signal from a second current sensor. The first and second reference input signals may be different. More specifically the first and second reference input signals may be different in respect of at least one of phase, frequency and modulation. The current measurement apparatus may be operative to subtract each of the first and second signals from the other to thereby provide first and second subtracted signals which each lack the load output signal. The two subtracted signals may provide between them for determination of further information, e.g. with regards to a change in the transfer characteristics of the first and second measurement arrangements.

According to a yet further embodiment the signal source may be configured to modulate the reference input signal before its application to the measurement arrangement. According to this embodiment the reference output signal may be extracted in dependence on operation of a single measurement arrangement in contrast to the previous embodiments which use two measurement arrangements. Modulation may be by way of a form of Return To Zero (RTZ) approach or the like. Modulation may be aligned to the fundamental frequency of the load drawn signal in frequency (for example, changed at a rate that is a multiple of the load drawn signal frequency) and or phase (for example, aligned to the zero crossing point of the load drawn signal or the line voltage). Additionally or alternatively modulation may comprise sub-harmonic modulation where at least one characteristic of the reference input signal is different during different cycles of the load drawn current signal. The processing apparatus may be operative to process and if required store information from different cycles of the load drawn current signal to extract information from the modulation. Furthermore the processing apparatus may comprise a demodulator which is operative to separate the signal acquired from the measurement arrangement into a first signal comprising the reference output signal and the load output signal and a second signal comprising the load output signal and substantially lacking the reference output signal. To aid modulation and demodulation it may be beneficial for the signal source and signal acquisition circuitry to be synchronous. In addition to the first and second signals having a difference in reference signal content, they may contain largely the same spectral content as the load output signal although with different phase relationships because they are demodulated through the same chain. After alignment and/or equalisation the processing apparatus may then be operative to subtract the second signal from the first signal to thereby obtain the reference output signal. The processing apparatus may be operative to only use part of the information available, for example in a particular relative time or phase of the load drawn current signal. The processing apparatus may be operative to filter or discard values that are deemed by operation of the processing apparatus to be outside a normal operation range, to handle spurious noise or to handle changing load conditions. The present embodiment offers the advantage over the previously described embodiments of relying on one measurement arrangement. The present embodiment therefore offers the prospect of lower power consumption and lower cost than the previously described embodiments.

The processing apparatus may be configured to subtract the load output signal from the measured signal to thereby extract the reference output signal. Thereafter the current measurement apparatus may be operative as described elsewhere to determine the load drawn current signal, e.g. by determining a factor corresponding to a change in the transfer function of the measurement arrangement. Subtraction of the load output signal may degrade the signal to noise ratio because of the random noise floor of the processing electronics, e.g. by 3 dB in embodiments where the noise contribution by the first measurement arrangement processing chain is the same as the noise contribution by the second measurement arrangement processing chain. The current measurement apparatus may therefore be operative to subtract the load output signal when the load output signal is more than a predetermined amount, such as 3 dB, above the noise floor. The current measurement apparatus may be operative to determine whether or not the load output signal is more than a predetermined amount above the noise floor and to selectively subtract the load output signal in dependence on the determination. Where there is no subtraction of the load output signal, the current measurement apparatus may employ previously described approaches to separation of the reference output signal, such as the FFT approach, instead of the present subtraction approach. In addition the processing apparatus may be configured to combine, by addition, signals acquired by way of the first and second measurement arrangements. The signals may be combined in respect of signal energy outside the reference output signal. Combining the signals in this fashion may improve the signal to noise ratio for frequencies other than frequencies of the reference input signal to thereby provide for improved load drawn current measurement. The presently described embodiments involving subtraction may be applied in configurations comprising multiple phases. More specifically the previously described approach of estimating the content of each of the multiple phases on the neutral may be applied in such configurations.

The processing apparatus may be configured to provide for equalisation of a first signal comprising the reference output signal and the load output signal with a second signal comprising the load output signal absent the reference output signal. Equalisation may be in respect of at least one of amplitude and phase. For example the processing apparatus may be configured to perform an FFT on each of the first and second signals and to effect equalisation in dependence on analysis of the transformations. More specifically the processing apparatus may be operative to identify at least one largest element in the frequency domain. For example where the current measurement apparatus is operative to measure mains at 50 Hz, the largest element in the frequency domain may be found at 50 Hz. The processing apparatus may then be operative to equalise the first and second signals with respect to their power in the frequency domain at 50 Hz. The processing apparatus may be operative to analyse elements at least one of less than and greater than an identified element in the frequency domain and in dependence on the relative power at such elements determine whether or not equalisation is required and if so an extent of equalisation required. The analysis for equalization and the resulting transformation may take into account magnitude and phase information of each signal. By way of further example the processing apparatus may be configured to perform at least one analysis in the time domain, such as peak detect, RMS, average and counts over a threshold. For example the processing apparatus may be configured to perform a peak detect on each of the two acquired signals and to effect equalisation in dependence on the peak detections. Equalisation may be applied in each of the embodiments described above. Where current measurement by the current measurement apparatus involves at least one inductive component, such as a current transformer, equalisation is liable to be more involved than if current measurement is performed by way of a substantially resistive component, such as a shunt resistor.

The current measurement apparatus may be constituted such that the signal source is always present with the measurement arrangement and the processing apparatus. For example the signal source, the measurement arrangement and the processing apparatus may be permanently in situ. According to another approach the current measurement apparatus may be constituted such that the signal source is separable from the measurement arrangement and the processing apparatus. More specifically the signal source may be comprised in a first unit and the measurement arrangement and the processing apparatus may be comprised in a second unit. The first unit may be configured to be portable, such as hand portable. The second unit may be permanently in situ. The first unit may be brought into use, for example by a calibration engineer, as the need arises. The current apparatus may additionally include a connection to allow one of the reference input signal, the circuit operative to set the reference input signal or the acquisition circuit, amongst other parts of the current measurement apparatus, to be checked against an external known reference to determine the installed accuracy of the apparatus. For example the current measurement apparatus may have a means by which the reference input signal is measured by externally attached test equipment.

Where a load draws current from a multi-phase mains electricity supply according to a second aspect of the present invention there may be provided current measuring apparatus comprising plural current measurement apparatus according to the first aspect of the present invention, each of the plural current measurement apparatus being configured to measure current in a different one of the plural live wires of the electrical supply. For example the multi-phase mains electricity supply may be a split-phase supply, a three phase supply or even a supply with more than three phases. Embodiments of the second aspect of the invention may comprise one or more features of the first aspect of the invention.

Measurement of power consumption may depend on measurement of current in the live wires of each phase. Each current measurement apparatus may therefore comprise line voltage measuring apparatus and a multiplier arrangement as described above, whereby each current measurement apparatus may be operative to determine an instantaneous power value for each of the phases. The current measuring apparatus may also comprise adding apparatus which is operative to add outputs from each of the plural current measurement apparatus to thereby provide a summed instantaneous power consumption value. The summed instantaneous power consumption value may be used for consumption monitoring purposes. The current measuring apparatus may further comprise a real time clock and may be operative upon summed instantaneous power consumption values in dependence on an output from the real time clock to provide an energy usage value. The current measuring apparatus may further comprise at least one galvanic isolator to maintain isolation between or amongst the supply conductors. The number of galvanic isolators required may depend on where the adding apparatus is disposed in the current measuring apparatus. For example and where the adding apparatus is constituted as a circuit element apart from all the current measurement apparatus a circuit path between each current measurement apparatus and the adding apparatus may comprise a galvanic isolator. Alternatively and where the adding apparatus is comprised in one of the current measurement apparatus a circuit path between each of the other current measurement apparatus may comprise a galvanic isolator.

In addition where there are multiple legs of a given phase each with current measurement, for example in the distribution box of a multiple dwelling unit, one line voltage measurement apparatus may be used with multiple current measurement apparatus, such that the power calculated for each leg is based on the common voltage measurement multiplied by the unique leg current measurement.

The current measuring apparatus may further comprise a further current measurement apparatus configured to measure current flowing in a neutral wire of the multi-phase supply. Measurement of the return current flowing in the neutral wire may provide for tamper detection by providing for comparison of the sum of currents flowing in the live wires with current flowing in the neutral wire. The current measuring apparatus may therefore comprise adding apparatus and comparison apparatus, the adding apparatus being operative to add measured current from the plural current measurement apparatus and the comparison apparatus being operative to compare an output from the adding apparatus with measured current from the further (neutral wire) current measurement apparatus. Furthermore the current measuring apparatus may be configured to make a determination with regards to tampering in dependence on an output from the comparison apparatus. The current measuring apparatus may further comprise at least one galvanic isolator of a form and function as described above and disposed so as to maintain isolation amongst the current measurement apparatus. Further embodiments of the second aspect of the present invention may comprise one or more features of the first aspect of the present invention.

According to a third aspect of the present invention there is provided a current measurement method comprising: applying a reference input signal by way of a signal source to a measurement arrangement disposed in relation to a load which draws a current signal, the measurement arrangement being operative when so disposed to measure the load drawn current signal; receiving an output signal from the measurement arrangement in processing apparatus, the output signal comprising a load output signal corresponding to the load drawn current signal and a reference output signal corresponding to the reference input signal; and making a determination in processing apparatus in dependence on the reference output signal and the load output signal, the determination being in respect of at least one of the load drawn current signal and electrical power consumed by the load.

Embodiments of the third aspect of the present invention may comprise one or more features of the first or second aspect of the present invention.

According to a fourth aspect of the present invention there is provided electrical apparatus comprising current measurement apparatus according to the first aspect of the present invention or current measuring apparatus according to the second aspect, the electrical apparatus being configured such that the current measurement apparatus or current measuring apparatus measures current passing through a part of the electrical apparatus.

Alternatively or in addition the electrical apparatus may comprise electricity generation, transmission or distribution apparatus. The electrical apparatus may, for example, be constituted by an electricity meter or a distribution box with the current measurement apparatus being operative to measure current passing through the electricity meter or distribution box. The current measurement apparatus may thereby provide a means to measure the electricity consumed by a residence, business or electrically powered device or generated by generation apparatus, such as a solar panel based generator. Alternatively or in addition the electrical apparatus may comprise electrical propulsion apparatus comprising an electrical energy storage or generation device, such as a battery or fuel cell. The electrical propulsion apparatus may be configured such that the current measurement apparatus is operative to provide for regulation, e.g. by measurement of direct current, of at least one of: power sourced by the electrical energy storage or generation device; and power sunk by the electrical energy storage device, e.g. during charging. Safe and reliable delivery of electrical power to electric motors at high current levels is normally required of such electrical propulsion apparatus. Accurate current measurement may therefore be required to provide for proper regulation and control and to monitor for fault conditions. Alternatively or in addition the electrical apparatus may comprise electrical control apparatus comprising an electrical actuator. The electrical control apparatus may be configured such that the current measurement apparatus is operative to measure current drawn by the electrical actuator. The electrical actuator may comprise a motor and the current metrology apparatus may be comprised in a motor controller which is operative to control the motor. Electrical control apparatus may be used in diverse fields, such as manufacturing, commercial machinery and process control. For example the electrical actuator may comprise a stepper motor forming part of a CNC machine or driving a valve in a fluid control system. Alternatively the electrical actuator may comprise a linear solenoid in an electrically controlled automotive transmission system. In such applications accurate measurement of current may provide for precision of control. Further embodiments of the fourth aspect of the present invention may comprise one or more features of any previous aspect of the present invention.

According to a yet further aspect of the present invention there is therefore provided current measurement apparatus comprising: a measurement arrangement configured to be disposed in relation to a load which draws a current signal, the measurement arrangement being operative when so disposed to measure the load drawn current signal; and a signal source operative to apply a reference input signal to the measurement arrangement whereby an output signal from the measurement arrangement comprises a load output signal corresponding to the load drawn current signal and a reference output signal corresponding to the reference input signal. Embodiments of the yet further aspect of the present invention may comprise one or more further features of any other aspect of the present invention.

BRIEF DESCRIPTION OF DRAWINGS

Further features and advantages of the present invention will become apparent from the following specific description, which is given by way of example only and with reference to the accompanying drawings, in which:

FIG. 6 is a block diagram representation of measuring apparatus for a three phase electricity supply;

FIG. 10 shows current measurement apparatus comprising a reference signal reference circuit;

DESCRIPTION OF EMBODIMENTS

Figure 1A:
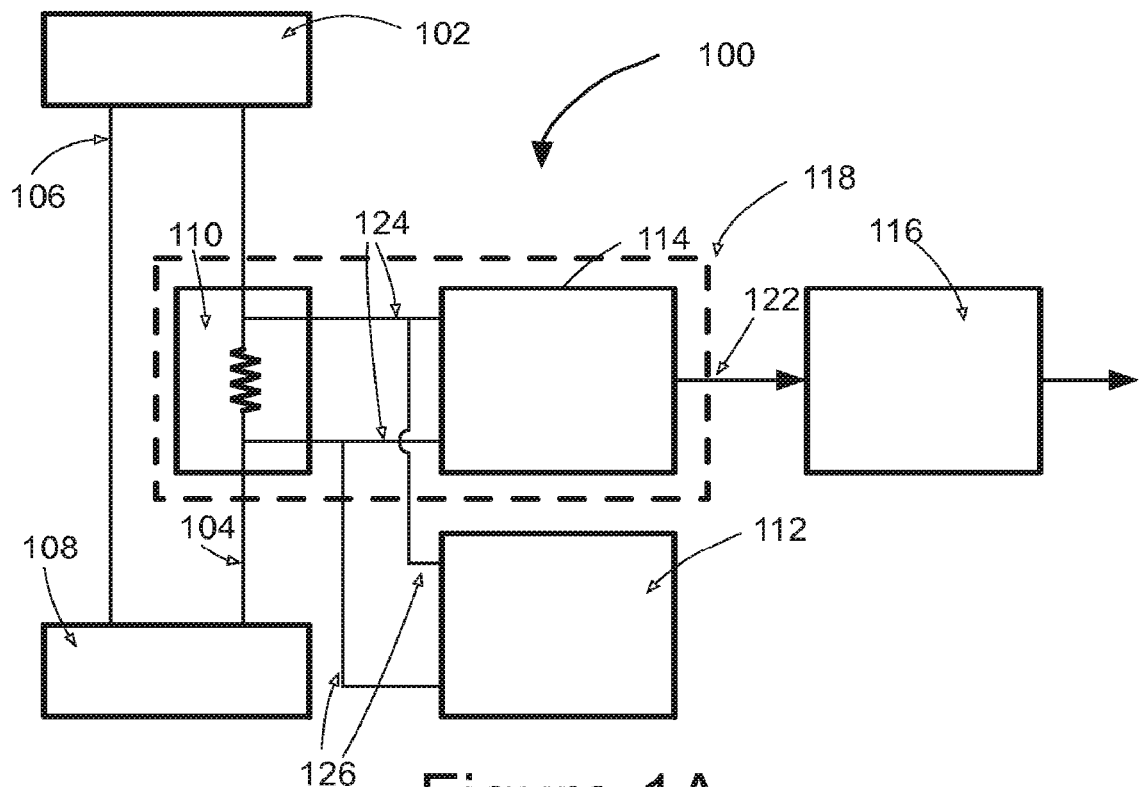
FIG. 1A is a block diagram representation of a first embodiment of current measurement apparatus according to the present invention having a first form of electrical connection to a shunt resistor.

A first embodiment of current measurement apparatus 100 having a first form of electrical connection to a shunt resistor is shown in FIG. 1A. The current measurement apparatus 100 forms part of an electricity consumption meter (not shown) installed at a point of supply to residential or business premises. A single phase mains alternating current electricity source 102 with live 104 and neutral 106 supply wires are shown in FIG. 1A. Energy consuming apparatus at the residential or business premises is represented by a load 108. The current measurement apparatus 100 comprises a shunt resistor 110 (which constitutes a current sensor) in the live supply wire 104 in series with the load 108 between the load and the electricity supply 102. The shunt resistor 110 presents a low value of resistance, such as a resistance of 1 mΩ. The shunt resistor 110 is formed from a length of electrical wire, a length of conductive track on a printed circuit board, a discrete component, a conductor comprised in an integrated circuit package such as a lead frame or a structure formed as part of a connector or conductive element of a series component such as a relay. As will become apparent from the following description the shunt resistor need not be formed to provide an accurate or stable resistance; nor need the processing chain for the shunt resistor be accurately characterised. The current measurement apparatus 100 further comprises a signal source 112, voltage measuring apparatus 114 and signal processing circuitry 116. The shunt resistor 110 and the voltage measuring apparatus 114 constitute a measurement arrangement 118 and the signal processing circuitry 116 constitutes processing apparatus. Although not shown in FIG. 1A the current measurement apparatus comprises a noise filter at the input of the voltage measuring apparatus 114 to suppress undesirable noise signals, such as impulse signals, which might otherwise be liable to disrupt operation of the current measurement apparatus. The voltage measuring apparatus 114 is connected to opposing ends of the shunt resistor 110 by a first pair of wires 124. The signal source 112 is electrically connected to opposing ends of the shunt resistor 110 by a second pair of wires 126, which are physically connected to a respective one of the first pair of wires 124 at locations spaced along the first pair of wires such that the first and second pairs of wires share a conduction path. This configuration of the two pairs of wires 124, 126 is appropriate where the parasitic impedance of the shared conduction path has no adverse effect on the operation of the reference input signal applied by the signal source 112 to the shunt resistor 110. In one form the current measurement apparatus 100 is constituted such that the signal source 112 is always present with the rest of the current measurement apparatus 100 such that the signal source and the rest of the current measurement apparatus 100 is permanently in situ. In another form the current measurement apparatus 100 is constituted such that the signal source is comprised in a separate unit from the rest of the current measurement apparatus 100, which is permanently in situ. When it is desired to provide for accurate measurement, e.g. as part of a periodic calibration procedure, the unit comprising the signal source 112 is brought into use, for example by a calibration engineer, and connected across the shunt resistor 110 before calibration begins. Calibration is described further below.

Operation of the current measurement apparatus 100 of FIG. 1A will now be described. As a current signal is drawn by the load 108 through the shunt resistor 110 the signal source 112 is operative on an intermittent basis to apply a reference input signal to the shunt resistor 110 such that a reference current signal passes through the shunt resistor 110. The reference input signal has a known frequency or phase profile, which is substantially absent from the load drawn current signal. For example the reference input signal may consist of at is least one component of frequency higher than the mains frequency, such as components of a frequency greater than 5 kHz where the mains has a dominant frequency component of 50 Hz such that the reference signal frequency components lie outside a band of the mains frequency. In certain forms of the apparatus of FIG. 1A the signal processing circuitry 116 is operative to monitor the output from the voltage measuring apparatus 114 when no reference input signal is applied to the shunt resistor 110 and to determine a frequency or phase profile which is substantially absent from the output and to control the signal source 112 such that the reference input signal comprises the determined frequency or phase profile. Where a presently used frequency or phase profile is determined by the signal processing circuitry 116 to now be unsuitable, the signal processing circuitry 116 is operative to change from the presently used frequency or phase profile to a different frequency or phase profile. For example the signal processing circuitry 116 is operative to change from 100 Hz to 83 Hz when it is determined that the load drawn current signal is now contaminated with 100 Hz noise. The voltage measuring apparatus 114 is operative to acquire by way of sample-and-hold and analogue to digital conversion circuitry a voltage signal developed across the shunt resistor 110 by the load drawn current and reference input signals and to generate a corresponding acquired voltage signal 122. The acquired voltage signal 122 comprises a reference output signal corresponding to the reference input signal and a load output signal corresponding to the load drawn current signal. The signal processing circuitry 116 is operative to extract the reference output signal from the acquired voltage signal 122. Extraction is achieved by applying a frequency transformation, such as in accordance with a Fast Fourier Transform (FFT) algorithm, to the acquired voltage signal 122 or by filtering the acquired voltage signal 122 on the basis of the different frequency profiles of the reference output signal and the load output signal. An extent to which harmonics of a transformed signal need to be taken into account depends on the profile of the signal's power spectrum in the frequency domain and the accuracy to which the load drawn current signal is to be measured. Then the signal processing circuitry 116 is operative to determine a transfer function, e.g. complex impedance, for the shunt resistor 110 and the voltage measuring apparatus 114 in dependence on the reference input signal and the extracted reference output signal. The current measurement apparatus 100 stores the determined transfer function. Thereafter the signal processing circuitry 116 is operative to determine the load drawn current signal in dependence on the stored transfer function and the load output signal. More specifically the reference output signal is subtracted from the acquired voltage signal 122 to determine the load output signal. Alternatively and where the reference input signal is sufficiently low as a proportion of the load drawn current signal, e.g. 0.02% where an accuracy of ±0.2% is desired, the load drawn current signal is determined in dependence on the transfer function and the acquired voltage signal 122, i.e. such that there is no subtraction of the reference output signal. According to another approach the signal processing circuitry 116 is operative to store an initial reference output signal and thereafter the current measurement apparatus 100 is operative to determine a subsequent reference output signal. If the transfer function of the shunt resistor 110 and the voltage measuring apparatus has changed the subsequent reference output signal will have changed in a corresponding fashion. The signal processing circuitry 116 is therefore operative to determine a difference between the initial and subsequent reference output signals and to determine a factor in dependence on the difference. The signal processing circuitry 116 thereafter applies the factor to the load output signal to compensate for the change in the transfer function of the shunt resistor.

The signal source 112 is operative to apply the reference input signal to the shunt resistor 110 on an intermittent basis to maintain a desired accuracy of measurement. Application of the reference input signal may be regular, e.g. once per hour, day or month, where the transfer function has an anticipated rate of drift such as might be caused by the effects of electromigration on the shunt resistor. Alternatively or in addition the application of the reference input signal is irregular and in dependence on a change which is liable to cause drift, such as might be caused by a change in temperature. Configuration of the current measurement apparatus 100 to address the effects of temperature drift is described below. Between applications of the reference input signal the voltage measuring apparatus 114 is operative to determine the load drawn current signal in dependence on the transfer function or factor and the acquired voltage signal 122, which corresponds to the load drawn current signal in view of the lack of application of the reference input signal to the shunt resistor 110. In forms of the present embodiment the signal source 112 is configured such that the reference input signal comprises at least one of: a frequency that changes over time, e.g. changes progressively between a first value and a second value; different frequencies at any one time; and frequency components which are out of phase with each other. Having frequency components which are out of phase is advantageous: with regards to the ease with which the reference output signal is extracted from the acquired voltage signal 122; and where addressing a frequency dependency of the shunt resistor 110. Where a frequency dependency of the shunt resistor 110, such as self inductance, is being addressed, a reference input signal comprising at least one of a frequency that changes over time and different frequencies at any one time is applied to the shunt resistor 110. The signal processing circuitry 116 is then operative to determine and store a transfer function of the shunt resistor 110 and the voltage measuring apparatus over a range of frequencies in dependence on the reference input signal comprising at least one of: a frequency that changes over time; and different frequencies at any one time. These steps are carried out during a calibration phase. Alternatively or in addition these steps are carried out on a periodic basis during operation of the current measurement apparatus. The signal source is also configured to change the amplitude of the reference input signal. Changing the amplitude of the reference input signal is advantageous where the load drawn current signal changes between large and small values to achieve a compromise between measurement accuracy and power consumption.

As is described above the transfer function or a factor based on the transfer function and thereafter the load drawn current signal are determined to a desired accuracy by relying on the reference input signal. The present invention is operative to characterise the measurement arrangement (i.e. the shunt resistor 110 and the voltage measuring apparatus 114 as indicated by the dashed box around these components in FIGS. 1A and 1B) by way of the transfer function or the factor. Having determined the load drawn current signal the current measurement apparatus 100 is operative to multiply the instantaneous supply current and line voltage to determine the instantaneous power consumption, which is then integrated against time to provide the energy used. The measurement of line voltage is described further below. Different approaches to relying on the reference input signal to provide for measurement to a desired accuracy are described below.

Figure 1B:
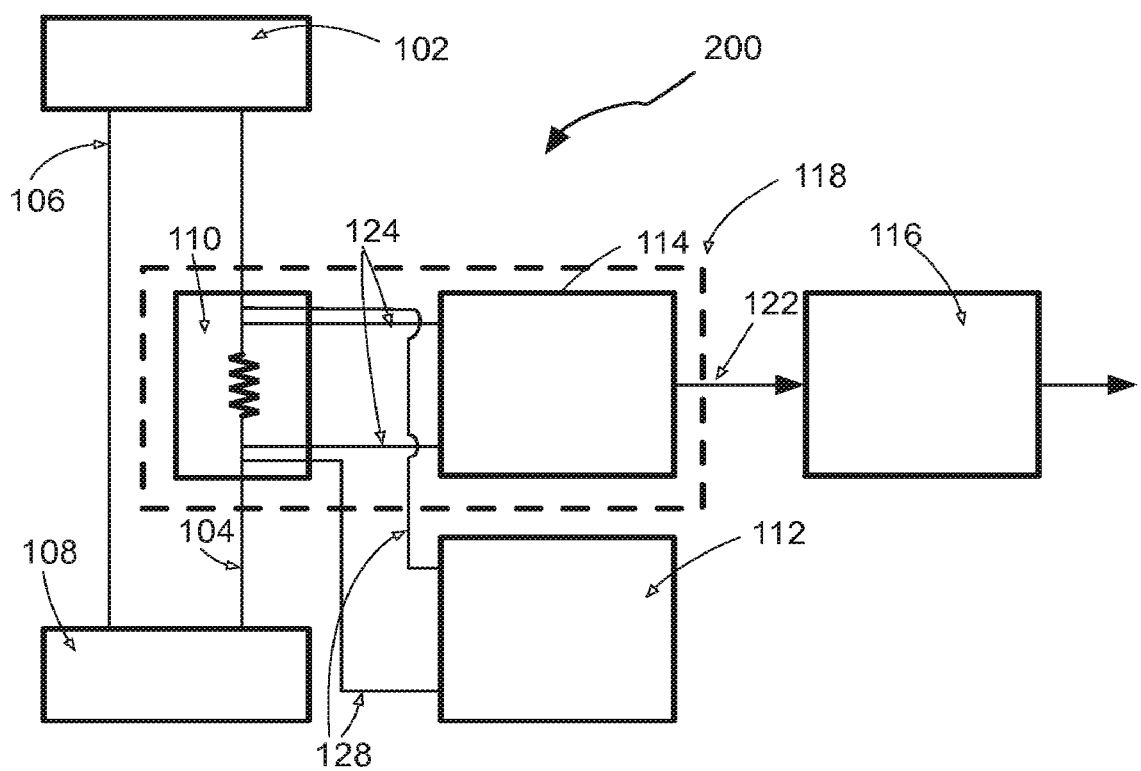
FIG. 1B is a block diagram representation of a second embodiment of current measurement apparatus having a second form of electrical connection to the shunt resistor.

A second embodiment of current measurement apparatus 200 having a second form of electrical connection to the shunt resistor is shown in FIG. 1B. Features in common with the current measurement apparatus 100 of FIG. 1A are indicated by the same reference numerals and the reader's attention is directed to the description provided above with reference to FIG. 1A for a description of the form and function of such common features. A first pair of wires 124 from the voltage measuring apparatus 114 is as per FIG. 1A. A second pair of wires 128 from the signal source 112 establishes an electrical connection by direct connection to opposing ends of the shunt resistor 110 whereby the first and second pairs of wires constitute separate conduction paths between the shunt resistor 110 and each of the voltage measuring apparatus 114 and the signal source 112. The arrangement of FIG. 1B is appropriate where the conduction path between the resistor shunt 110 and the voltage measuring apparatus 114 has parasitic impedance that would have a contrary effect on operation of the reference input signal. For example if a parasitic resistance of the conduction path between the resistor shunt 110 and the voltage measuring apparatus 114 were sufficiently high in relation to the resistance of the shunt resistor the transfer function may be inaccurately determined with there being a consequential adverse effect on accuracy of current measurement.

The current measurement apparatus 100, 200 of FIGS. 1A and 1B can be used in applications other than the measurement of current in mains electricity consumption meters. According to such other applications the shunt resistance 110 is present in a current carrying wire in series between a first node and a second node, with one of components 102 and 108 representing a voltage source, such as an electricity generator or energy storage device, and the other of components 102 and 108 representing an electrical load. Whichever of the components 102 and 108 represents the voltage source is immaterial to the capability of the current measurement apparatus to measure current passing through the shunt resistor 110 in either direction; this bidirectional metering capability is described further below with reference to FIG. 1C. In one application component 102 represents a dc power source and component 108 represents a load. According to this application the first current signal is a dc signal and the signal source 112 is configured such that the reference input signal applied to the shunt resistor 110 is a pulsed, modulated or alternating signal. In a second application component 102 represents an ac power source and component 108 represents a load. According to this second application the first current signal is an ac signal and the signal source 112 is configured such that the reference input signal applied to the shunt resistor 110 is substantially a dc signal. In each of the first and second applications the reference input signal has a different characteristic to the load drawn current signal which enables the signal processing circuitry 116 to extract the reference output signal whether the extraction is achieved by way of a filtering approach or a frequency transformation approach. Measurement of current according to these applications provides for one or more of several purposes, such as regulation or monitoring, in diverse apparatus, such as energy generation, transmission or distribution apparatus, renewable energy generators, electrical propulsion apparatus and control apparatus.

Figure 1C:
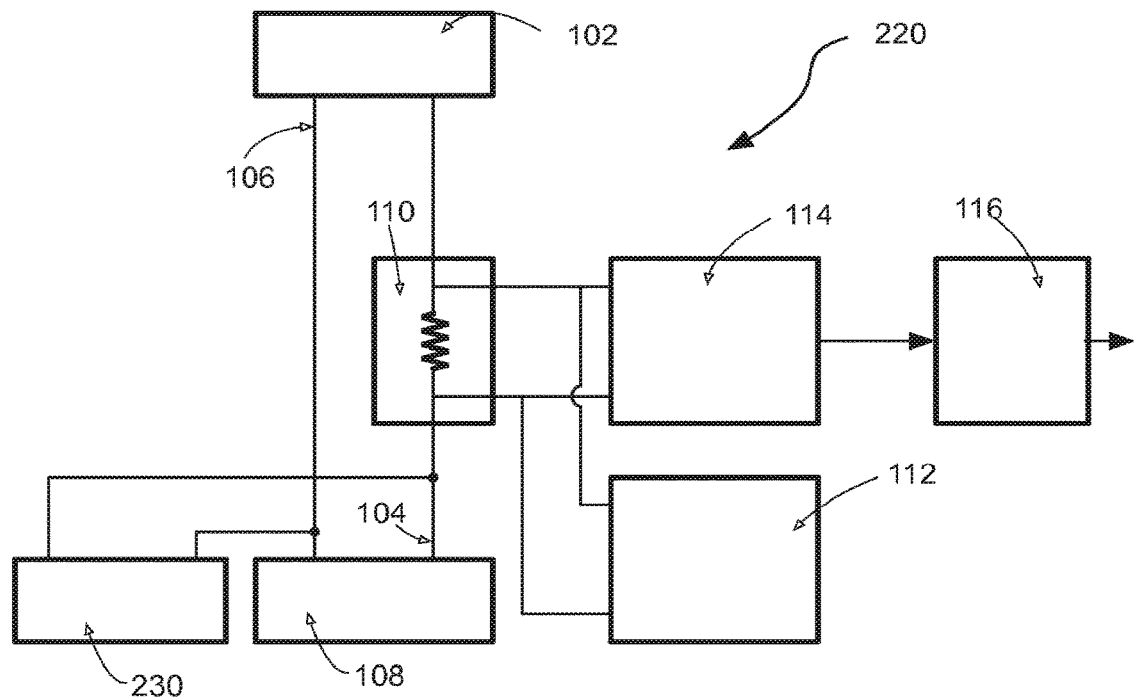

FIG. 1C illustrates bidirectional metering in block diagram form. Components of the current measurement apparatus 220 of FIG. 1C in common with FIG. 1A are designated with like reference numbers and the reader's attention is directed to the description provided above with reference to FIG. 1A for a description of such common components. The current measurement apparatus of FIG. 1C further comprises a generator 230, e.g. a renewable energy source such as an array of solar panels, which is located at the consumer's premises. When the generator 230 is operative to generate electricity, the load 108 draws less electricity from the mains electricity supply 102. In such circumstances the current passing through the shunt resistor 110 is the sum of the load drawn current, the reference input current and the negative of the current from the generator. At the time of acquisition of a voltage signal developed across the shunt resistor 110 the acquired sample is proportional to the sum of the currents. The demand from the load 108 may cease or drop to the extent that the generator 230 is generating electricity that is surplus to the load's requirements. Here the mains electricity supply is configured to receive the surplus electricity for onward transmission to the grid. Therefore the sum of the currents is negative with the current measurement apparatus 220 being operative to measure the surplus electricity received by the mains electricity supply 102.

Figure 2:
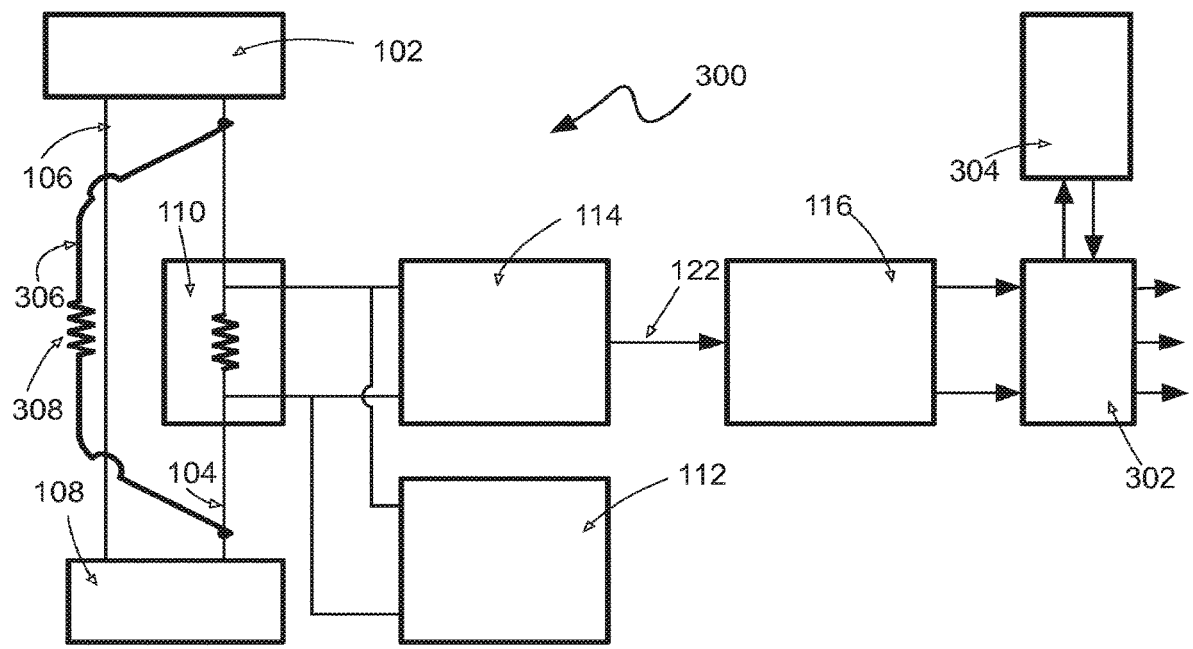
FIG. 2 is a block diagram representation of a third embodiment of current measurement apparatus configured to provide for tamper and fault detection.

A third embodiment of current measurement apparatus 300 configured to provide for at least one of tamper and fault detection is shown in FIG. 2. Features in common with the current measurement apparatus 100 of FIG. 1A are indicated by the same reference numerals and the reader's attention is directed to the description provided above with reference to FIG. 1A for a description of the form and function of such common features. Features particular to the third embodiment will now be identified and the function of the third embodiment with respect to these particular features will be described subsequently. The current measurement apparatus 300 of FIG. 2 further comprises a Central Processing Unit (CPU) 302 and a data store 304, such as volatile or non volatile electronic memory. The CPU 302 and data store 304 are of well known form. During the course of operation of the current measurement apparatus 300 the data store 304 is operative to store each transfer function or factor determined following operation of the signal source 112; each transfer function or factor is stored with a time and date stamp provided by a real time clock (not shown). The CPU 302 is operative to analyse stored transfer function or factor data to determine a rate of change of the transfer function or factor with time and to determine a transfer function or factor profile over time. A tamper wire 306 is shown connected across the shunt resistor 110. The tamper wire 306 has been installed across the live in and live out of an electricity consumption meter by an electricity consumer to cause under-recording of current consumption to the consumer's financial advantage. The tamper wire has a distributed resistance, which is represented in FIG. 2 by an equivalent resistance 308. The distributed resistance is lower than the shunt resistance. The distributed resistance of the tamper wire 306 therefore lowers the resistance seen and therefore determined by the voltage measuring apparatus 114. A lower resistance develops a smaller potential drop which when divided in accordance with Ohm's law by the nominal impedance of the shunt resistor 110 provides a lower measured current. Determination of the actual impedance by application of the reference input signal, as described above, addresses the effect of the tamper on measurement accuracy. Furthermore analysis of the stored impedance values provides for tamper detection. More specifically a sudden, large change in measured impedance is indicative of tampering. Such a change in impedance is determined by comparing a currently acquired impedance value with an earlier acquired impedance value and if the difference is larger than a threshold value tampering is indicated. The threshold value is set to take account of impedance change for other reasons, e.g. degeneration of the shunt resistor over time or temperature drift. In addition the CPU 302 is operative to compare impedance values acquired before and after a disconnect event and to analyse other usage information to corroborate a likely tampering event. One example of such analysis involves determining whether or not the measured average power consumption (determined as described below on the basis of line voltage measurement) has also changed when other characteristics such as the frequency or phase content of the load drawn current have remained substantially unchanged. Analysis of the stored impedance values also provides for fault detection. Failure of the shunt resistor for reasons other than tampering may cause a relatively sharp increase or decrease in impedance which is reflected in determined impedance values. For example and where the like of a current transformer is used as the current sensor the characteristics of the current transformer may change after a high current surge event. Impending failure of the shunt resistor may be reflected in a characteristic impedance profile over time, such as a progressive increase in a rate of increase or decrease in impedance. For example corrosion on the terminals of the shunt resistor 110 may give rise to a drift in one direction over time and/or average power dissipated with the drift being independent of other effects such as ambient temperature. The CPU 302 is operative to analyse such impedance data and make a determination with regards to failure or impending failure on the basis of the analysis.

In an un-illustrated embodiment which is based on the apparatus of FIG. 2 there is no use made of the transfer function in improving upon measurement accuracy. Instead a metered quantity, such as current or power consumption, is determined in accordance with the known approach and without taking a change in the transfer function into account and a characteristic of the transfer function, such as an extent of change, is used to provide diagnostic information which includes tamper indication, fault indication and the like. Such diagnostic information is displayed locally and communicated from the apparatus to a remote location such as by way of a LAN or WAN.

Figure 3A:
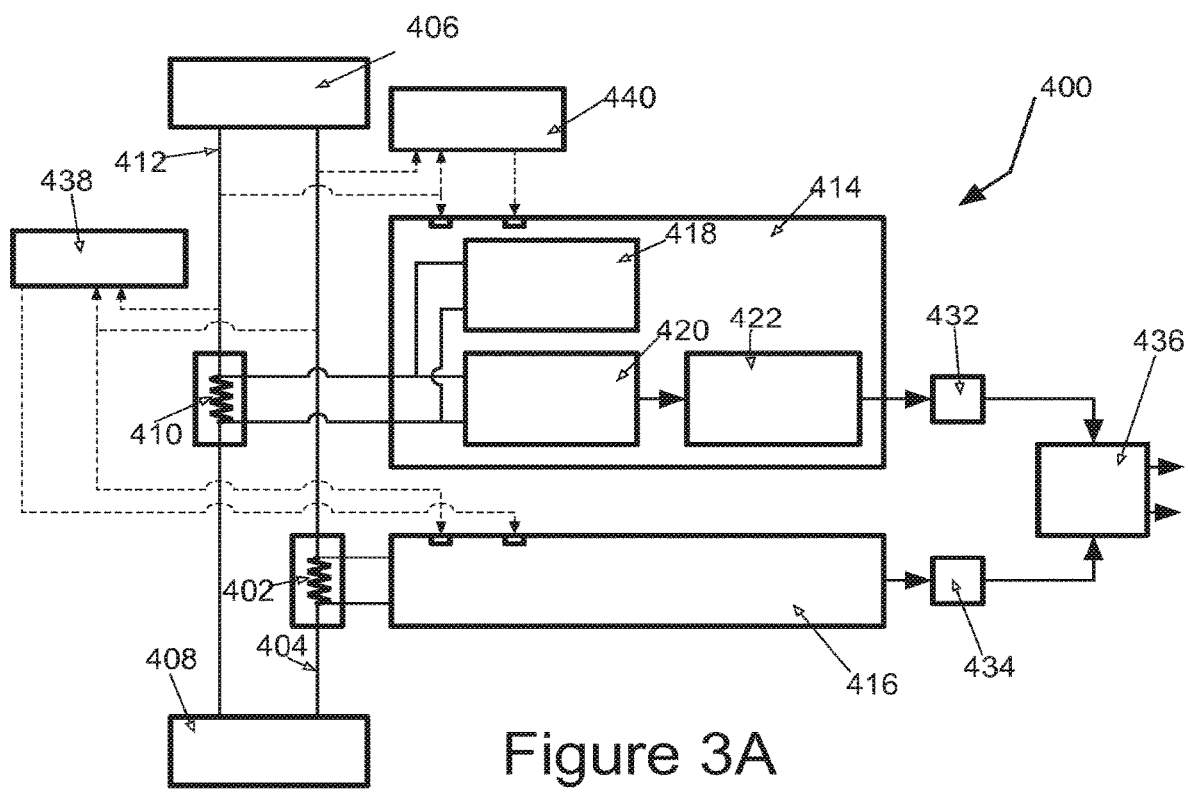
FIG. 3A is a block diagram representation of a fourth embodiment of current measurement apparatus configured to measure current in each of a live and neutral wire of an electricity supply.

Current measurement apparatus 400 according to a fourth embodiment which is configured to measure current in each of a live and neutral wire of an electricity supply is shown in FIG. 3A. The current measurement apparatus 400 comprises a first shunt resistor 402 in the live wire 404 between an ac power source 406 and a load 408 and a second shunt resistor 410 in the neutral wire 412 between the ac power source 406 and the load 408. The current measurement apparatus 400 further comprises a first unit 414 and second unit 416. The first unit 414 comprises a first signal source 418, first voltage measuring apparatus 420 and first signal processing circuitry 422. The second unit 416 comprises a second signal source, second voltage measuring apparatus and second signal processing circuitry. The signal source 418, voltage measuring apparatus 420 and signal processing circuitry 422 of each of the first and second units 414, 416 are configured and operative to determine the load drawn current signals drawn through a respective one of the live and neutral wires 404, 412. The form and function of each of the first and second units 414, 416 is the same as the current measurement apparatus described above with reference to FIG. 1A. The current measurement apparatus 400 of FIG. 3A further comprises a first galvanic isolator 432, a second galvanic isolator 434, a comparison circuit 436, a first power supply apparatus 438 and a second power supply apparatus 440. The first galvanic isolator 432 is present in a signal path between the first unit 414 and the comparison circuit 436 and the second galvanic isolator 434 is present in a signal path between the second unit 416 and the comparison circuit 436, whereby isolation between the live and neutral wires 404, 412 and between the first and second units 414, 416 is maintained. The first and second power supply apparatus 438, 440 are each configured to provide power to a respective one of the first and second units 414, 416. The first and second power supply apparatus 438, 440 draw power from the live and neutral wires 404, 412 on the ac power supply 406 side of the shunt resistors 402, 410 so as to avoid the current measurement apparatus measuring current drawn by the first and second power supply apparatus 438, 440. In accordance with known design practice, the first and second power supply apparatus 438, 440 provides for ac-dc conversion, rectification, regulation and whatever dc to dc conversion might be required by the first and second units 414, 416.

The operation of the current measurement apparatus 400 of FIG. 3A will now be described. The current measurement apparatus 400 is capable of detecting a tamper event involving a single bypass as described above with reference to FIG. 2, a tamper event involving swapping the live and neutral wires from the electricity supply and a tamper event involving a double bypass where both live and neutral current measurements are bypassed. Each of the first and second units 414, 416 is operative to determine a transfer function of a respective one of the first and second shunt resistors 402, 410 and their processing chains and a respective load drawn current signal passing through the live and neutral wires 404, 412. Operation of each of the first and second units 414, 416 in this respect is described further above with reference to FIG. 1A such that a change in transfer function of one or other of the first and second shunt resistors 402, 410 and their processing chains is indicative of single bypass tamper event. A tamper event involving swapping the live and neutral wires does not avoid current measurement because current measurement is present in both the live and neutral wires. The current measurement apparatus 400 is further configured such that the comparison circuit 436 is operative to compare the determined load drawn current signals or transfer functions. A difference between the two load drawn current signals above a threshold value or a characteristic change in the transfer functions indicates that one of the live and neutral wires 404, 412 has been tampered with. The current measurement apparatus is also operative to analyse the transfer functions determined for the first and second shunt resistors 402, 410 and their processing chains. This approach is advantageous because the two amounts of current bypassed in a double bypass tamper could be much the same thereby rendering ineffective the known approach of detecting a tamper on the basis of a difference between the live and neutral current signals. Analysis of the transfer function in respect of each of the first and second shunt resistors 402, 410 comprises determining a rate of change over time to detect a sudden change of transfer function that is indicative of tampering. A sudden change of transfer function in respect of both the first and second shunt resistors 402, 410 is indicative of tampering with both live and neutral wires 404, 412. Despite there being tampering an estimate of power consumption can nevertheless still be determined. More specifically the tamper caused change in impedance from the nominal impedance is applied to the measured load current to provide an estimated actual load current which with measured line voltage provides estimated power consumption. The current measurement apparatus is also operative to analyse transfer function data for the purpose of fault detection. As further described above fault detection involves detecting a relatively sharp change in transfer function. Impending failure of the shunt resistor is detected by determining a characteristic transfer function profile over time, such as a progressive increase in a rate of increase or decrease in impedance.

Figure 3B:
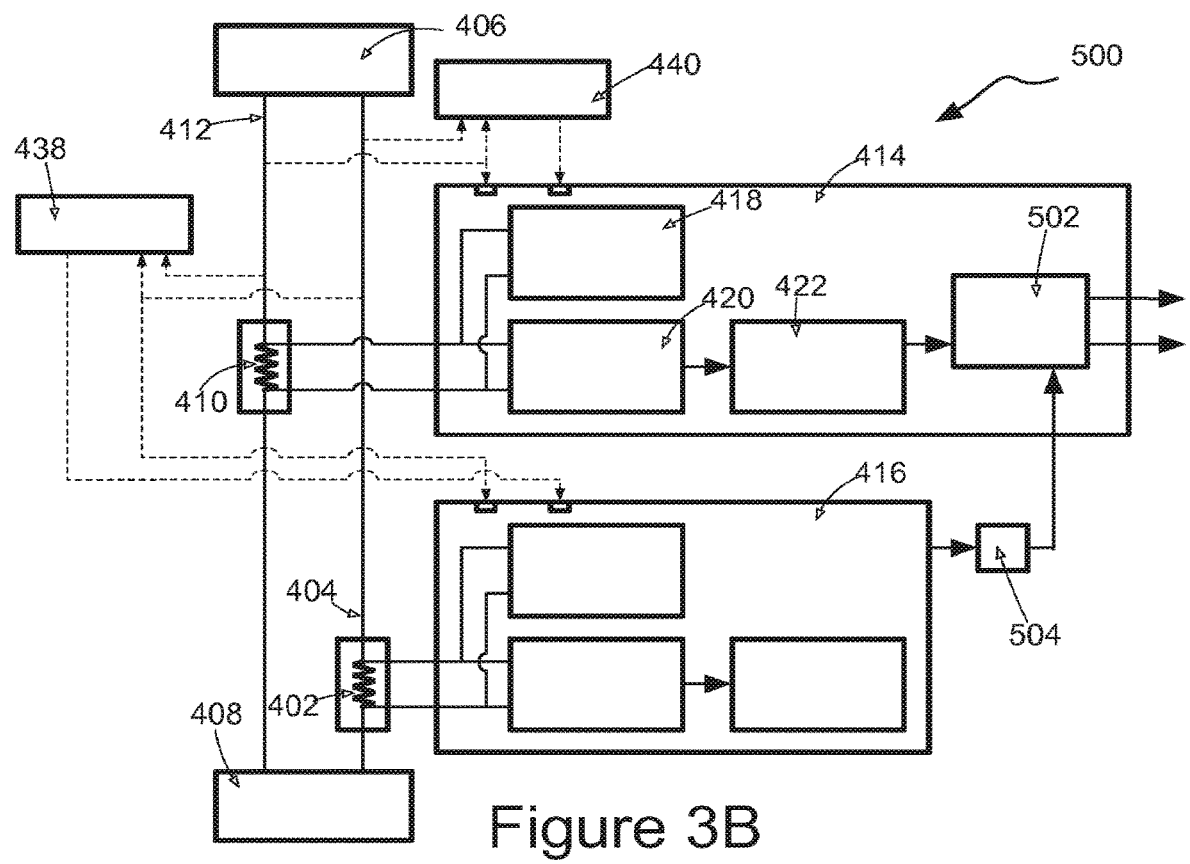
FIG. 3B is a block diagram representation of a fifth embodiment of current measurement apparatus configured to measure current in each of a live and neutral wire of an electricity supply.

A fifth embodiment of current measurement apparatus 500 configured to measure current in a live and neutral wire of an electricity supply is shown in FIG. 3B. Features in common with the current measurement apparatus 400 of FIG. 3A are indicated by the same reference numerals and the reader's attention is directed to the description provided above with reference to FIG. 3A for a description of the form and function of such common features. Features particular to the embodiment of FIG. 3B will now be identified and their operation described. The embodiment of FIG. 3B comprises a comparison circuit 502 and a galvanic isolator 504. The comparison circuit 502 forms part of the first unit 414, e.g. the comparison circuit 502 is formed on the same integrated circuit with there being a conduction path between the circuitry of the first unit and the comparison circuit. The galvanic isolator 504 is present in a signal path between the second unit 416 and the comparison circuit 502 to thereby maintain isolation between the first and second units 414, 416. Otherwise the form and function of the fifth embodiment is the same as the fourth embodiment. The configuration of the fifth embodiment may be changed such that the second unit 416 lacks signal processing circuitry and the outputs from the voltage measuring apparatus of each of the first and second units 414, 416 are received in and processed by the signal processing circuitry 422 of the first unit 416. In this configuration a galvanic isolator is present in the signal path between the voltage measuring apparatus of the second unit 416 and the signal processing circuitry 422 of the first unit 416 to thereby maintain isolation between the first and second units 414, 416.

Figure 4:
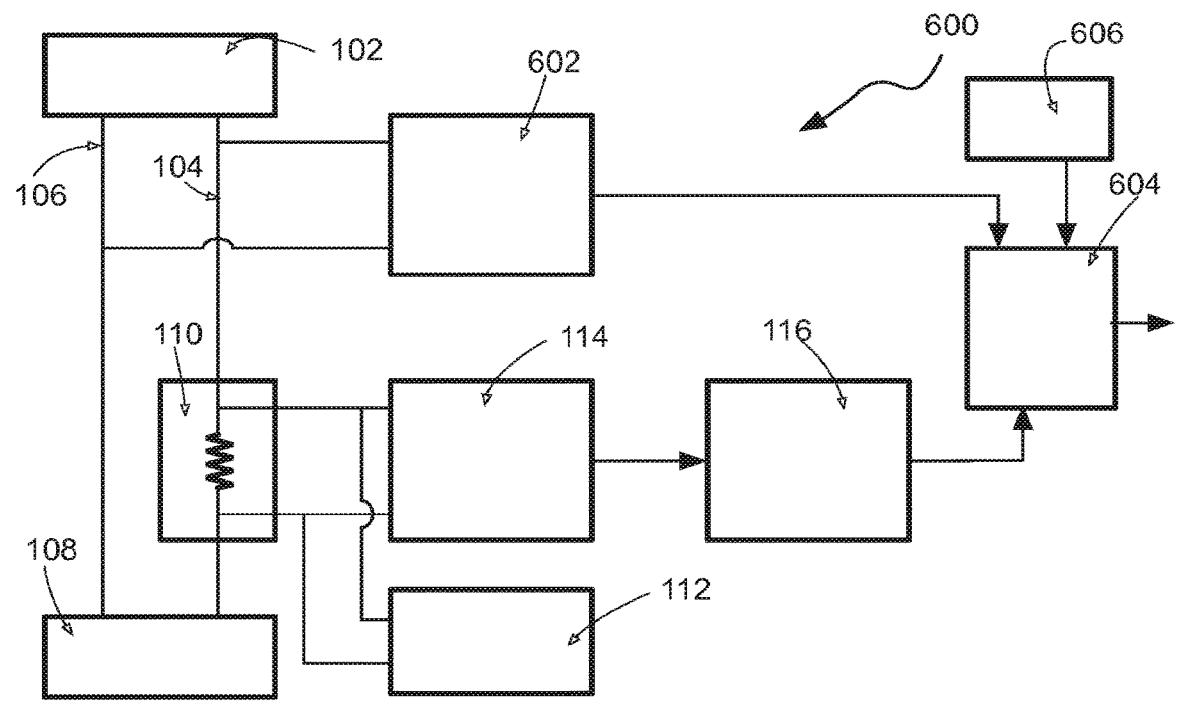
FIG. 4 is a block diagram representation of a sixth embodiment of current measurement apparatus comprising line voltage measuring apparatus.

A sixth embodiment of current measurement apparatus 600 comprising line voltage measuring apparatus is shown in FIG. 4. Features in common with the current measurement apparatus of FIG. 1A are indicated by the same reference numerals and the reader's attention is directed to the description provided above with reference to FIG. 1A for a description of the form and function of such common features. Features particular to the embodiment of FIG. 4 will now be identified and described. The current measurement apparatus 600 further comprises line voltage measuring apparatus 602, computational circuitry 604 and a real time clock 606. The line voltage measuring apparatus 602 is a known arrangement, such as a resistive divider, which is configured to measure voltage across the live and neutral conductors 104, 106. The computational circuitry 604 is constituted by a microprocessor or the like and is operative to receive line voltage measurements from the voltage measuring apparatus 602 and current measurements from the signal processing circuitry 116. The computational circuitry 604 is operative to determine instantaneous power by multiplication of voltage and current measurements. Energy used is determined by integrating instantaneous power consumption over time in dependence on an output from the real time clock 606. The computational circuitry 604 is further operative to generate relative phase characteristics of the load current measurement transfer function with respect to the line voltage measurement to provide for alignment of load current and line voltage measurement values to correctly estimate instantaneous power and to calculate power quality metrics such as active and reactive power and power factor.

Figure 5:
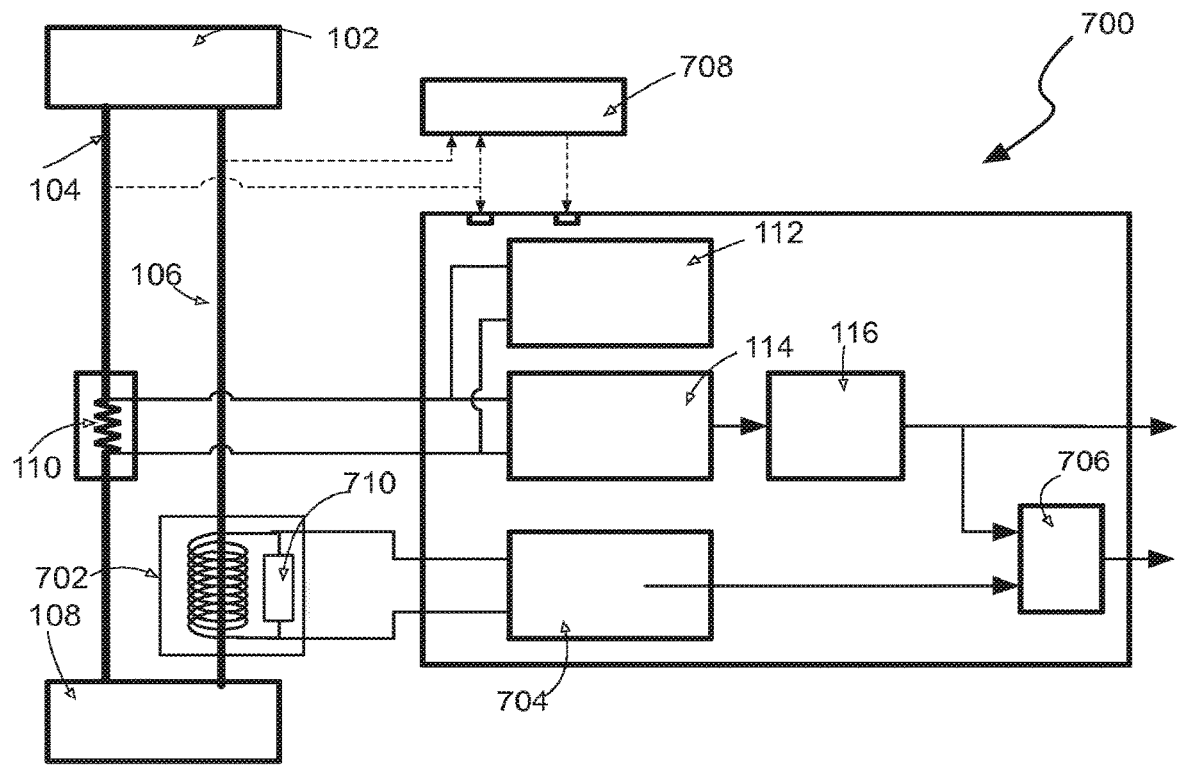
FIG. 5 is a block diagram representation of a seventh embodiment of current shunt measurement apparatus comprising a current transformer.

A seventh embodiment of current measurement apparatus 700 comprising a current transformer is shown in FIG. 5. A description of how the CT is calibrated so that the CT can be used for the purpose of accurate measurement is provided below. Features in common with the current measurement apparatus of FIG. 1A are indicated by the same reference numerals and the reader's attention is directed to the description provided above with reference to FIG. 1A for a description of the form and function of such common features. Features particular to the embodiment of FIG. 5 will now be identified and described. The current measurement apparatus 700 further comprises a current transformer 702, second voltage measuring apparatus 704, a comparison circuit 706 and power supply apparatus 708. A burden resistor 710 is electrically connected in parallel across the current transformer 702. The current transformer 702 is operative to measure current flowing in the neutral wire 106, with current induced in the current transformer 702 being developed across the burden resistor 710. The second voltage measuring apparatus 704 is operative acquire the voltage developed across the burden resistor 710 and to convert the acquired voltage into digital form, e.g. by analogue to digital conversion in accordance with known practice. The shunt resistor 110 present in the live wire 104 provides for accurate current measurement for power consumption determination purposes as is described above. The current transformer 702, on the other hand, provides for lower accuracy of current measurement with current being measured to within ±6% to ±10% of the actual current. The comparison circuit 706 is operative to compare the currents measured by the shunt resistor 110 and the current transformer 702 to determine if there is a sufficiently significant difference between the measured currents. As described above a significant difference between currents flowing in the live and neutral wires is indicative of tampering. In view of the normally significant difference in current level caused by tampering, current flowing in the neutral wire can be measured to lower accuracy. The power supply apparatus 708 is configured and is operative as described above to provide electrical power to the current measurement apparatus 700. In view of the inherently isolating nature of the current transformer 702 there is no need to provide for galvanic isolation between the second voltage measuring apparatus 704 and the comparison circuit 706.

Measuring apparatus 800 for a three phase electricity supply is shown in FIG. 6. A load 802 draws current from a three phase electricity supply 804 by way of first to third live wires 806, 808, 810 and a neutral wire 812. First to third shunt resistors 814, 816, 818 are present in a respective one of the first to third live wires 806, 808, 810. First to third units 820, 822, 824 measure current and line voltage in or on a respective one of the first to third live wires 806, 808, 810 as described above with reference to FIGS. 3A and 4. More specifically each unit comprises a signal source 826, voltage measuring apparatus 828 and signal processing circuitry 830, which are operative as described above with reference to FIG. 1A. Each unit further comprises line voltage measuring apparatus 832, which is operative to measure the voltage between a live wire and neutral as described above with reference to FIG. 4, and multiplication circuitry 834, which is operative to multiply measured current and voltage to determine power. The measuring apparatus 800 further comprises first to third power supply apparatus 836, 838, 840, which are of a form and function as described above and which are operative to provide electrical power to a respective one of the first to third units 820, 822, 824. In addition the measuring apparatus 800 comprises first to third galvanic isolators 842, 844, 846 and adder circuitry 848. The first to third galvanic isolators 842, 844, 846 are present in a respective one of the three signal paths between each of the first to third units 820, 822, 824 and the adder circuitry 848 and thereby maintain isolation between and amongst the first to third units. The adder circuitry 848 is operative to receive an output from the multiplication circuitry 834 of each of the first to third units 820, 822, 824 to add the outputs and thereby determine power for all three phases. Although not shown in FIG. 6, in a form of the measuring apparatus a fourth shunt resistor is provided in the neutral wire 812 and the apparatus further comprises further current measurement apparatus of a form already described. The measuring apparatus is further configured to compare current measured for the neutral wire with the sum of the currents measured in the three live wires to provide for tamper detection. The measuring apparatus 800 of FIG. 6 may be otherwise configured to provide for detection of tampering and faults as described above. The configuration shown in FIG. 6 is applied to a split phase arrangement by dispensing with one of the first to third shunt resistors 814, 816, 818 and its associated circuitry whereby current and line voltage is measured in two phases only. The configuration shown in FIG. 6 is applied to arrangements having four or more phases by providing a respective number of shunt resistors and associated circuitry.

Figure 7A:
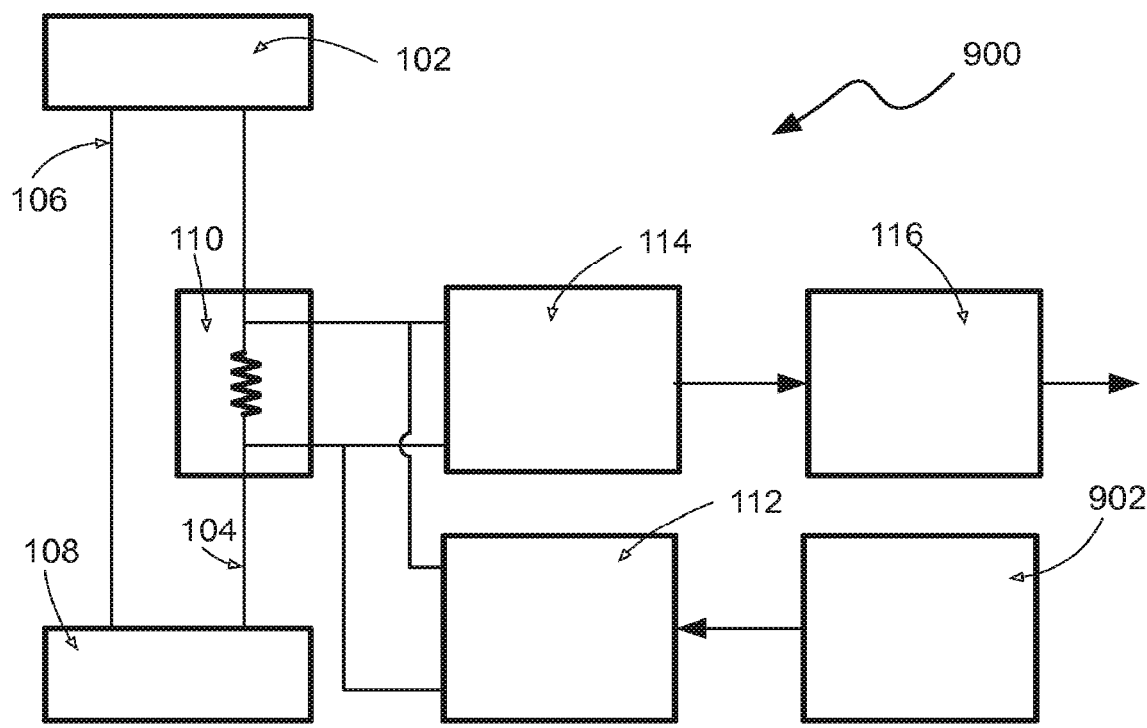
FIG. 7A is a block diagram representation of current measurement apparatus with a current reference circuit.
Figure 7B:
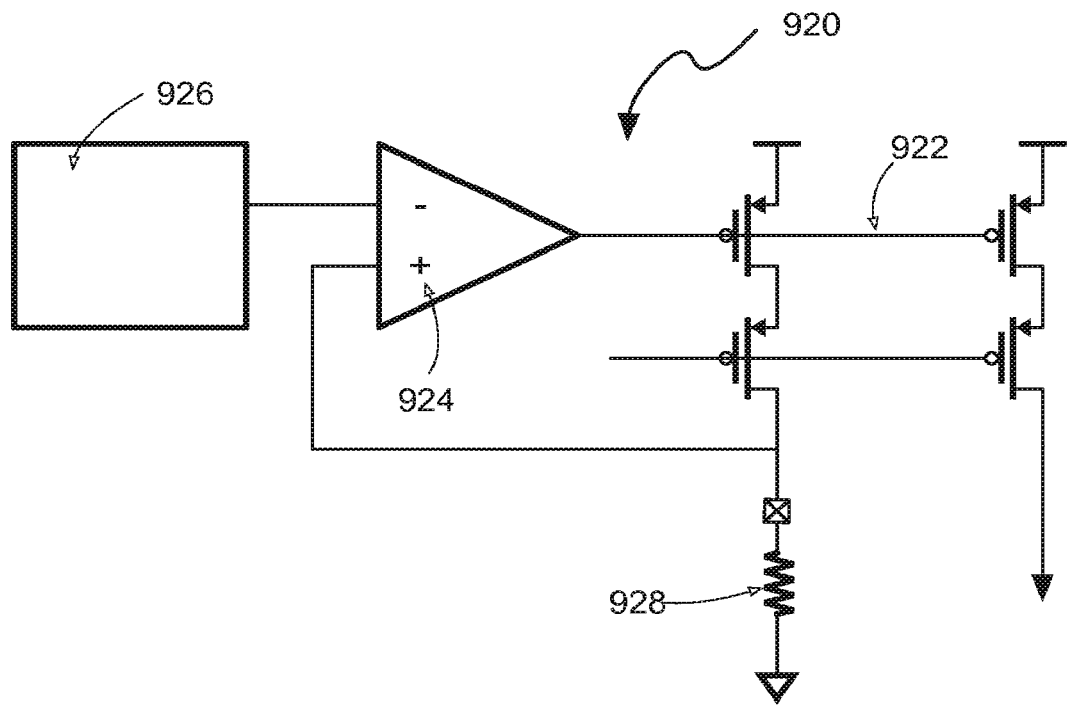
FIG. 7B shows an example of current reference circuit used in the circuit of FIG. 7A.

As described above accuracy of measurement of the transfer function of the shunt resistor and its processing chain relies on the reference input signal provided by the signal source. Therefore and according to certain embodiments of the present invention an accurately known and stable current reference is provided. This approach is illustrated in FIG. 7A, which shows in block diagram form current measurement apparatus 900 with a current reference. Features in common with the current measurement apparatus of FIG. 1A are indicated by the same reference numerals. Further to the common features the current measurement apparatus 900 comprises a current reference circuit 902 (which constitutes a signal source reference circuit), which is operative to set the reference input signal provided by the signal source 112. An example of a current reference circuit 902 is shown in block diagram form in FIG. 7B. The example of FIG. 7B is a voltage controlled current source 920 comprising a current mirror 922, which is driven by a bias voltage provided by an amplifier 924 which is in turn driven by an output from a silicon bandgap reference 926. A current in a first leg of the current mirror 922 is set by a reference resistor 928 of accurately known resistance and having required stability characteristics. The current in the second leg of the current mirror is provided to the signal source 112 of FIG. 7A. According to a particular approach the current measurement apparatus is constituted such that the signal source 112, the voltage measuring apparatus 114, the signal processing circuitry 116 and all component parts of the current reference circuit 902 with the exception of the reference resistor 928 are formed in an integrated circuit. The reference resistor 928 is a precision resistor external to the integrated circuit.

Figure 8A:
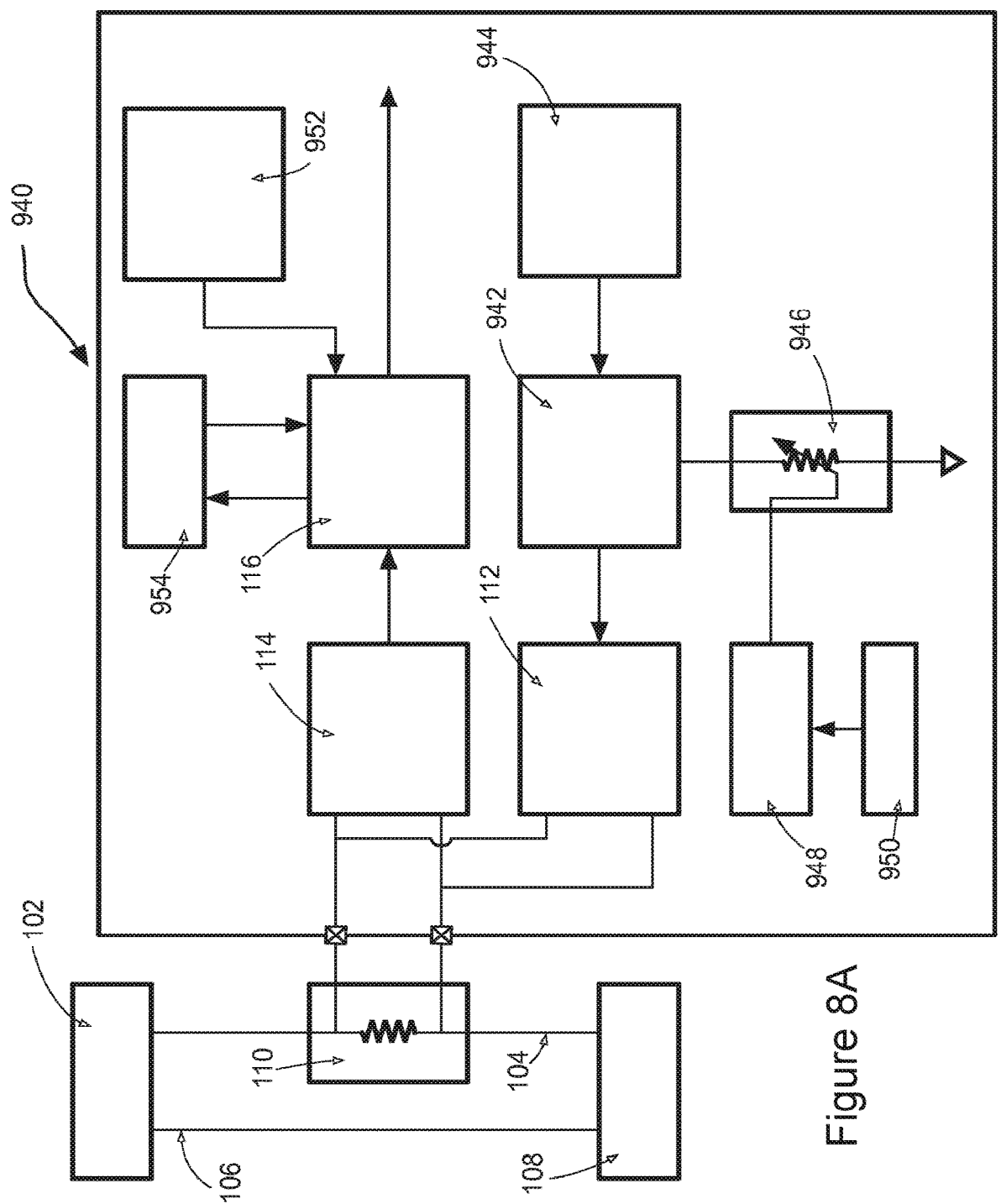
FIG. 8A shows current measurement apparatus in which the current reference circuit is applied according to a first approach.

Application of the current reference circuit according to a first approach will now be described with reference to FIG. 8A. FIG. 8A shows current measurement apparatus 940 comprising components in common with FIG. 1A. The reader's attention is therefore directed to the description provided above with reference to FIG. 1A for a description of such common components. The current measurement apparatus 940 of FIG. 8A further comprises a voltage controlled current source 942 and a bandgap reference 944, which are operative as described above with reference to FIGS. 7A and 7B. Furthermore the current measurement apparatus 940 comprises a variable reference resistor 946, a trimmer 948 (which constitutes a reference adjustment arrangement) and One Time Programmable (OTP) memory 950. In addition the current measurement apparatus 940 comprises a temperature sensor 952 and a lookup table 954. According to the present approach the resistance of the variable reference resistor 946 is to be set to a predetermined value so that the reference input signal is of a predetermined current level. The variable reference resistor 946 is formed as part of an integrated circuit with the other components of the current measurement apparatus. During a calibration procedure an accurately known and stable calibration resistor (not shown) is electrically connected to the current measurement apparatus in place of the shunt resistor 110. In dependence on accurate measurement of the voltage signal across the calibration resistor the actual reference input signal is determined whereby the adjustment to the variable reference resistor 946 which is required to set the reference input signal to its desired level can be determined. The required adjustment is effected by storing adjustment data in the OTP memory 950 with the trimmer 948 being operative in dependence on the stored adjustment data to set the variable reference resistor 946 such that it has the required resistance. The calibration procedure also involves changing the temperature of the current measurement apparatus 940 over an entire operational temperature range, such as −20 to 85 degrees Celsius, and measuring the reference input signal at plural temperatures, e.g. 1 degree steps, to thereby form a temperature behaviour profile for the reference input signal over the entire operational temperature range. The temperature profile is then stored the lookup table 954. In use the signal processing circuitry 116 is operative in dependence on a temperature measured by the temperature sensor 952 to determine a temperature compensation factor from the lookup table 954 and to change the determined transfer function or the measured load output signal in dependence on the compensation factor. In certain forms of the embodiment the calibration procedure addresses distortion caused by the shunt resistor and/or its processing chain. Distortion is addressed by applying known signals to the component subject to characterisation, measuring the output signals and determining a transfer function for the distortion based on the applied and output signals. For example known current signals are applied to the shunt resistor 110, the voltage signals developed across the shunt resistor are acquired and the transfer function determined accordingly. The current measurement apparatus is then configured, e.g. by way of a lookup table, on the basis of the determined transformation to transform the measured load output signal.

Figure 8B:
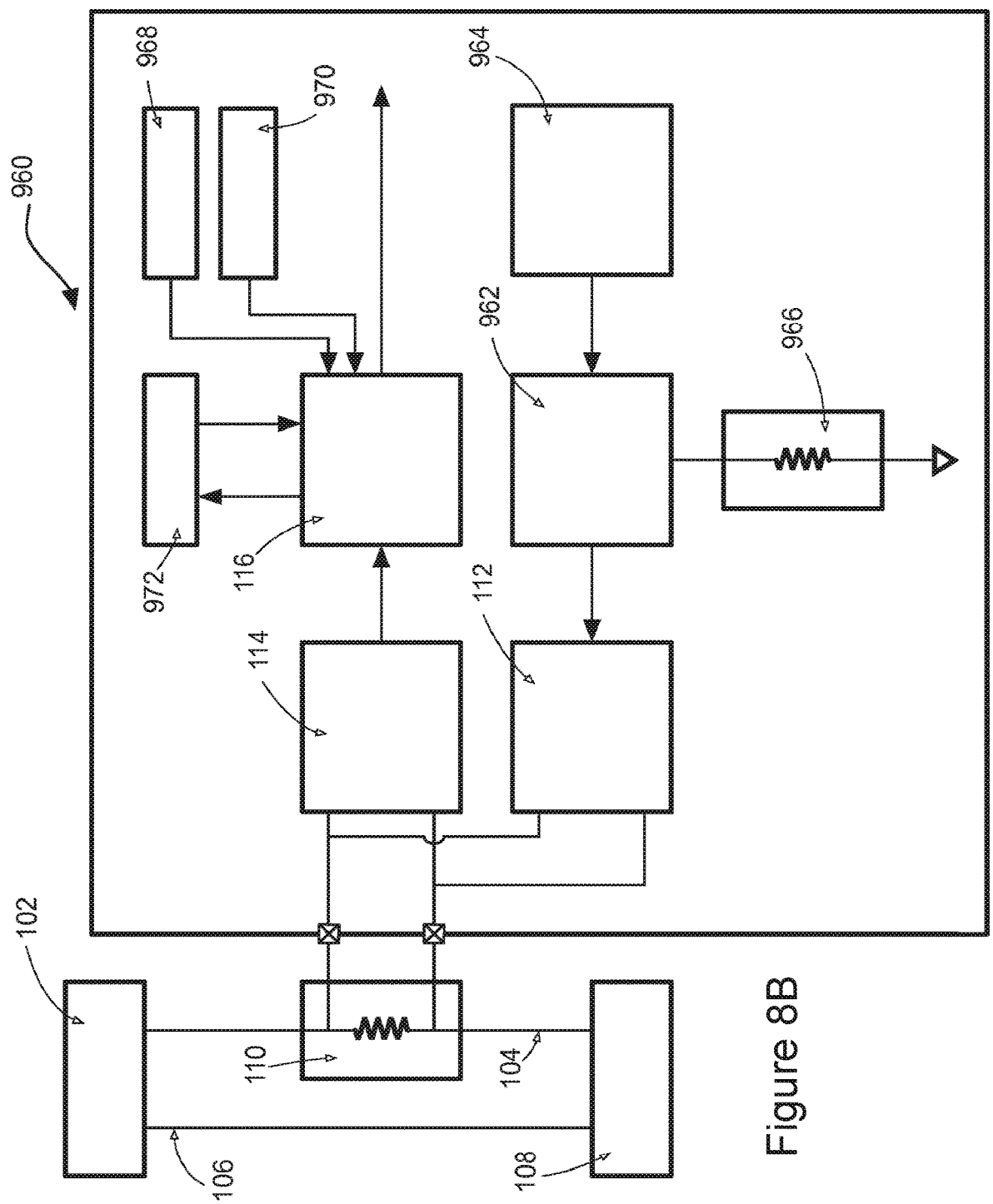
FIG. 8B shows current measurement apparatus in which the current reference circuit is applied according to a second approach.

Application of the current reference circuit according to a second approach will now be described with reference to FIG. 8B. FIG. 8B shows current measurement apparatus 960 comprising components in common with FIG. 1A. The reader's attention is therefore directed to the description provided above with reference to FIG. 1A for a description of such common components. The current measurement apparatus 960 of FIG. 8B further comprises a voltage controlled current source 962 and a bandgap reference 964, which are operative as described above with reference to FIGS. 7A and 7B. Furthermore the current measurement apparatus 960 comprises a fixed reference resistor 966, One Time Programmable (OTP) memory 968, a temperature sensor 970 and a lookup table 972. The fixed reference resistor 966 is formed as part of an integrated circuit with the other components of the current measurement apparatus. According to the present approach the reference output signal level is measured and the current measurement apparatus configured to take account of the measured reference output signal. More specifically and during a calibration procedure an accurately known and stable calibration resistor (not shown) is electrically connected to the current measurement apparatus in place of the shunt resistor 110. The reference output signal is determined in dependence on accurate measurement of the voltage signal across the calibration resistor. Then the reference output signal is stored in the OTP memory 968. During normal use the signal processing circuitry 116 is operative to determine the transfer function of the shunt resistor 110 and its processing chain in dependence on the presently measured reference output signal and the reference output signal stored in the OTP memory 968. As described above with reference to FIG. 8A the calibration procedure also involves forming a temperature behaviour profile for the reference input signal over an entire operational temperature range and configuring the lookup table 972 accordingly. In use the signal processing circuitry 116 is operative in dependence on an output from the temperature sensor 970 and the content of the lookup table 972 to compensate for temperature drift as described above with reference to FIG. 8A.

Figure 8C:
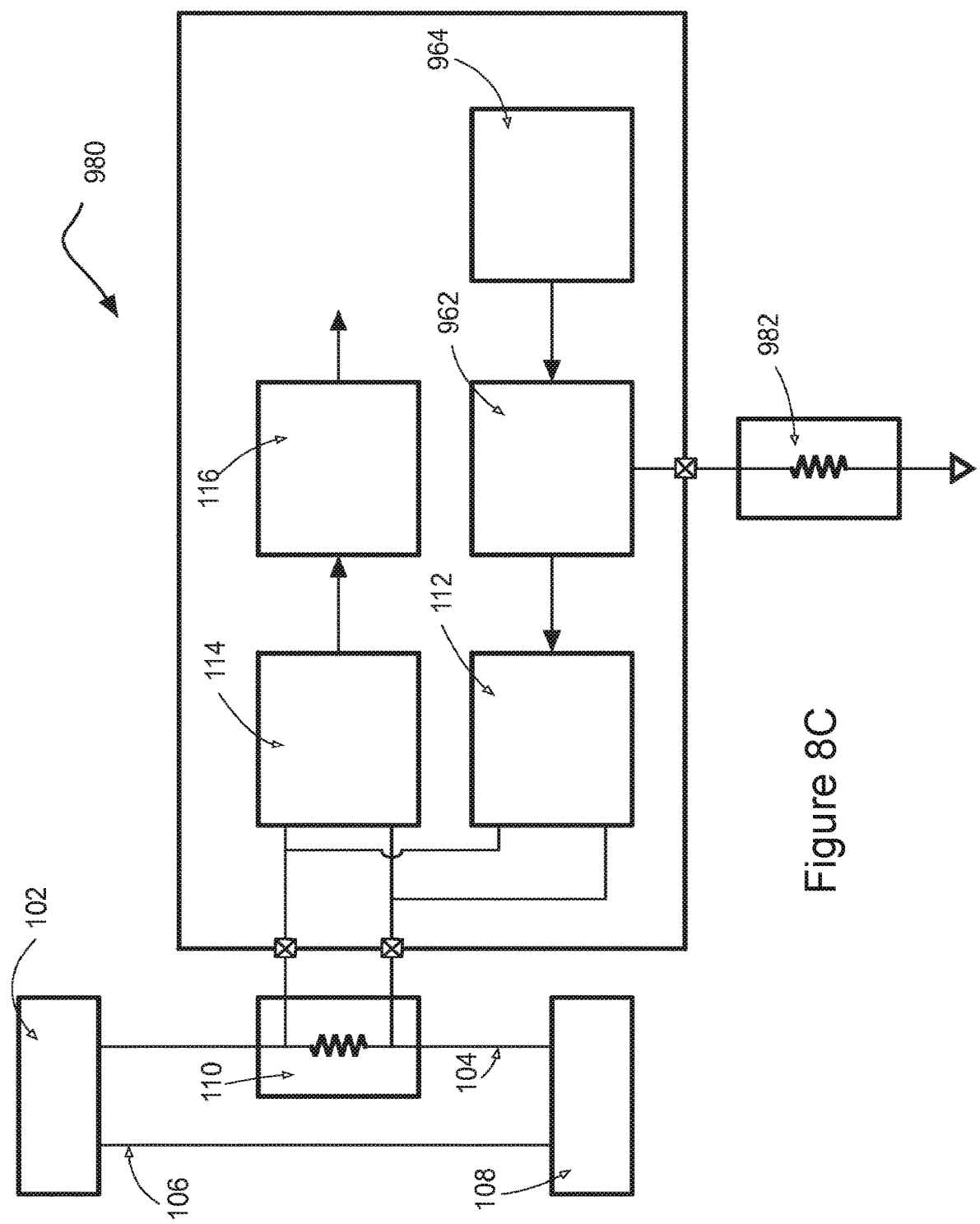
FIG. 8C shows current measurement apparatus in which the current reference circuit is applied according to a third approach.

Application of the current reference circuit according to a third approach will now be described with reference to FIG. 8C. FIG. 8C shows current measurement apparatus 980 comprising components in common with FIGS. 1A and 8B. The reader's attention is therefore directed to the description provided above with reference to FIGS. 1A and 8B for a description of such common components. A component particular to the circuit of FIG. 8C will now be described. Instead of the calibration and compensation components of the circuit of FIG. 8B (e.g. the fixed reference resistor 966, One Time Programmable (OTP) memory 968, temperature sensor 970 and lookup table 972) the circuit of FIG. 8C comprises a temperature stabilised precision resistor 982 (which constitutes a signal source reference circuit). The rest of the components of the circuit of FIG. 8C with the exception of the shunt resistor 110 are constituted as a printed circuit board arrangement, multi-chip module, integrated circuit or the like and the precision resistor 982 is an external component. The precision resistor 982 of the circuit of FIG. 8C is operative like the fixed reference resistor 966 of the circuit of FIG. 8B to set the reference input signal. However the circuit of FIG. 8B is operative by way of the calibration and compensation components to adjust the reference input signal provided by the fixed reference resistor 966 whereas the precision resistor 982 of the circuit of FIG. 8C is selected such that it determines the reference input signal of itself.

Figure 9:
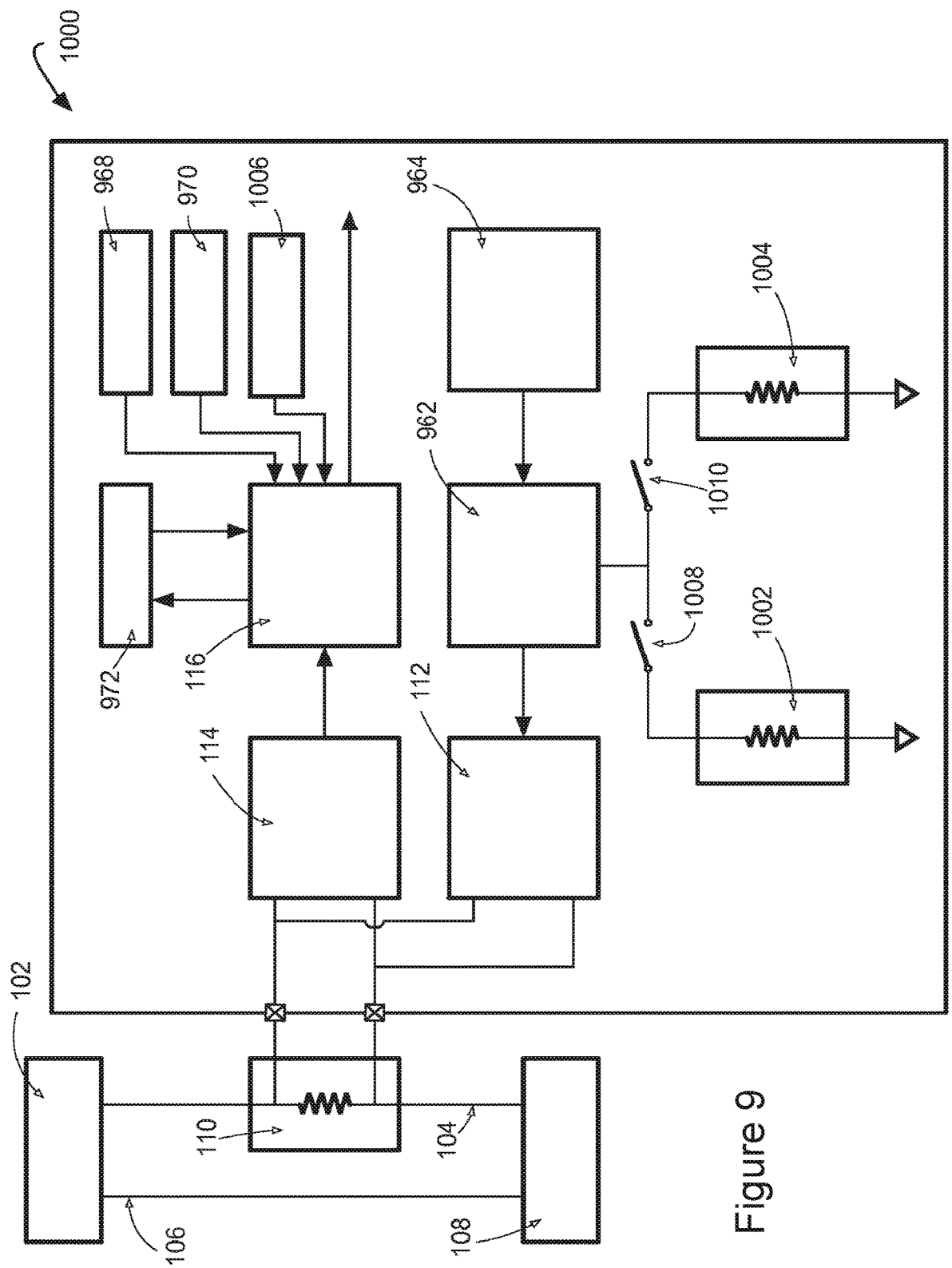
FIG. 9 shows current measurement apparatus configured for calibration of the current reference circuit.

Current measurement apparatus 1000 configured for calibration of the current reference circuit is shown in FIG. 9. Components of the apparatus of FIG. 9 in common with FIGS. 1A and 8B are designated with like reference numbers and the reader's attention is directed to the description provided above with reference to FIGS. 1A and 8B for a description of such common components. The current measurement apparatus further comprises a primary reference resistor 1002 (which constitutes a first signal source reference circuit), a secondary reference resistor 1004 (which constitutes a second signal source reference circuit) and data memory 1006. The current measurement apparatus also comprises a primary switch 1008 and a secondary switch 1010. The primary and secondary reference resistors 1002, 1004 are formed on a printed circuit board, in the lead frame of an integrated circuit package or in an integrated circuit such that they are of accurately matched resistance. During ordinary use the primary switch 1008 is closed such that the reference input signal is set by the primary reference resistor 1002. The primary reference resistor 1002 is liable to degrade and its resistance therefore liable to drift with there being a consequential loss of accuracy of current measurement. Once every predetermined number of cycles of current measurement, e.g. once per day or week, the current measurement apparatus is operative to open the primary switch 1008 and close the secondary switch 1010 whereby the reference input signal is set by the secondary reference resistor 1004. Then the primary switch 1008 closes and the secondary switch 1010 opens whereby normal operation resumes. The secondary reference resistor 1004 carries a much lower level of current over time than the primary reference resistor 1002 and is therefore much less liable to degradation and drift. The current measurement apparatus 1000 is operative to determine an extent of drift in resistance of the primary reference resistor 1002 from the resistance of the secondary reference resistor 1004 in dependence on the difference between the second input signal acquired when the primary reference resistor 1002 is operative and the second input signal acquired when the secondary reference resistor 1004 is operative. Drift data to compensate for the extent of drift is stored in the data memory 1006. During normal use the current measurement apparatus 1000 is operative to determine the load drawn current signal on the basis of the stored drift data.

Figure 10:
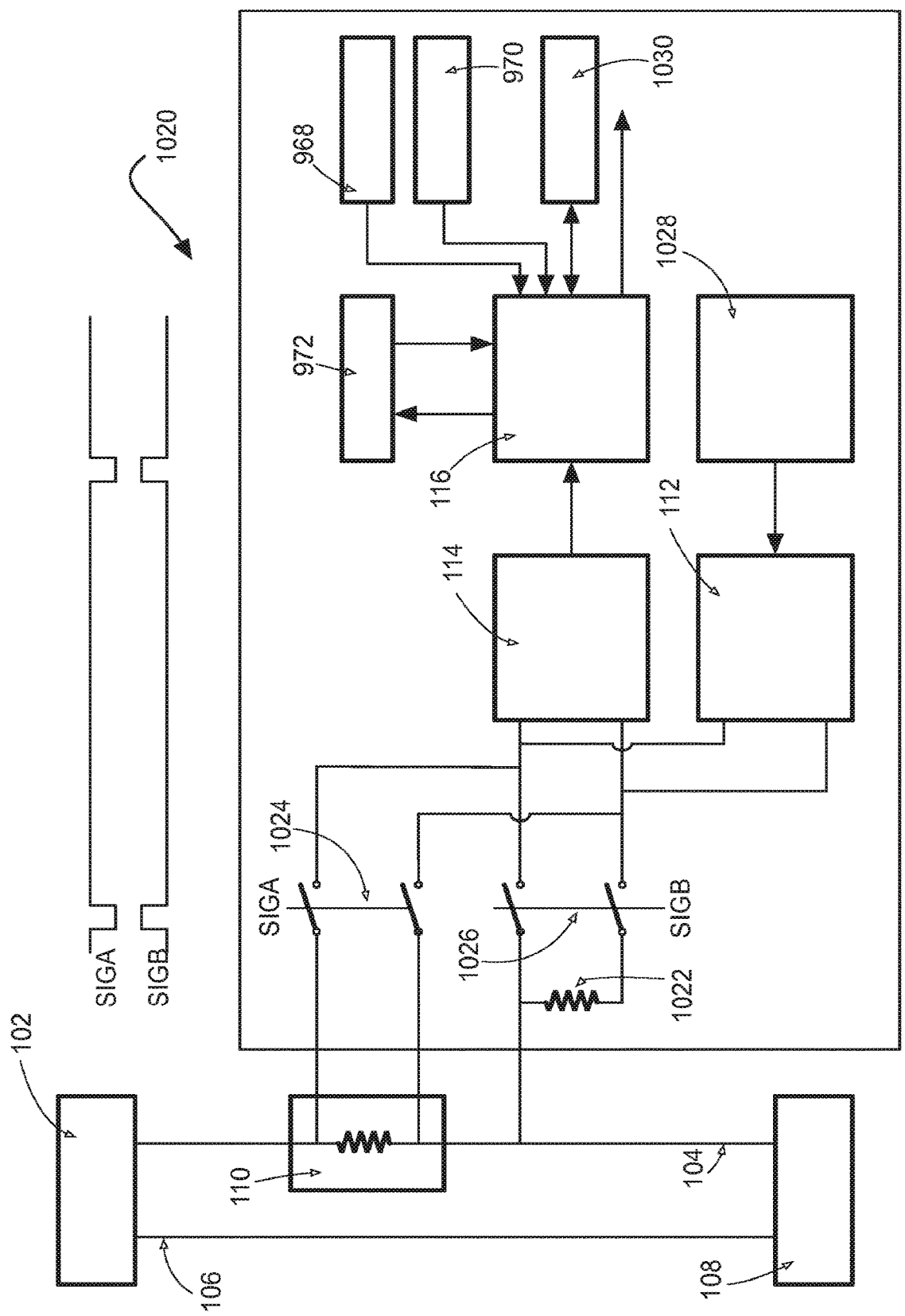
FIG. 10 illustrates current measurement apparatus applied to bidirectional metering.

Current measurement apparatus 1020 comprising a reference signal reference circuit is shown in FIG. 10. Components of the apparatus of FIG. 10 in common with FIGS. 1A and 8B are designated with like reference numbers and the reader's attention is directed to the description provided above with reference to FIGS. 1A and 8B for a description of such common components. The current measurement apparatus 1020 further comprises a reference signal resistor 1022, a first pair of switches 1024 and a second pair of switches 1026. The reference signal resistor 1022 is of accurately known resistance and is of good temperature stability. The current measurement apparatus 1020 also comprises a current reference 1028 and data memory 1030. During use the first pair of switches 1024 is normally closed and the second pair of switches 1026 is normally open whereby the signal source 112 and the voltage measuring apparatus 114 are connected across the shunt resistor 110. Once every predetermined number of cycles of acquisition of voltage signal from the shunt resistor, e.g. once every thousand cycles, the current measurement apparatus is operative to open the first pair of switches 1024 and close the second pair of switches 1026 to thereby disconnect the signal source 112 and the voltage measuring apparatus 114 from the shunt resistor and to connect the signal source 112 and the voltage measuring apparatus 114 to the reference signal resistor 1022. Then the current measurement apparatus is operative to determine the reference output signal by acquisition of the voltage signal developed across the reference signal resistor 1022 by the reference input signal, the resistance of the reference signal resistor 1022 being known and stored. The determined reference output signal is stored in the data memory 1030. Normal measurement across the shunt resistor 110 is resumed by closing the first pair of switches 1024 and opening the second pair of switches 1026. During resumed normal measurement the current measurement apparatus is operative to determine the impedance of the shunt resistor 110 by reference of the currently measured reference output signal to the newly stored reference output current signal for the known reference signal resistor 1022. Periodic operation of the reference signal resistor 1022 as described provides for maintenance of accuracy of current measurement. Thus the current reference 1028 is not required to provide a reference of absolute accuracy for the signal source 112. However the current reference 1028 should be of sufficient stability between operations of the reference signal resistor 1022 to maintain accuracy. The reference signal resistor 1022 carries a much lower level of current than the shunt resistor 110, e.g. mA versus Amps, and is therefore much less liable to degradation than the shunt resistor. A low current level carrying resistor is more readily provided and at lower cost than a high current level carrying resistor. The reference signal resistor 1022 is provided either as an external precision component or, as shown in FIG. 10, is formed in an integrated circuit along with the other components of the current measurement apparatus. Where the reference signal resistor 1022 is formed in an integrated circuit the current measurement apparatus further comprises a trimmer and OTP memory (not shown in FIG. 10) which are operative as a consequence of a calibration procedure as described above with reference to FIG. 8A to provide for adjustment of the resistance of the reference signal resistor 1022 to a desired value. The current measurement apparatus 1020 of FIG. 10 is further operative to interpolate between determinations made on each side of a measurement with the reference signal resistor 1022 to thereby provide data that would otherwise be missed. This approach compensates for under-measurement and is applied where the under-measurement error is significant vis-a-vis the required accuracy. A calibration procedure involves forming a temperature behaviour profile for the reference signal resistor 1022 over an entire operational temperature range and configuring the lookup table 972 accordingly. The calibration procedure is described above in more detail with reference to FIG. 8A. In use the signal processing circuitry 116 is operative in dependence on an output from the temperature sensor 970 and the content of the lookup table 972 to compensate for the effects of temperature drift as described above in more detail with reference to FIG. 8A.

Figure 11:
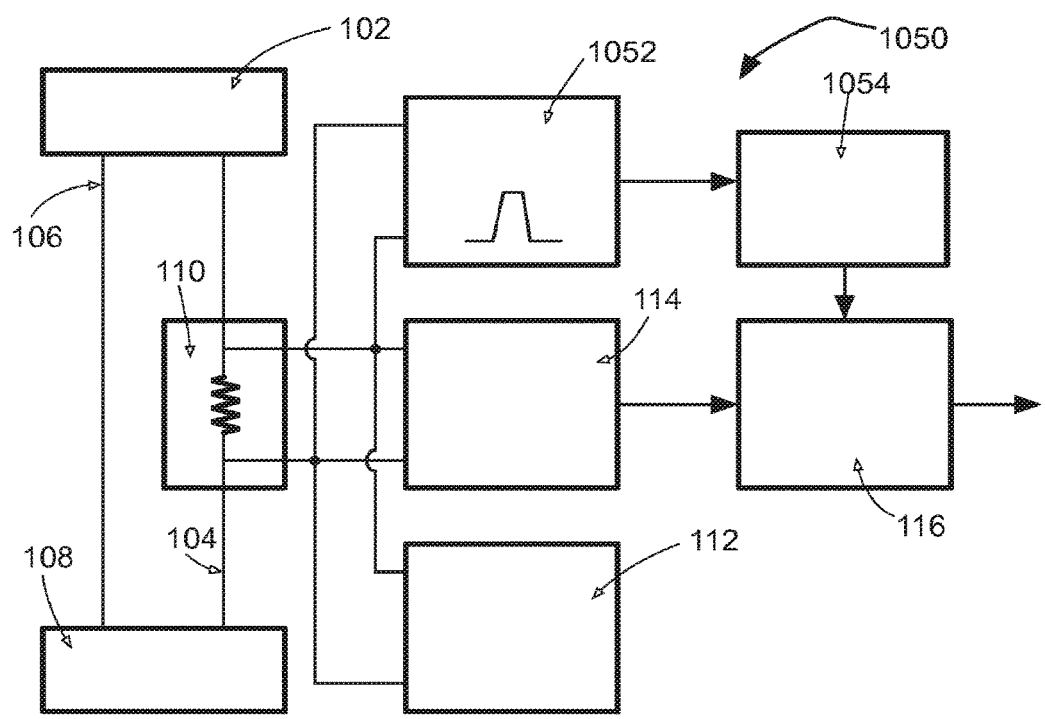
FIG. 11 shows current measurement apparatus according to a further embodiment comprising a separate reference signal extraction path.

Current measurement apparatus 1050 according to a further embodiment comprising a separate reference signal extraction path is shown in FIG. 11. Components of the apparatus of FIG. 11 in common with FIG. 1A are designated with like reference numbers and the reader's attention is directed to the description provided above with reference to FIG. 1A for a description of such common components. The current measurement apparatus 1050 of FIG. 11 further comprises a filter 1052 and second voltage measuring apparatus 1054. The filter 1052 is connected across the shunt resistor 110. The second voltage measuring apparatus 1054 receives an output from the filter 1052. The filter 1052 is configured to obstruct the part of the voltage signal developed across the shunt resistor 110 which corresponds to the load drawn current signal (i.e. the load output signal). According to the present embodiment the reference input signal has a frequency of less than 50 Hz whereas the load drawn current signal is at mains frequency, i.e. 50 Hz. The filter 1052 is therefore operative to pass the reference output signal to the second voltage measuring apparatus 1054. The second voltage measuring apparatus 1054 is operative to convert the received signal to a digital form. The signal processing circuitry 116 is operative to determine the shunt resistor impedance on the basis of the signal received from the second voltage measuring apparatus 1054 and the reference input signal. The signal processing circuitry 116 then determines the load drawn current signal on the basis of the impedance and the voltage signal acquired by the first voltage measuring apparatus 114. As described elsewhere the signal processing circuitry 116 may or may not subtract the reference output signal from the voltage signal acquired by the first voltage measuring apparatus 114 depending on whether or not the reference output signal is of sufficient magnitude to compromise the accuracy of current measurement.

Figure 12:
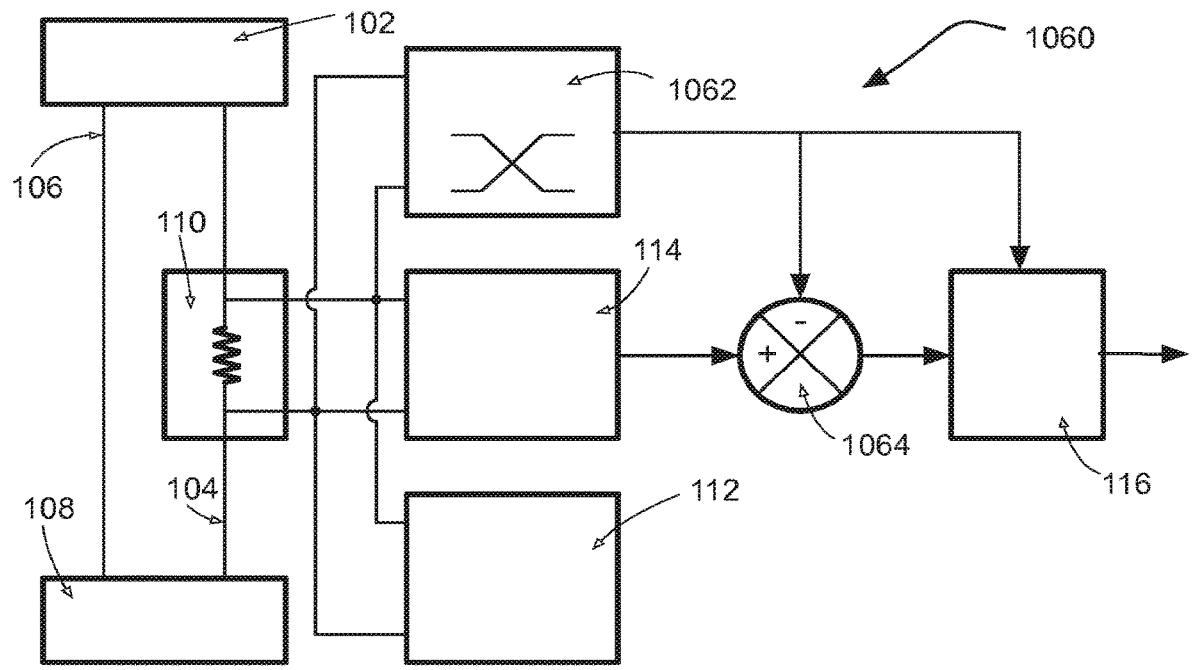
FIG. 12 shows current measurement apparatus according to a yet further embodiment involving analogue demodulation.

Current measurement apparatus 1060 according to a yet further embodiment involving analogue demodulation is shown in FIG. 12. Components of the apparatus of FIG. 12 in common with FIG. 1A are designated with like reference numbers and the reader's attention is directed to the description provided above with reference to FIG. 1A for a description of such common components. The current measurement apparatus 1060 of FIG. 12 further comprises an analogue demodulator 1062, which is operative to receive a voltage signal developed across the shunt resistor 110, and a subtraction circuit 1064, which receives inputs from the analogue demodulator 1062 and the voltage measuring apparatus 114 and provides an output to the signal processing circuitry 116. The analogue demodulator 1062 is of the form of a mixer, switched capacitor circuit or the like. The signal source 112 is operative to apply a switching reference input signal to the shunt resistor 110 at a predetermined frequency. The analogue demodulator 1062 is operative at the same predetermined frequency to thereby extract solely the voltage developed across the shunt resistor 110 by the switching reference input signal. The extracted voltage is passed to the subtraction circuit 1064 where the extracted voltage is subtracted from the output from the voltage measuring apparatus 114 to thereby correct for the error in current measurement caused by the applied switching reference input signal. The corrected output from the voltage measuring apparatus 114 and the extracted voltage are passed to the signal processing circuitry 116, which is operative to determine the impedance of the shunt resistor 110 and apply a correction factor to the corrected output from the voltage measuring apparatus 114.

Forms of the current measurement apparatus of FIG. 11 or 12 comprise different forms of reference circuit described above with reference to FIGS. 7A to 10. Forms of any of the arrangements shown in FIGS. 8A to 12 are configured to be operative, for example, with regards to the provision of tamper and fault detection, the determination of power and energy consumption and to be applied in multi-phase configurations as is described above with reference to FIGS. 1A to 6.

Figure 13:
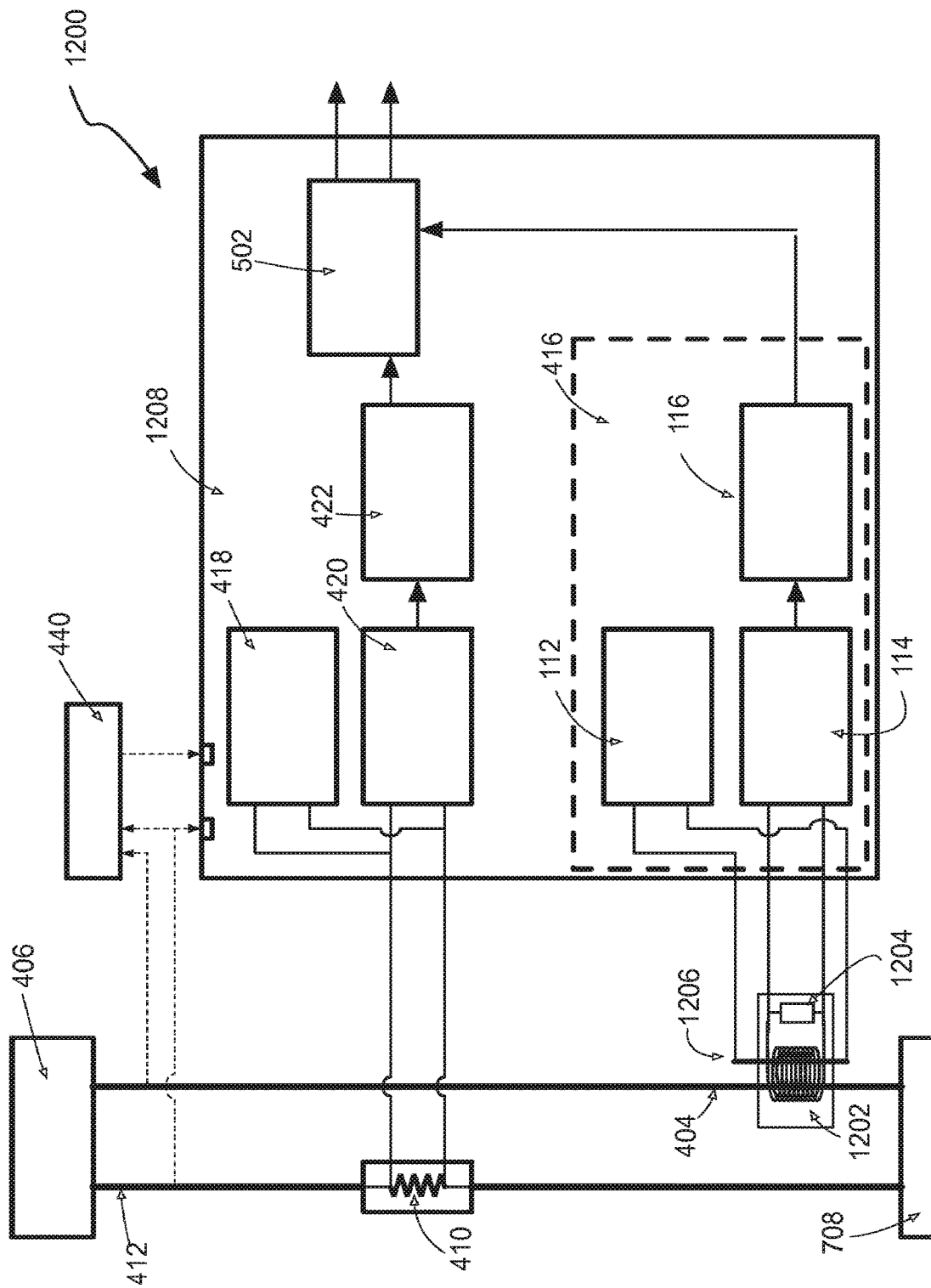
FIG. 13 shows current measurement apparatus comprising a shunt resistor and a current transformer.

Current measurement apparatus 1200 comprising a current transformer according to a first embodiment is shown in FIG. 13. The current measurement apparatus 1200 of FIG. 13 comprises components in common with FIGS. 1A and 3B. The reader's attention is therefore directed to the description provided above with reference to FIGS. 1A and 3B for a description of such common components. The current measurement apparatus 1200 further comprises a coil 1202 of a current transformer, which is disposed around the live conductor 404, and a burden resistor 1204 connected across the coil 1202. In one form the coil 1202 is wound on a unitary ferrite core and the live conductor 404 is passed through the aperture defined by the ferrite core. This form is appropriate: where the coil is fitted upon assembly and before installation whereby the live conductor may be readily passed through the aperture; or when the live conductor may be readily disconnected, passed through the aperture and reconnected. In another form the coil 1202 is wound on a split ferrite core, the portions of the ferrite core are separated and the live conductor is received between the portions of ferrite core before the ferrite core portions are moved together again whereby the live conductor is encircled by the ferrite core. This form is appropriate where the live conductor may not be readily disconnected, e.g. in a consumer self-fitted configuration. Irrespective of the form used the live conductor normally constitutes a unity turn primary of the current transformer and the coil around the ferrite constitutes an N turn secondary of the current transformer. Another less commonly used configuration involves winding the primary, i.e. live conductor, and the secondary, i.e. the coil, on the ferrite core. The voltage measuring apparatus 114 is connected across the burden resistor 1204. The signal processing circuitry 116 is operative to receive an output from the voltage measuring apparatus 114. The voltage measuring apparatus 114 is operative to acquire the voltage developed across the burden resistor 1204 and the signal processing circuitry 116 is operative to determine the current signal, e.g. in respect of its peak and/or RMS value, in dependence on the acquired voltage and having regards to known characteristics of the current transformer, e.g. the turns ratio of the current transformer 1202 and the resistance of the burden resistor 1204.

The current measurement apparatus 1200 of FIG. 13 further comprises a signal source 112 of a form described above which is operative to pass a reference input signal through a signal source conductor 1206. The signal source conductor 1206 passes through the coil 1202 of the current transformer. The reference input signal therefore induces a corresponding induced reference signal in the coil 1202. The signal source 112 of FIG. 13 is therefore operative to modulate the current signal present in the coil 1202. The spatial separation amongst the electrical circuit, the live conductor and the signal source conductor is maintained by their being bonded or held in the apparatus. Maintaining spatial separation is important for reducing misalignment of magnetic fields which may give rise to measurement inaccuracy. The voltage measuring apparatus 114 and the signal processing circuitry 116 are operative to acquire the voltage signal developed across the burden resistor by the load drawn current and reference input signals and to process the acquired voltage signal. More specifically the signal processing circuitry 116 is operative to extract a reference output signal corresponding to the reference input signal from the acquired voltage signal. The means of extraction is as described above. Characteristics of the current transformer, i.e. characteristics of the coil 1202 and burden resistor 1204, and the processing chain are determined by comparison of the reference input signal applied by the signal source 112 with the reference output signal. The determined characteristics are stored. More specifically and with reference to the coil the signal processing circuitry is operative to determine a phase difference between the reference output signal and the reference input signal. The phase difference is used to compensate at least in part for phase error caused by the coil during ordinary operation when measuring the load drawn current. Thus the characteristics determined for the current transformer including the phase error are used to modify the load drawn current signal as measured by the voltage measuring apparatus 114. As described above the signal source 112 is operative at spaced apart times to apply the reference input signal to the coil when calibration of the current transformer and its processing chain is required or deemed appropriate. As can be seen from FIG. 13 a shunt resistor 410 is operative to measure current in the neutral conductor 412 and the current transformer 1202 is operative to measure current in the live conductor 404. The current transformer provides inherently for galvanic isolation. Therefore the signal sources 112, 418 and acquisition and processing circuitry for each of the shunt resistor and current transformer are constituted in the same integrated circuit 1208 and without there being any need to provide for galvanic isolation between the shunt resistor circuitry and current transformer circuitry 416. For example the comparison circuit 502, which is operative to compare the current signals in the live and neutral conductors, receives an output from shunt resistor signal processing circuitry 422 and current transformer signal processing circuitry 116 without there being any need, as per the circuit of FIG. 3B for example, to provide for isolation between the two outputs. In other embodiments of the invention the current measurement apparatus 1200 of FIG. 13 lacks the shunt resistor 410 and its processing chain such that the current measurement apparatus is operative to measure current in the live conductor 404 only by way of the current transformer 1202. In yet other embodiments the current measurement apparatus 1200 is similarly configured and such that the current transformer is replaced with another form of current sensor, such as a Hall probe or a Rogowski coil, whereby the measurement apparatus is operative to measure current in the live conductor 404 only.

Figure 14A:
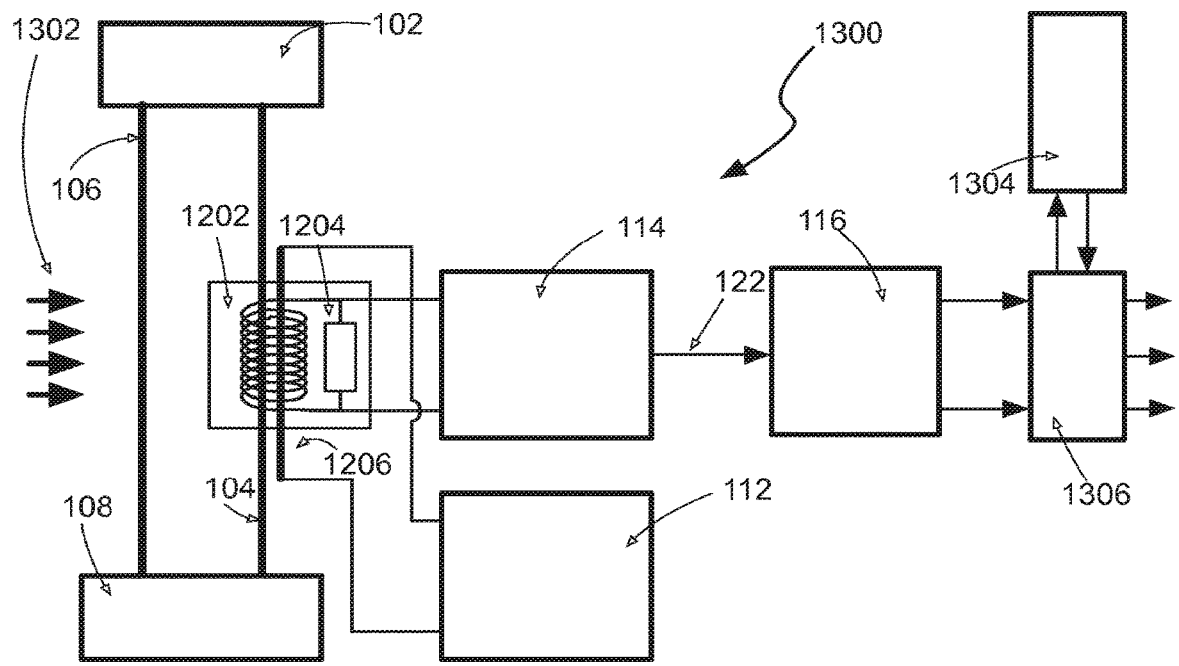
FIG. 14A shows current measurement apparatus comprising a current transformer.

Current measurement apparatus 1300 comprising a current transformer is shown in FIG. 14A. The current measurement apparatus 1300 is shown during a tampering attempt involving application of an external magnetic field 1302. The current measurement apparatus 1300 comprises components in common with FIGS. 1A and 13. The reader's attention is therefore directed to the description provided above with reference to FIGS. 1A and 13 for a description of such common components. The signal source 112 forms an integral part of the current measurement apparatus 1300, e.g. the signal source 112 is constituted with the rest of processing circuitry of the current measurement apparatus 1300 as an integrated circuit. In addition the current measurement apparatus 1300 comprises a central processing unit (CPU) 1306 and a data store 1304, which are operative to store characteristics determined for the current transformer over time. Such characteristics include transfer function information for the current transformer and its processing chain. Application of the external magnetic field 1302 to the current measurement apparatus 1300 interferes with proper operation of the current transformer 1202. Such interference is reflected in an undue change in the characteristics stored in the data store 1304 over time. The central processing unit 1306 is operative to monitor for such an undue change in characteristics and to provide an indication of an undue change.

Figure 14B:
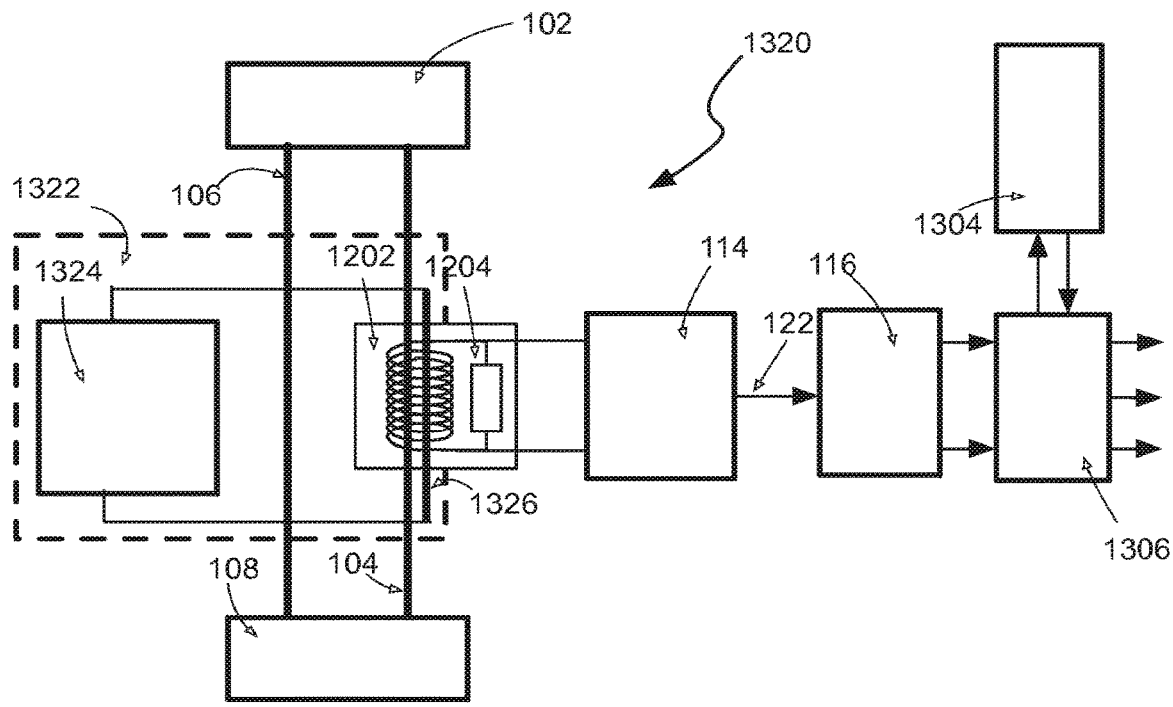
FIG. 14B shows an alternative embodiment of current measurement apparatus comprising a current transformer.

An alternative embodiment of current measurement apparatus 1320 comprising a current transformer is shown in FIG. 14B. The current measurement apparatus 1320 comprises components in common with FIG. 14A. The reader's attention is therefore directed to the description provided above with reference to FIG. 14A for a description of such common components. In contrast with the circuit of FIG. 14A the signal source 1324 and the signal source conductor 1326 are comprised in a separate unit to the rest of the processing circuitry of the current measurement apparatus. More specifically the signal source 1324 and the signal source conductor 1326 form part of portable apparatus 1322 which is brought into use, e.g. by maintenance or calibration personnel, when calibration of the current transformer 1202 is required or when the operation of the current measurement apparatus is being tested. When the current measurement apparatus is operating normally the portable apparatus 1322 is removed.

Figure 15:
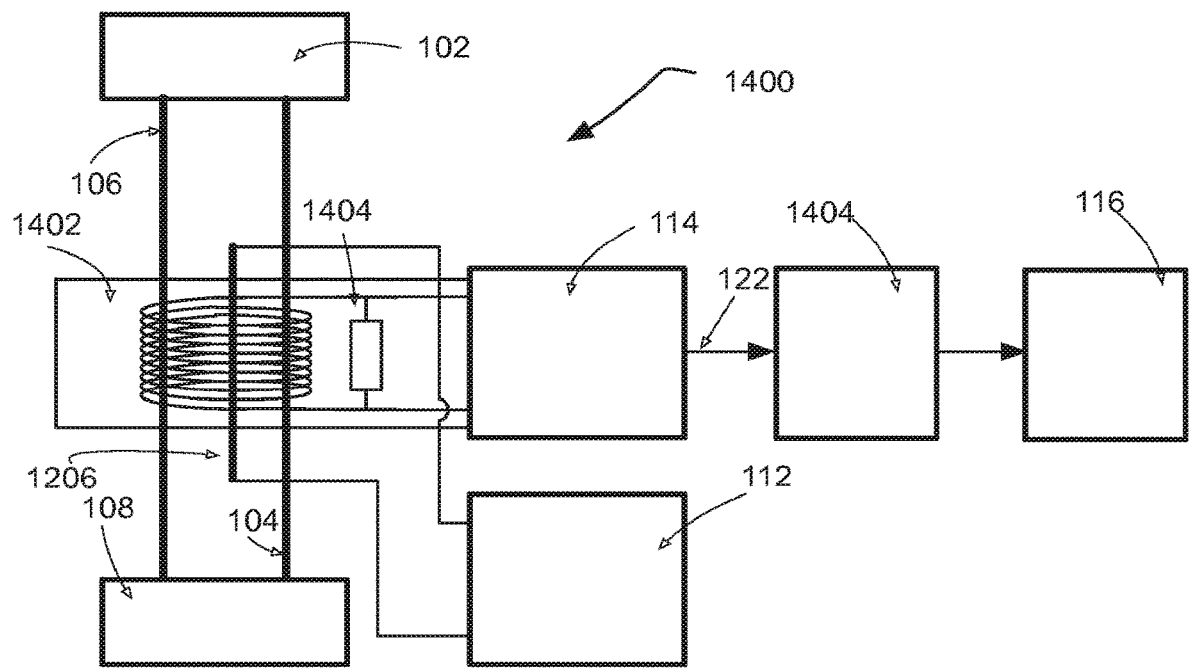
FIG. 15 shows current measurement apparatus comprising a Rogowski coil.

Current measurement apparatus 1400 comprising a Rogowski coil is shown in FIG. 15. The current measurement apparatus 1400 comprises components in common with FIG. 14A. The reader's attention is therefore directed to the description provided above with reference to FIG. 14A for a description of such common components. In contrast with the circuit of FIG. 14A the coil 1202 of the current transformer is replaced by a Rogowski coil 1402, which is disposed around both live and neutral conductors 104, 106, and a burden resistor 1404 connected across the Rogowski coil 1402. The Rogowski coil 1402 is operative to sense change of current in the conductors with time. Accordingly the circuit 1400 of FIG. 15 further comprises an integrator 1404 which is operative to integrate the output from the voltage measuring apparatus 114 and apply the integrated signal to the signal processing circuitry 116. The signal source conductor 1206, which carries the reference input signal generated by the signal source 112, passes through the Rogowski coil 1402. Therefore the load current induced signal in the Rogowski coil 1402 is modulated by the reference input signal in the same fashion as for the current measurement apparatus comprising the current transformer as described above with reference to FIG. 14A. Otherwise the circuit of FIG. 15 is operative as described above with reference to FIG. 14A.

Figure 16:
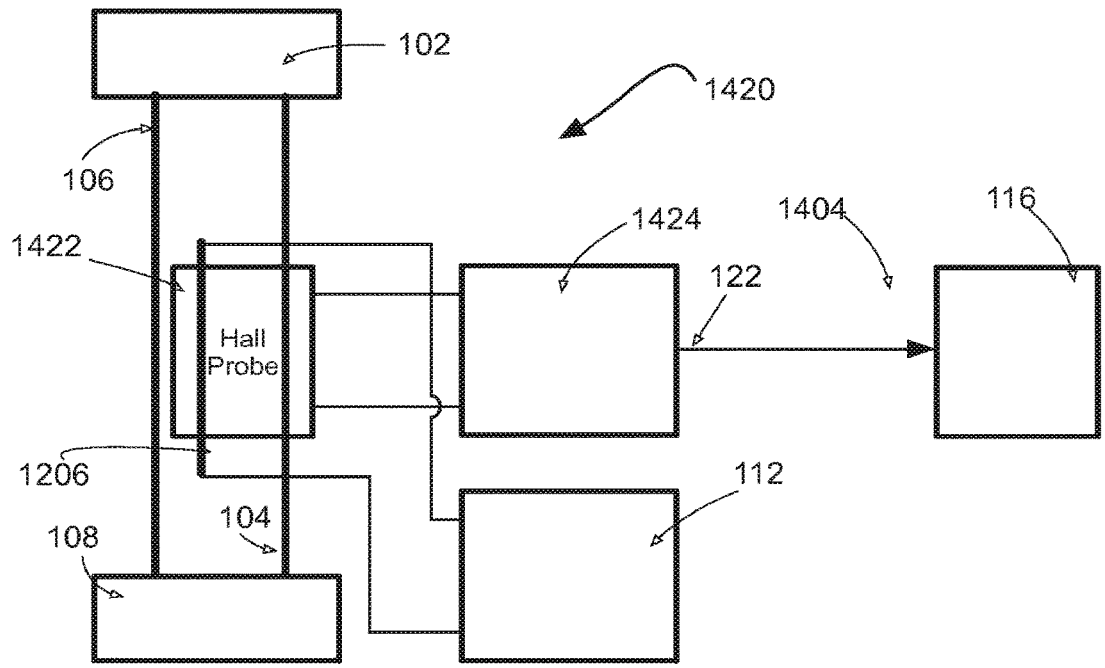
FIG. 16 shows current measurement apparatus comprising a Hall probe.

Current measurement apparatus 1420 comprising a Hall effect probe 1422 is shown in FIG. 16. The current measurement apparatus 1420 of FIG. 16 comprises a Hall effect probe 1422 instead of the Rogowski coil of FIG. 15. The Hall effect probe is disposed proximate the live wire 104 and the signal source conductor 1206 whereby signals present in these conductors are sensed by the Hall effect probe 1422. The current measurement apparatus 1420 further comprises a Hall probe conditioning and measurement circuit 1424 which is operative to apply a bias current to the Hall effect probe 1422 and to sample and acquire signals from the Hall effect probe 1422 with the acquired signals being provided to a signal processing circuit 116. Otherwise the form and function of the current measurement apparatus 1420 of FIG. 16 is as described elsewhere herein.

Figure 17A:
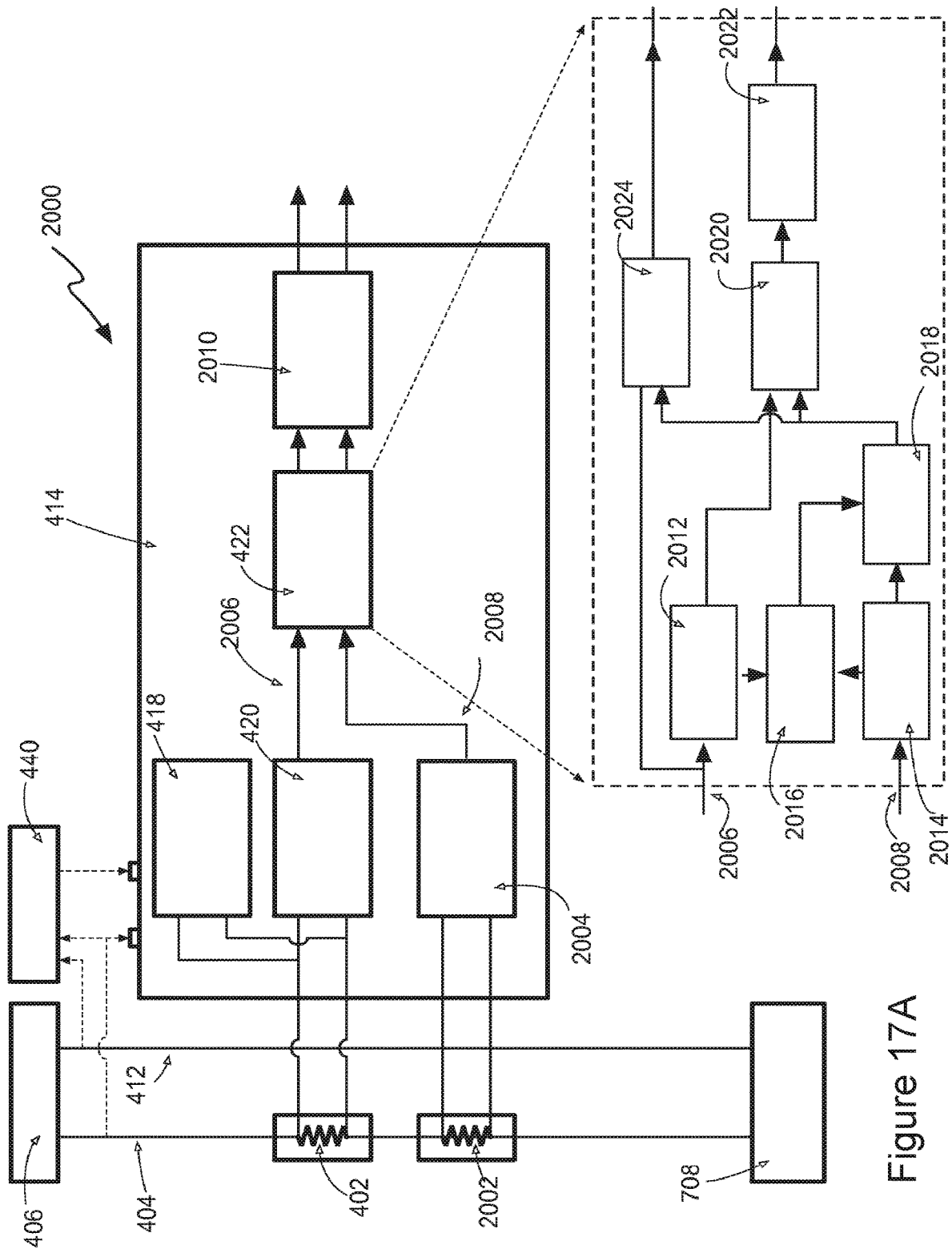
FIG. 17A shows a first embodiment of current measurement apparatus involving subtraction of the load output signal.

A first embodiment of current measurement apparatus 2000 which addresses the challenge of extracting the reference output signal from the load output signal is shown in FIG. 17A. Features in common with the current measurement apparatus of FIG. 3A are indicated by the same reference numerals and the reader's attention is directed to the description provided above with reference to FIG. 3A for a description of the form and function of such common features. Features particular to the embodiment of FIG. 17A will now be identified and their operation described. The current measurement apparatus 2000 further comprises: a second shunt resistor 2002 in series with the first shunt resistor 402 in the live conductor 404; and a second voltage measuring apparatus 2004, which is operative to acquire a voltage signal developed across the second shunt resistor 2002. The output 2006 from the first voltage measuring apparatus 420 and the output 2008 from the second voltage measuring apparatus 2004 are both received by the signal processing circuitry 422. The operation of the signal processing circuitry 422 is described below. Outputs from the signal processing circuitry 422 are received by a compensation circuit 2010, which is operative as described elsewhere herein to compensate for the initial value and drift in the transfer function of the first shunt resistor 402 and its processing chain by determining a factor corresponding to a change in the transfer function of the first shunt resistor 402 and its processing chain. The signal processing circuitry 422 comprises first 2012 and second 2014 pre-processing circuitry which receive a respective one of the outputs 2006, 2008 from the first and second voltage measuring apparatus 420, 2004. The signal processing circuitry 422 further comprises a statistical operation block 2016, which receives inputs from the first 2012 and second 2014 pre-processing circuitry, and an equaliser 2018, which receives inputs from the statistical operation block 2016 and the second pre-processing circuitry 2014. In addition the signal processing circuitry 422 comprises a signal removal block 2020 which receives inputs from the first pre-processing circuitry 2012 and the equaliser 2018, an extraction block 2022 which receives an input from the signal removal block 2020 and a combination block 2024 which receives inputs from the equaliser 2018 and direct from the first voltage measuring apparatus 420. The first and second shunt resistors 402, 2002 are constituted as discrete components. Alternatively a single resistive element, such as a conductor in an integrated circuit or a wire in a lead frame, is configured by way of a centre tap to provide for the first and second shunt resistors 402, 2002.

The operation of the current measurement apparatus 2000 of FIG. 17A will now be described. The components of the present embodiment in common with the embodiment of FIG. 3A operate in the same fashion as previously described. Otherwise the second voltage measuring apparatus 2004 is operative to acquire a voltage signal developed across the second shunt resistor 2002. The voltage signal developed across the second shunt resistor 2002 corresponds substantially to the current signal drawn by the load 408, i.e. the voltage signal is the load output signal. It should be noted that no reference input signal is applied to the second shunt resistor 2002. The first 2012 and second 2014 pre-processing circuitry, the statistical operation block 2016 and the equaliser 2018 are operative to receive the outputs 2006, 2008 from the first and second voltage measuring apparatus 420, 2004 and to equalise the outputs with respect to their amplitudes and phase. More specifically the first 2012 and second 2014 pre-processing circuitry are operative to perform a FFT on the two outputs and the statistical operation block 2016 is then operative to analyse the resulting transformations to identify the most significant frequency component which corresponds to the load drawn current signal and to analyse frequency components adjacent to the reference frequency component. Such analyses provide a basis for determining whether or not equalisation is required in respect of at least one of phase and amplitude and, if so, the extent of the equalisation required. The equaliser 2018 is then operative to effect equalisation of the two outputs in dependence on the analyses by the statistical operation block 2016 by operation on the output from the second pre-processing circuitry 2014. Thereafter the signal removal block 2020 is operative to subtract the now equalised output from the second pre-processing circuitry 2014 (i.e. the equalised load output signal) from the output from the first pre-processing circuitry 2012 to thereby remove the load output signal and leave the reference output signal. The extraction block 2022 is then operative, as described elsewhere herein, on the output from the signal removal block 2020 to extract the reference output signal from whatever noise there may be. The combination block 2024 is operative to combine the direct output from the first voltage measuring apparatus 420 with the output from the equaliser 2018 to thereby combine signals acquired from the first and second shunt resistors. The signals are combined in respect of signal energy outside the reference signal. Combining the signals in this fashion improves the signal to noise ratio for frequencies other than frequencies of the reference input signal and thereby provides for improved load drawn current measurement. The compensation circuit 2010 is operative as described elsewhere to compensate for the transfer function of the shunt resistor and its processing chain. The transfer function includes a major component representative of the initial value and drift in the impedance of the first shunt resistor 402. The signal processing circuitry 422 is further operative to determine whether or not the load output signal is more than a predetermined amount, such as 3 dB, above the noise floor and to selectively subtract the load output signal in dependence on the determination.

Figure 17B:
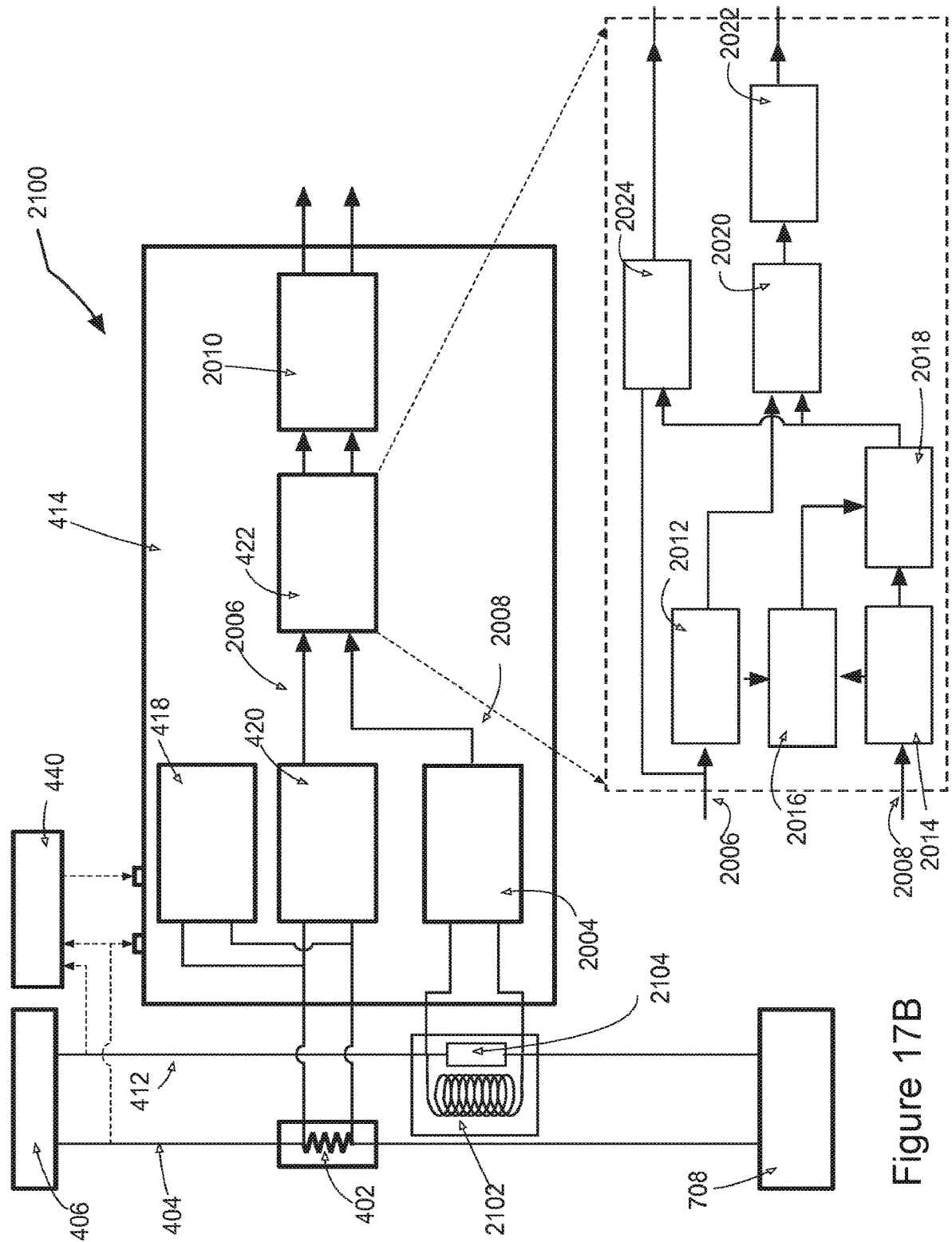
FIG. 17B shows a second embodiment of current measurement apparatus involving subtraction of the load output signal.

A second embodiment of current measurement apparatus 2100 which involves subtraction of the load output signal is shown in FIG. 17B. Features in common with the current measurement apparatus 2000 of FIG. 17A are indicated by the same reference numerals and the reader's attention is directed to the description provided above with reference to FIG. 17A for a description of the form and function of such common features. Features particular to the embodiment of FIG. 17B will now be identified and their operation described. The current measurement apparatus 2100 of FIG. 17B comprises a current transformer 2102 in the neutral conductor 412 instead of the second shunt resistor 2002 of FIG. 17A, which is present in the live conductor. A load drawn current present in the live conductor normally returns by way of the neutral conductor. The current transformer 2102 is therefore operative to measure the returning load drawn current signal. The second voltage measuring apparatus 2004 receives an input from the current transformer to thereby provide a load output signal which is subtracted from a signal acquired by way of the shunt resistor 402. Otherwise the current measurement apparatus 2100 of FIG. 17B is operative in the same fashion as the current measurement apparatus 2000 of FIG. 17A. It is however noted that the different natures of the first shunt resistor 402 and the current transformer 2102 are liable to require a more complex equalisation process than is required where two components, such as two shunt resistors, which rely on the same current sensing principle are used. Where a shunt resistor is used in each of the live and neutral conductors instead of a shunt resistor and a current transformer the current measurement apparatus 2100 further comprises an isolator as described elsewhere herein to maintain isolation between the live and neutral conductors.

Figure 17C:
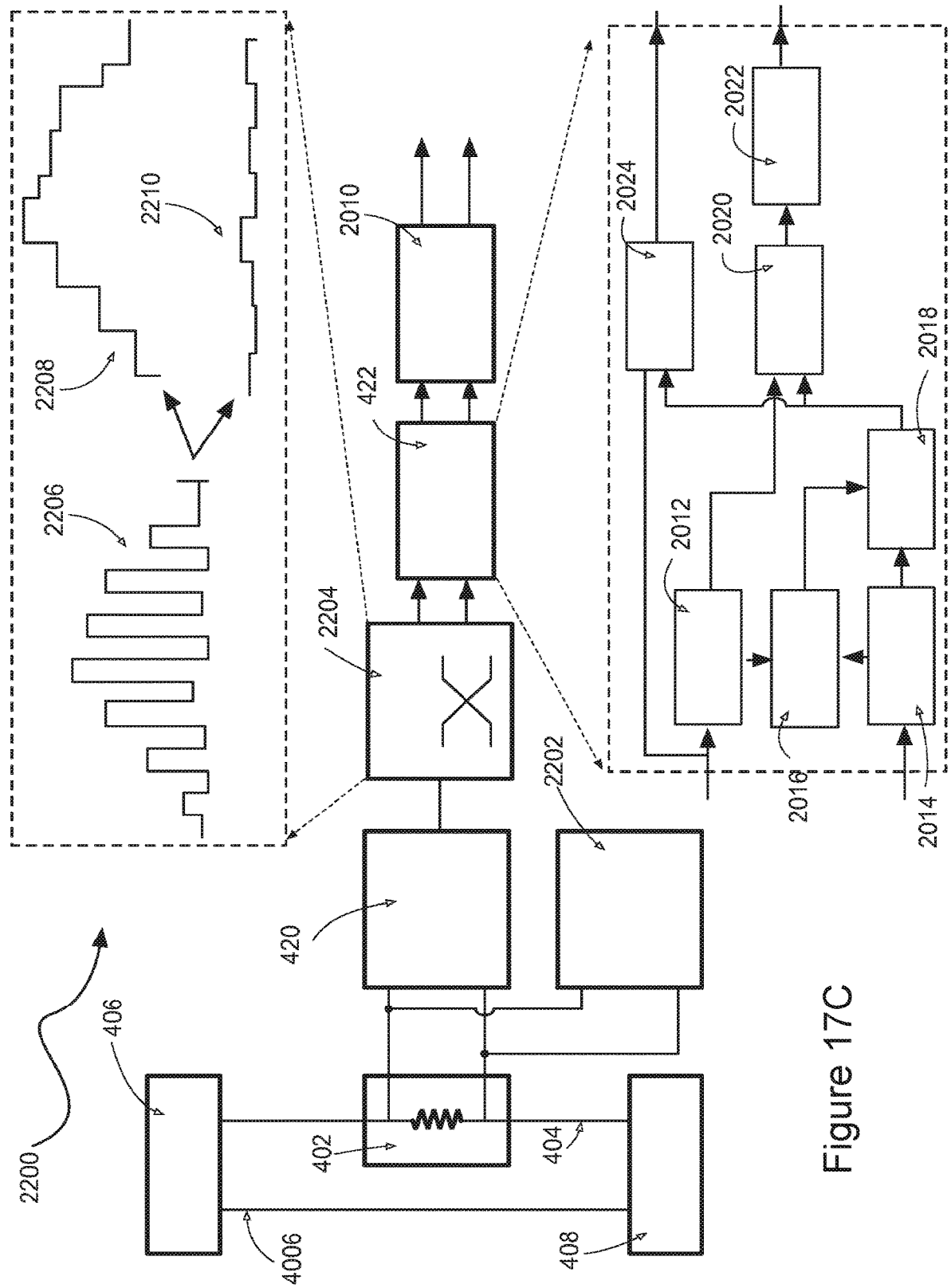
FIG. 17C shows a third embodiment of current measurement apparatus involving subtraction of the load output signal.

A third embodiment of current measurement apparatus 2200 which involves subtraction of the load output signal is shown in FIG. 17C. Features in common with the current measurement apparatus 2000 of FIG. 17A are indicated by the same reference numerals and the reader's attention is directed to the description provided above with reference to FIG. 17A for a description of the form and function of such common features. Features particular to the embodiment of FIG. 17C will now be identified and their operation described. The current measurement apparatus 2200 comprises a modulated first signal source 2202, which is electrically coupled across the shunt resistor 402, and a demodulator 2204, which receives an input from the voltage measuring apparatus 420 with the signal processing circuitry 422 being operative to receive an input from the demodulator 2204. The modulated first signal source 2202 modulates a reference input signal before application of the modulated reference input signal to the shunt resistor 402. Modulation of the reference input signal is by way of a form of Return To Zero (RTZ) approach or the like. The demodulator 2204 is operative on the voltage signal 2206 acquired by the voltage measuring apparatus 420 to separate the signal 2206 output by the voltage measuring apparatus 420 into a first signal 2208 comprising the reference output signal and the load output signal and a second signal 2210 comprising the load output signal and substantially lacking the reference output signal. After equalisation of the first and second signals as described above with reference to FIG. 17A, the second signal is subtracted from the first signal to thereby obtain the reference output signal. In another form the modulation is at a sub-harmonic of the fundamental frequency of the load drawn signal and the signal processing circuitry 422 is operative to extract information from plural cycles of the load drawn signal. The current measurement apparatus 2200 of FIG. 17C is otherwise and thereafter operative as described above with reference to FIG. 17A.

Figure 17D:
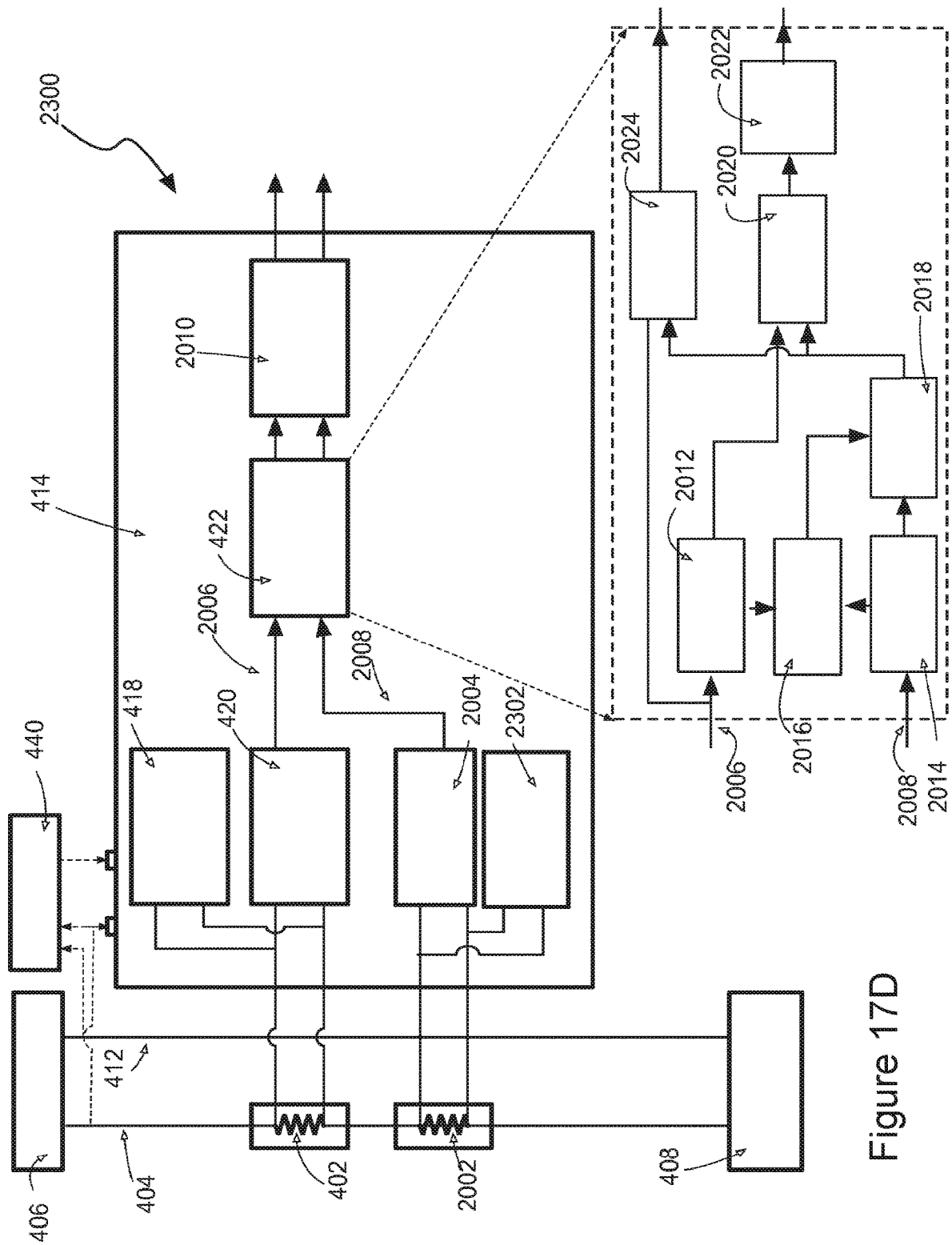
FIG. 17D shows a fourth embodiment of current measurement apparatus involving subtraction of the load output signal.

A fourth embodiment of current measurement apparatus 2300 which involves subtraction of the load output signal is shown in FIG. 17D. Features in common with the current measurement apparatus 2000 of FIG. 17A are indicated by the same reference numerals and the reader's attention is directed to the description provided above with reference to FIG. 17A for a description of the form and function of such common features. Features particular to the embodiment of FIG. 170 will now be identified and their operation described. The current measurement apparatus 2300 of FIG. 17D comprises a second signal source 2302 which is operative to apply a second reference input signal to the second shunt resistor 2002. The second voltage measuring apparatus 2004 is operative to acquire a voltage signal developed across the second shunt resistor 2002. The voltage signal developed across the second shunt resistor 2002 corresponds to the load drawn current signal and the second reference input signal. The voltage signal developed across the first shunt resistor 402, which is acquired by the first voltage measuring apparatus 420 corresponds to the load drawn current signal and the first reference input signal. The output from each of the first and second voltage measuring apparatus is received by the signal processing circuitry 422. The first and second signal sources 418, 2302 are operative to apply the first and second reference signals at substantially the same time. The first and second reference signals differ from each other with respect to at least one of frequency and phase. The signal processing circuitry 422 is operative to equalise the voltage signals acquired by the first and second voltage measuring circuits as described above with reference to FIG. 17A. The signals acquired by the first and second voltage measuring circuits are subtracted from each other to thereby provide a pair of output signals which substantially lack the load output signal and comprise the first and second reference output signals respectively. Otherwise the operation of the present embodiment is as described above with reference to FIG. 17A.

The invention claimed is:

1. An apparatus for monitoring a transfer function of a measurement arrangement, the measurement arrangement including a current transducer configured to measure a first current in a conductor, the apparatus comprising:
a signal source configured to apply a reference signal to the current transducer such that, in use, an output signal from the current transducer comprises a reference signal component resulting from the reference signal; and
a processing circuit configured to receive the output signal, extract the reference signal component, and use information about the reference signal component and the reference signal to:
identify a change in a transfer function of the measurement apparatus, or
provide a value of the reference signal component, or
provide an estimate of the transfer function.

2. The apparatus of claim 1, wherein the first current transducer is one of:
a) a shunt and the signal source is configured to provide the reference signal current to the conductor;
b) a sensor responsive to a magnetic field, and the signal source is configured to provide the reference signal current to the conductor; and
c) a sensor responsive to a magnetic field, and the reference signal is passed by a signal source conductor that is proximate the conductor that carries the first current.

3. The apparatus of claim 1, wherein the apparatus is configured to provide diagnostic information about the measurement apparatus, the diagnostic information including at least one of:
a) a comparison of a present transfer function with a previously determined transfer function;
b) a comparison of a present factor corresponding to the identified change in transfer function with a previously determined factor; and
c) a comparison of a value of a transfer function of the measurement apparatus at a moment that a disconnect occurs and a value of a transfer function of the measurement apparatus when the apparatus restarts.

4. The apparatus of claim 3, wherein a result of the comparison is compared to a specified threshold value to determine if an action needs to be taken, wherein the threshold is at least one of:
a) a threshold set at a post-manufacture stage;
b) a threshold based on a temperature of the current measurement apparatus or a magnitude of a first current signal measured by the measurement apparatus; and
c) a threshold that is based on an earlier determined difference between two transfer functions or factors of the measurement apparatus.

5. The apparatus of claim 1, wherein the processing circuit is configured to identify the change in the transfer function of the measurement apparatus, wherein the change triggers an action that includes at least one of:
a) displaying a message on a display local to the apparatus;
b) a denial of service;
c) issuing a warning of degradation of the current measurement apparatus;
d) issuing an indication of failure of the current measurement apparatus;
e) issuing an indication of tampering;
f) applying a billing penalty; and
g) passing information to a remote system for analysis and a subsequent action.

6. The apparatus of claim 1, wherein the first current is measured or metered, and wherein the processing circuit is configured to identify the change in the transfer function and the identified change in the transfer function is not used to adjust a metered quantity of the first current.

7. The apparatus of claim 1, wherein a magnitude of the reference signal is a known value, and wherein the processing circuit is configured to provide the estimate of the transfer function based on the known value.

8. The apparatus of claim 1, wherein one or more of the following apply:
a) the reference signal is applied periodically such that the transfer function is determined periodically;
b) the reference signal has at least one frequency component different than the first current; and
c) a reference signal source is configured to change an amplitude of the reference signal based on an estimate of a magnitude of the first current.

9. The apparatus of claim 1; wherein the current transducer is a first current transducer, the apparatus further comprising a second current transducer configured to measure the first current, the second current transducer not being subjected to the reference signal, and wherein the processing circuit is configured to:
scale signals from the first and second current transducers such that ie signals substantially match; and
recover information about the reference signal component by finding a difference between the scaled signals.

10. The apparatus of claim 1, wherein the current transducer is a first current transducer, the apparatus further comprising a second current transducer configured to measure a second current of a second conductor, the second current transducer not being subjected to the reference signal, and wherein the processing circuit is configured to:

scale signals from the first and second current transducers such that the signals substantially match; and recover information about the reference signal component by finding a difference between the scaled signals.

11. The apparatus of claim 1, further comprising a subtractor for subtracting the reference signal component from the output signal to provide information substantially only about a component from the first current.

12. The apparatus of claim 1, further comprising a second signal source for providing a second reference signal to a current sensor and the processing circuit is configured to determine a transfer characteristic associated with the further current sensor.

13. The apparatus of claim 1, further comprising a demodulator circuit configured to extract information about the reference signal component from the output signal.

14. The apparatus of claim 1, wherein the output signal includes a current signal component corresponding to the first current, and the processing circuit is further configured to estimate information about the first current based on the estimate of the transfer function.

15. The apparatus of claim 1, further comprising a voltage measurement apparatus for measuring an instantaneous voltage of the conductor and a multiplication circuit for multiplying the measured first current and the voltage to determine power.

16. The apparatus of claim 1, wherein the reference signal includes at least one of:
a) a signal having a specified frequency characteristic;
b) a signal having a specified magnitude characteristic; and
c) a signal having a stability characteristic within a specified range.

17. A method for determining a transfer function of a measurement apparatus comprising a first current transducer configured to measure a first current in a conductor, the method comprising:

applying a reference signal to the first current transducer;

receiving an output signal from the first current transducer, the output signal comprising at least one of a current signal component corresponding to the current in the conductor and a reference signal component corresponding to the reference signal;

extracting, using a processor circuit, the reference signal component from the output signal; and comparing, using the processor circuit, the reference signal component and the reference signal, and providing information about a change in a transfer function of the first current transducer based on the comparison.

18. The method of claim 17, further comprising receiving a second output signal from a second current transducer configured to measure the same first current, and determining information about the reference signal component using the second output signal and the output signal from the first current transducer.

19. The method of claim 18, further comprising providing diagnostic information about the measurement apparatus, the diagnostic information including at least one of:
a) a comparison of a present transfer function with a previously determined transfer function;
b) a comparison of a present factor corresponding to an identified change in the transfer function with a previously determined factor; and
c) a comparison of a value of the transfer function of the measurement apparatus at a moment that a disconnect occurs and a value of a transfer function of the measurement apparatus when the apparatus restarts.

20. The method of claim 17, wherein the providing the information about the change in the transfer function includes using a known magnitude of the reference signal.

21. The method of claim 17, wherein the applying the reference signal includes periodically applying the reference signal and correspondingly providing the information about the change in the transfer function periodically.

22. The method of claim 17, wherein the applying the reference signal includes applying a reference signal that has at least one frequency component that is different than the first current.

23. The method of claim 17, further comprising adjusting an amplitude of the reference signal to be applied based on an estimate of a magnitude of the first current.

24. A single phase or multiphase electricity consumption meter comprising:

a first current transducer configured to measure a first current in a conductor;

a signal source configured to apply a reference signal to the first current transducer such that an output signal from the first current transducer includes a reference signal component based on the reference signal; and a processing circuit configured to receive the output signal, extract the reference signal component, and use information about the reference signal component and the reference signal to:

identify a change in a transfer function of a measurement apparatus that includes the first current transducer, or provide a value of the reference signal component, or provide an estimate of the transfer function of the measurement apparatus that includes the first current transducer.

25. The electricity consumption meter of claim 24, wherein the meter is calibrated at manufacture.

* * * * *

UNITED STATES PATENT AND TRADEMARK OFFICE
CERTIFICATE OF CORRECTION

PATENT NO. : 10,527,651 B2
APPLICATION NO. : 15/910805
DATED : January 7, 2020
INVENTOR(S) : Wood et al.

Page 1 of 1

It is certified that error appears in the above-identified patent and that said Letters Patent is hereby corrected as shown below:

In the Claims

In Column 54, Line 59, in Claim 9, delete "ie" and insert --the-- therefor

Signed and Sealed this
Fourth Day of August, 2020

Andrei Iancu
*Director of the United States Patent and Trademark Office*